United States Patent
Yamada et al.

(10) Patent No.: US 11,574,686 B2
(45) Date of Patent: Feb. 7, 2023

(54) MEMORY SYSTEM

(71) Applicant: Kioxia Corporation, Tokyo (JP)

(72) Inventors: Hideki Yamada, Yokohama (JP); Masanobu Shirakawa, Chigasaki (JP)

(73) Assignee: Kioxia Corporation, Tokyo (JP)

(*) Notice: Subject to any disclaimer, the term of this patent is extended or adjusted under 35 U.S.C. 154(b) by 156 days.

(21) Appl. No.: 17/190,638

(22) Filed: Mar. 3, 2021

(65) Prior Publication Data

US 2022/0068402 A1 Mar. 3, 2022

(30) Foreign Application Priority Data

Sep. 1, 2020 (JP) .............................. JP2020-146732

(51) Int. Cl.
| | |
|---|---|
| *G11C 16/26* | (2006.01) |
| *G11C 16/04* | (2006.01) |
| *G11C 16/08* | (2006.01) |
| *H01L 27/11556* | (2017.01) |
| *G11C 11/56* | (2006.01) |

(52) U.S. Cl.
CPC .......... *G11C 16/26* (2013.01); *G11C 16/0483* (2013.01); *G11C 16/08* (2013.01); *G11C 11/5621* (2013.01); *H01L 27/11556* (2013.01)

(58) Field of Classification Search
CPC .............................. G11C 16/26; G11C 16/32
See application file for complete search history.

(56) References Cited

U.S. PATENT DOCUMENTS

| | | | |
|---|---|---|---|
| 8,982,637 B1 | 3/2015 | Dong et al. | |
| 10,573,394 B2* | 2/2020 | Pan | ........................ G11C 16/32 |
| 2012/0084490 A1 | 4/2012 | Choi et al. | |
| 2016/0064088 A1 | 3/2016 | Shiga et al. | |
| 2016/0078954 A1 | 3/2016 | Shirakawa et al. | |
| 2016/0189770 A1 | 6/2016 | Abe et al. | |

FOREIGN PATENT DOCUMENTS

| | | |
|---|---|---|
| JP | WO 2015/037159 A1 | 3/2015 |
| JP | 2016-51486 A | 4/2016 |
| JP | 2016-62623 A | 4/2016 |
| JP | 6022756 B2 | 11/2016 |
| JP | 6199835 B2 | 9/2017 |

* cited by examiner

Primary Examiner — Jason Lappas
(74) Attorney, Agent, or Firm — Oblon, McClelland, Maier & Neustadt, L.L.P.

(57) ABSTRACT

According to the one embodiment, a memory system includes a semiconductor memory device and a memory controller. The semiconductor memory device includes: first and second memory cells stacked above a substrate; a first word line coupled to the first and second memory cells; a first bit line coupled to the first memory cell; and a second bit line coupled to the second memory cell. A first state read operation includes a first read operation for reading data from the first memory cell and a second read operation for reading data from the second memory cell. A first read voltage is applied to the first word line during a first period for executing the first read operation, and a second read voltage is applied to the first word line during a second period for executing the second read operation.

19 Claims, 47 Drawing Sheets

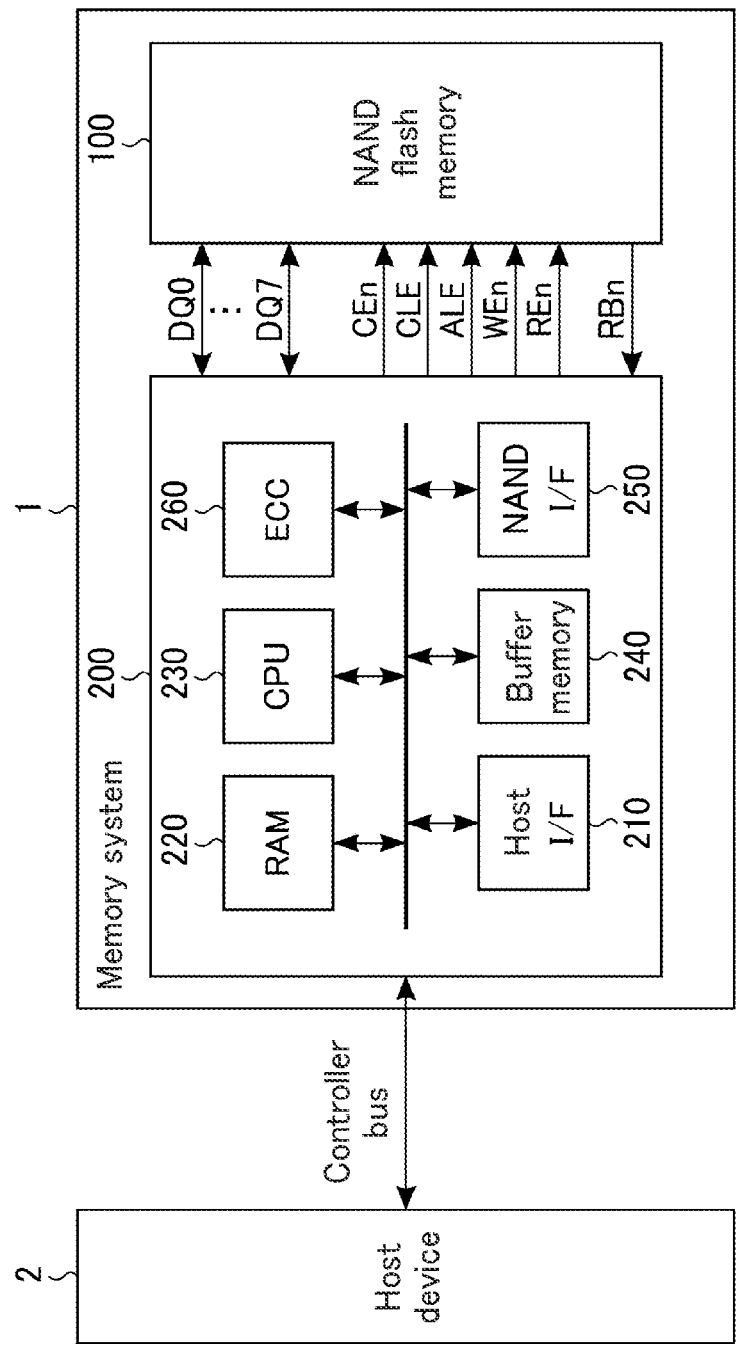
F I G. 1

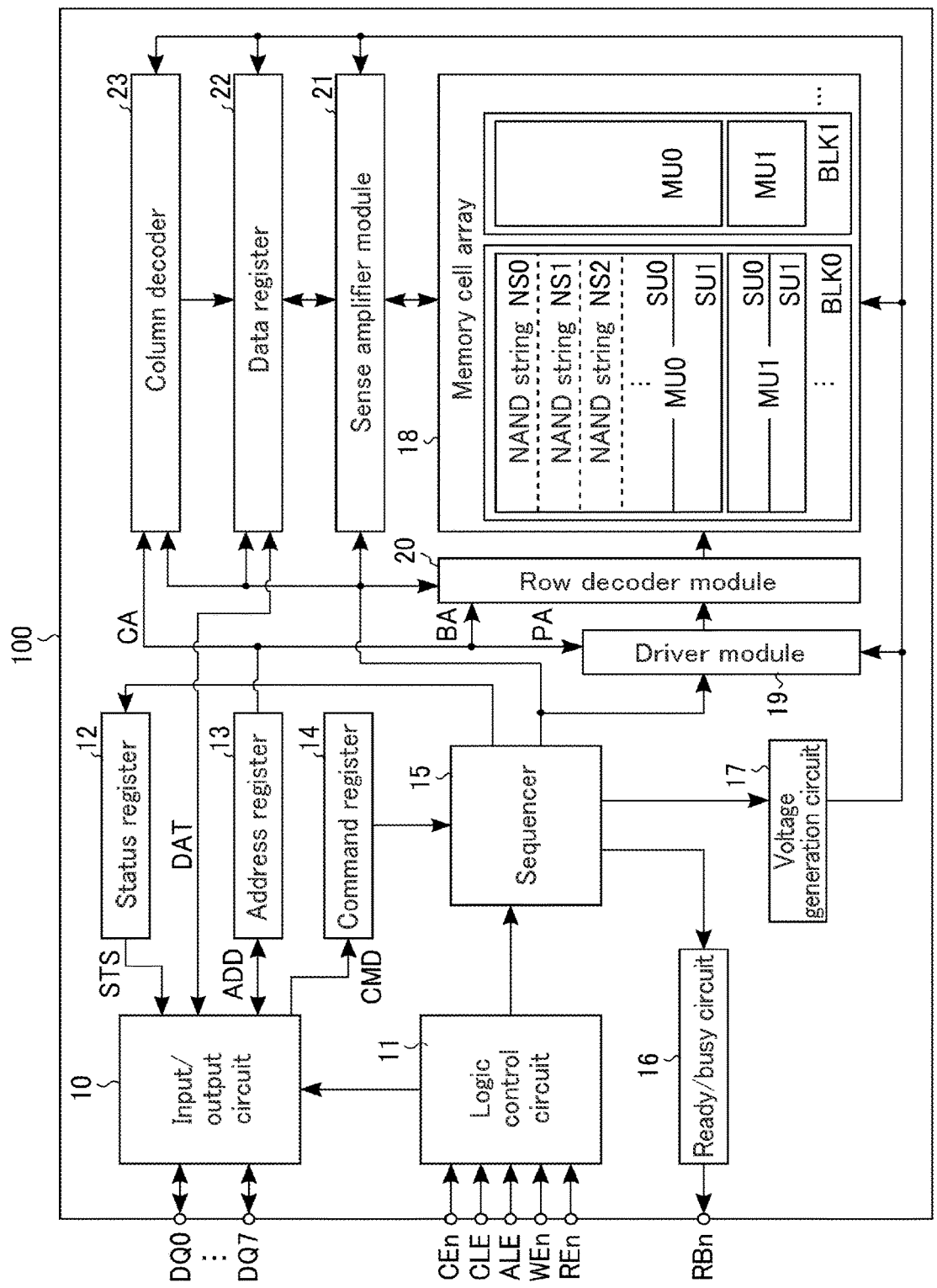
F I G. 2

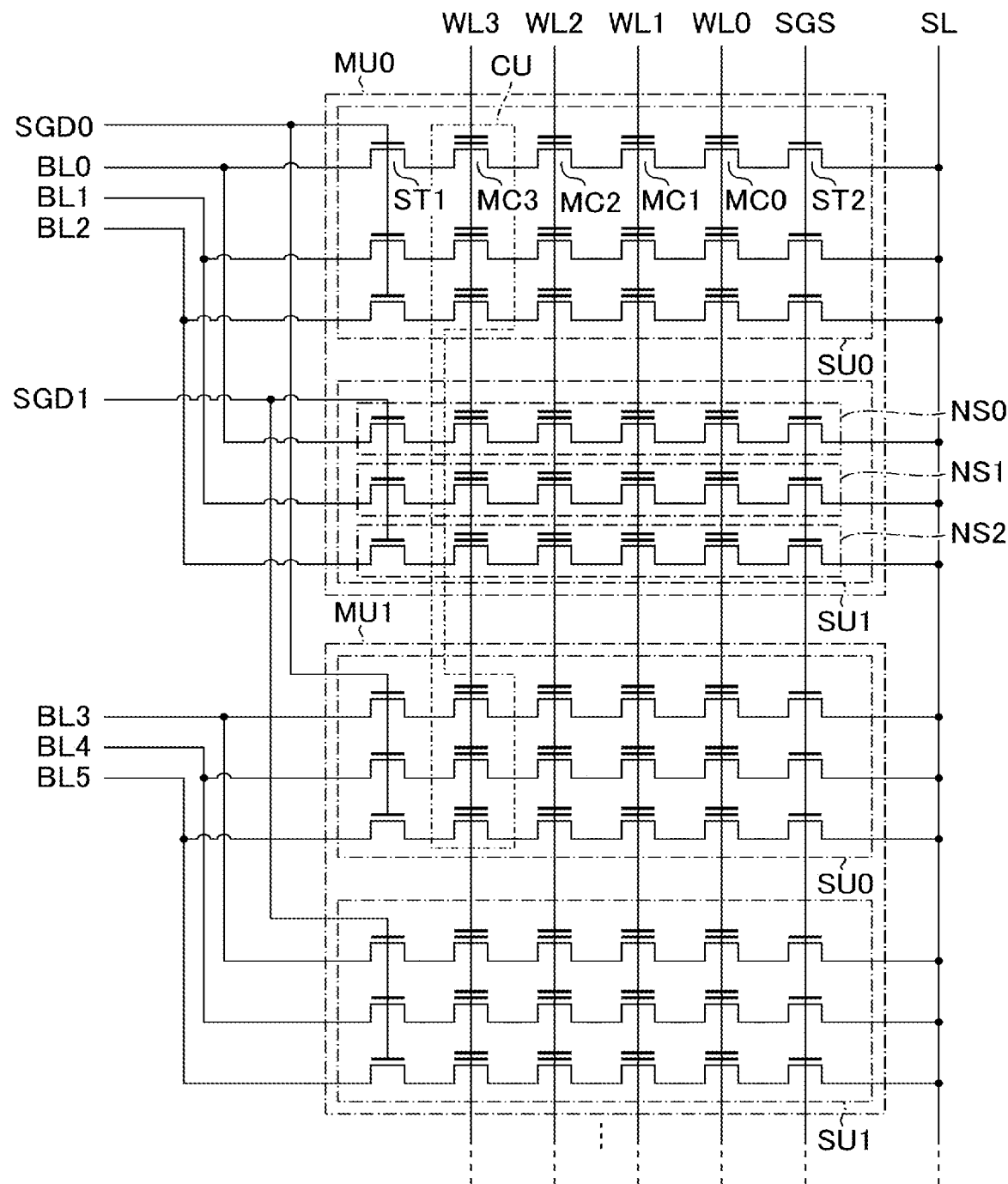
F I G. 3

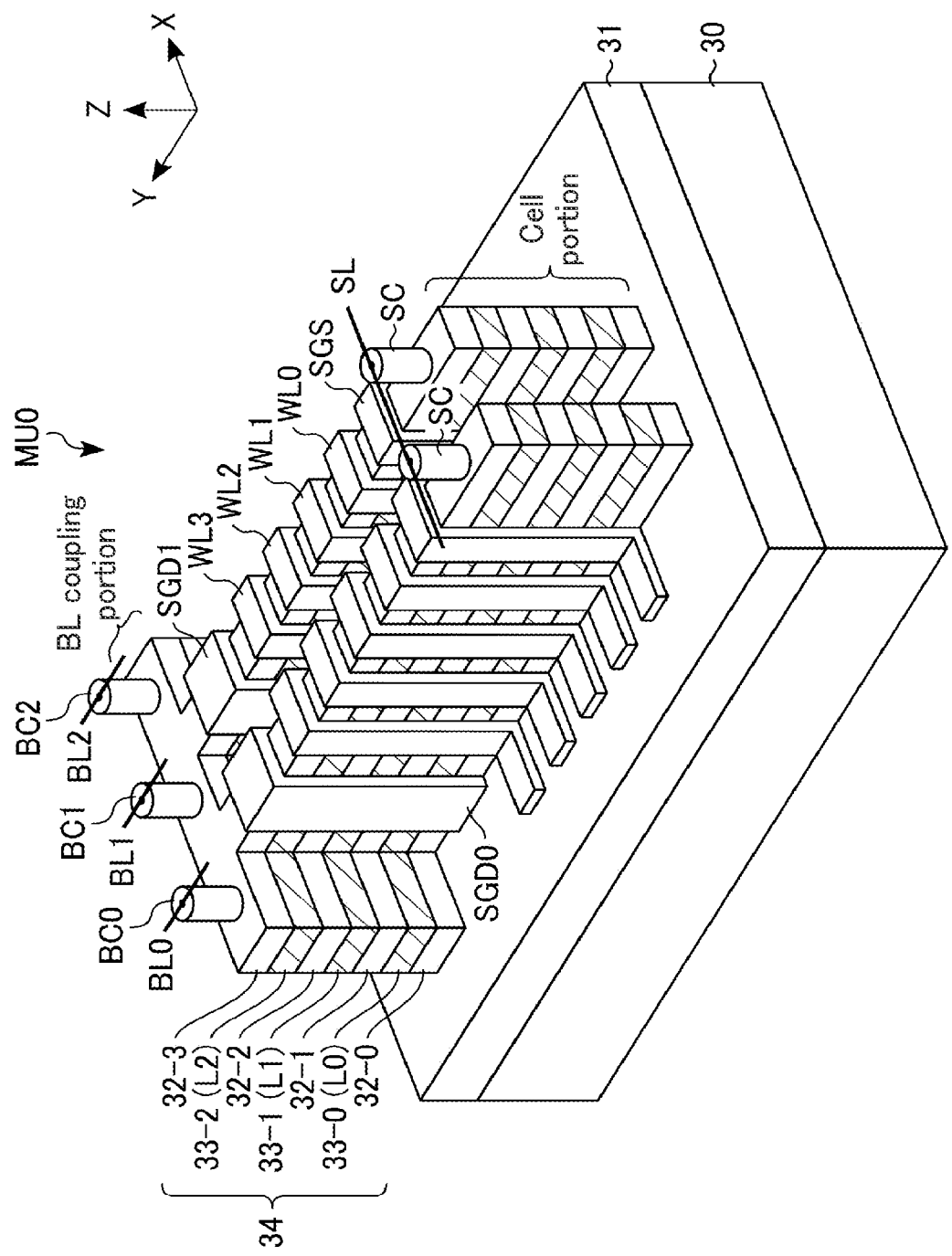
F I G. 4

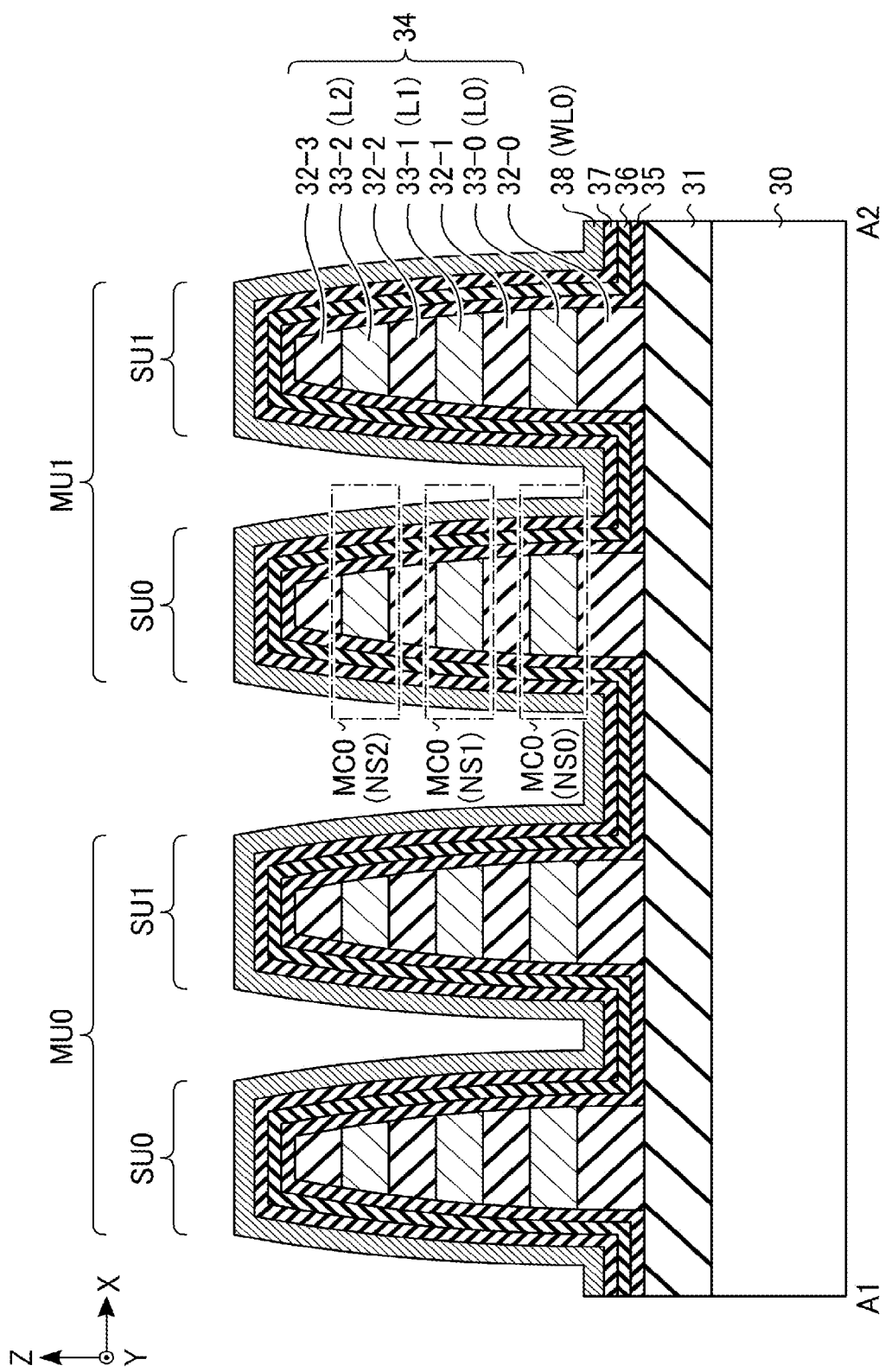
F I G. 6

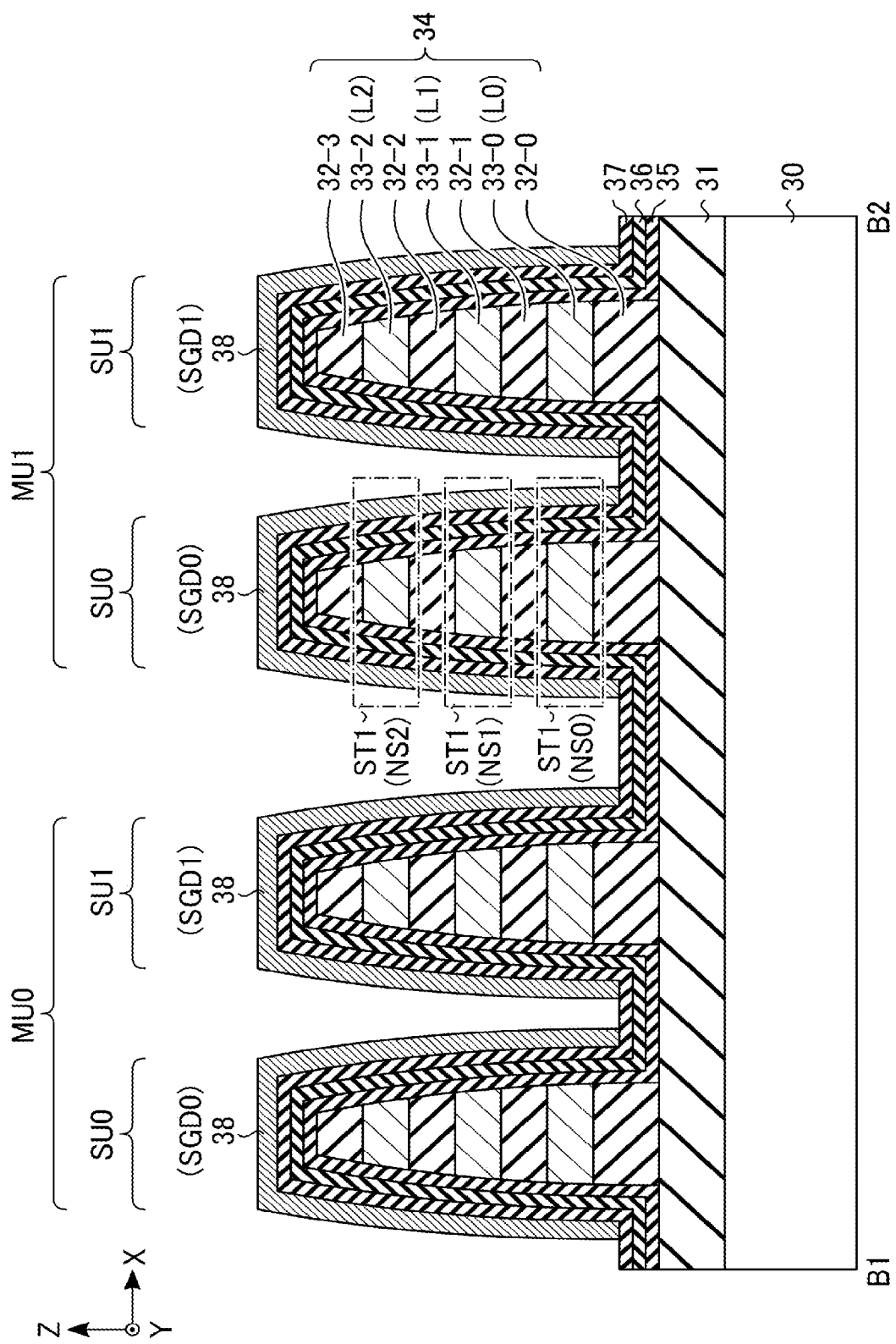
F I G. 7

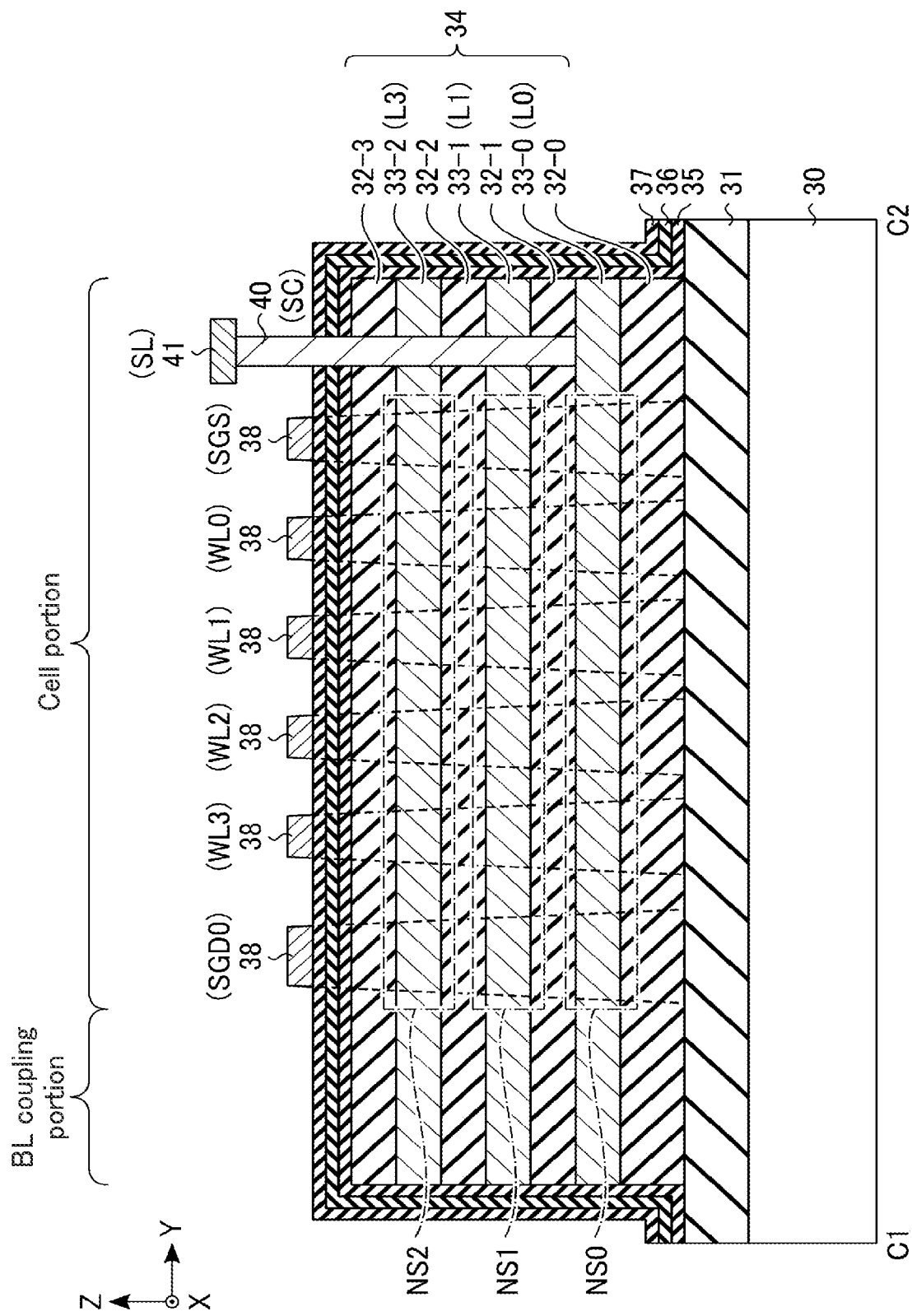
F I G. 8

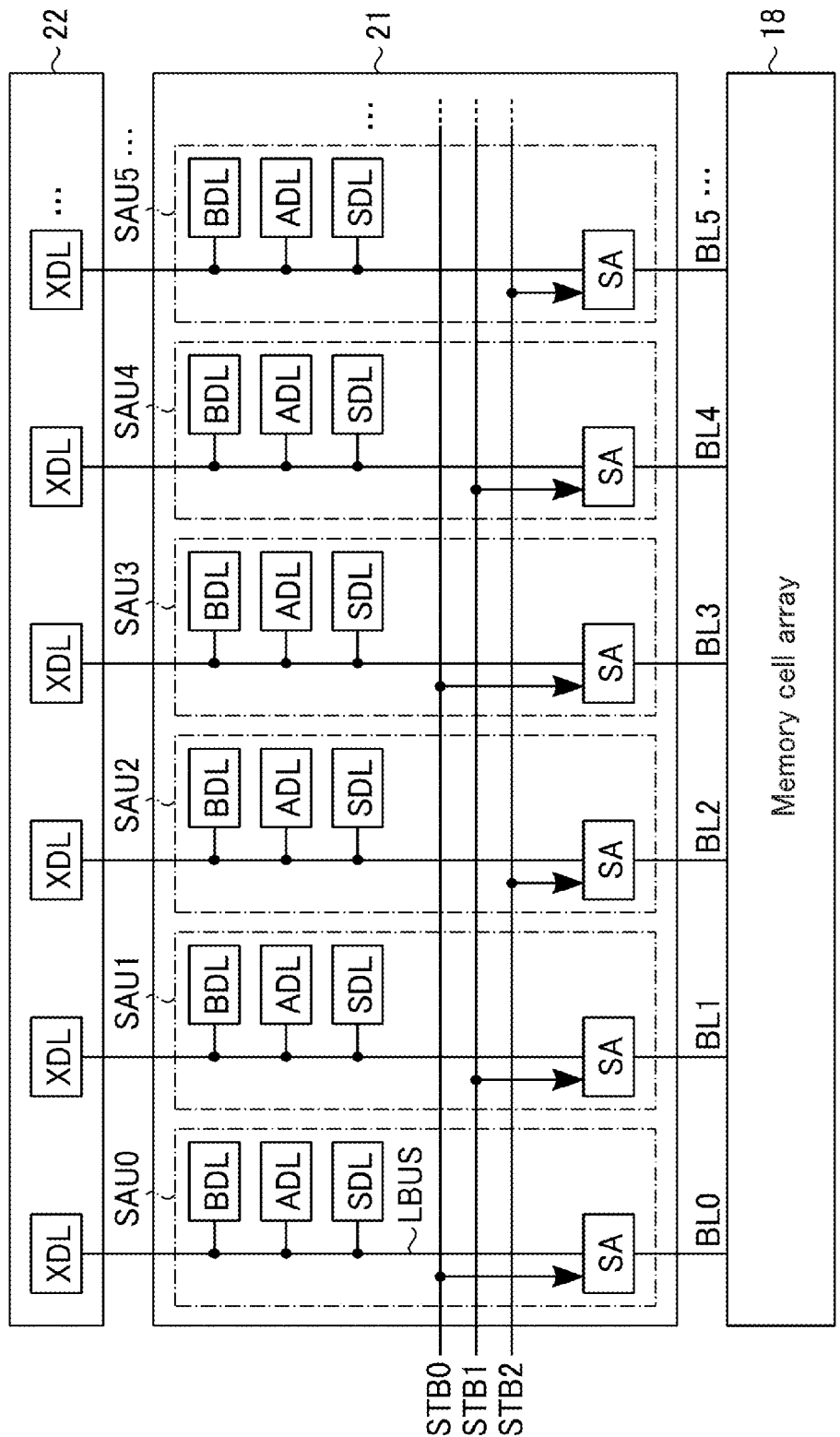
F I G. 10

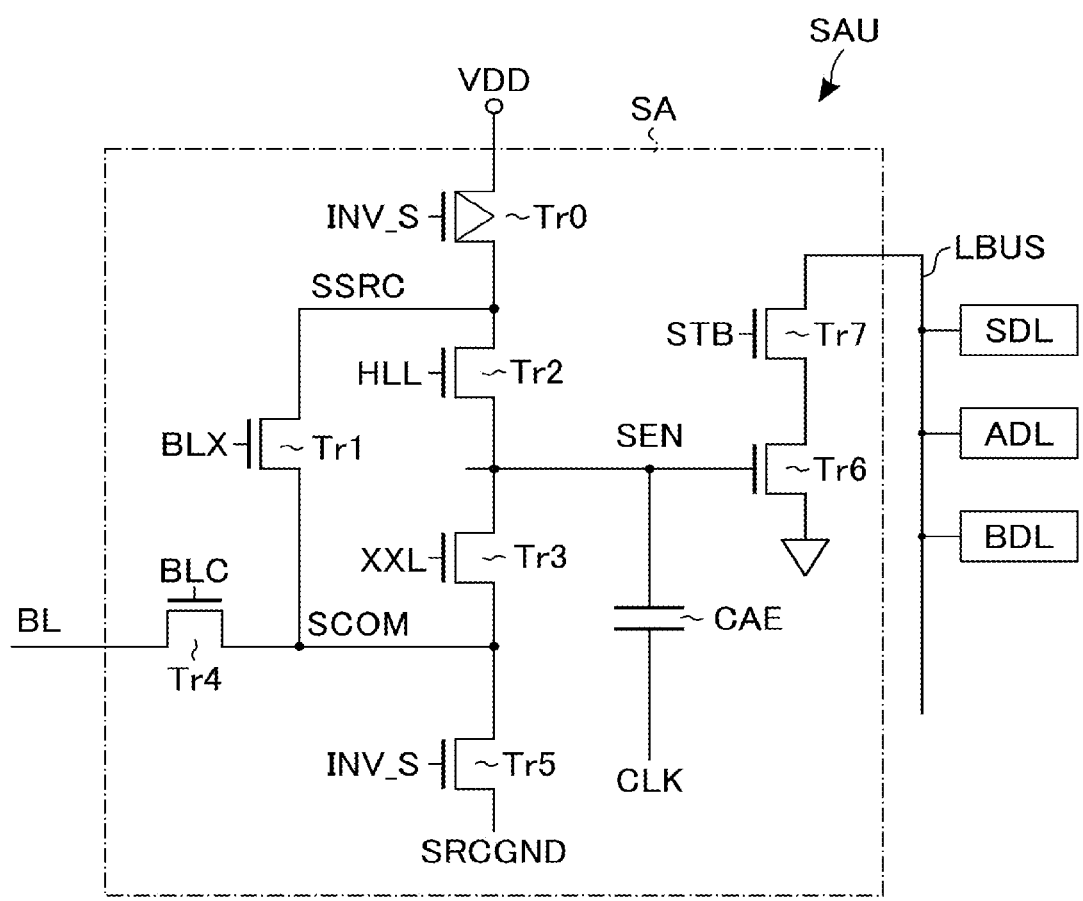
F I G. 11

| State | Default read voltage | Layer | Voltage difference | Read voltage set value |
|---|---|---|---|---|
| A | VA | L0 | DVA0 | VA0 (=VA+DVA0) |
|   |    | L1 | DVA1 | VA1 (=VA+DVA1) |
|   |    | L2 | DVA2 | VA2 (=VA+DVA2) |
| B | VB | L0 | DVB0 | VB0 (=VB+DVB0) |
|   |    | L1 | DVB1 | VB1 (=VB+DVB1) |
|   |    | L2 | DVB2 | VB2 (=VB+DVB2) |
| C | VC | L0 | DVC0 | VC0 (=VC+DVC0) |
|   |    | L1 | DVC1 | VC1 (=VC+DVC1) |
|   |    | L2 | DVC2 | VC2 (=VC+DVC2) |
| D | VD | L0 | DVD0 | VD0 (=VD+DVD0) |
|   |    | L1 | DVD1 | VD1 (=VD+DVD1) |
|   |    | L2 | DVD2 | VD2 (=VD+DVD2) |
| E | VE | L0 | DVE0 | VE0 (=VE+DVE0) |
|   |    | L1 | DVE1 | VE1 (=VE+DVE1) |
|   |    | L2 | DVE2 | VE2 (=VE+DVE2) |
| F | VF | L0 | DVF0 | VF0 (=VF+DVF0) |
|   |    | L1 | DVF1 | VF1 (=VF+DVF1) |
|   |    | L2 | DVF2 | VF2 (=VF+DVF2) |
| G | VG | L0 | DVG0 | VG0 (=VG+DVG0) |
|   |    | L1 | DVG1 | VG1 (=VG+DVG1) |
|   |    | L2 | DVG2 | VG2 (=VG+DVG2) |

F I G. 15

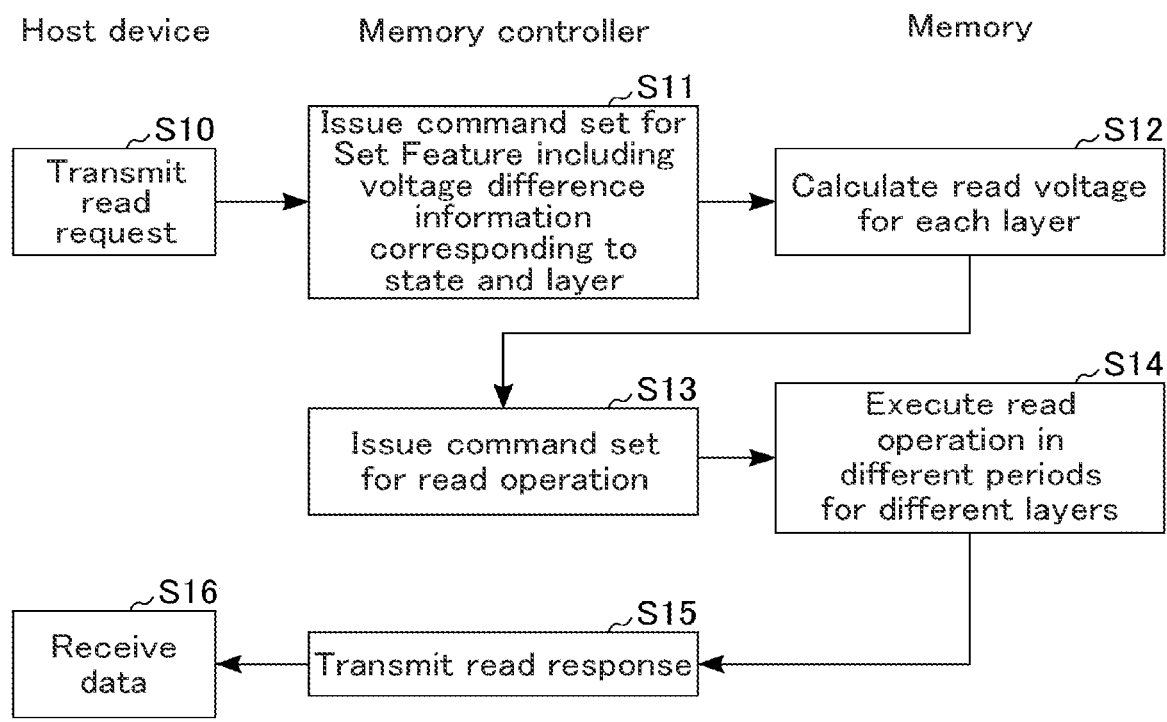
F I G. 16

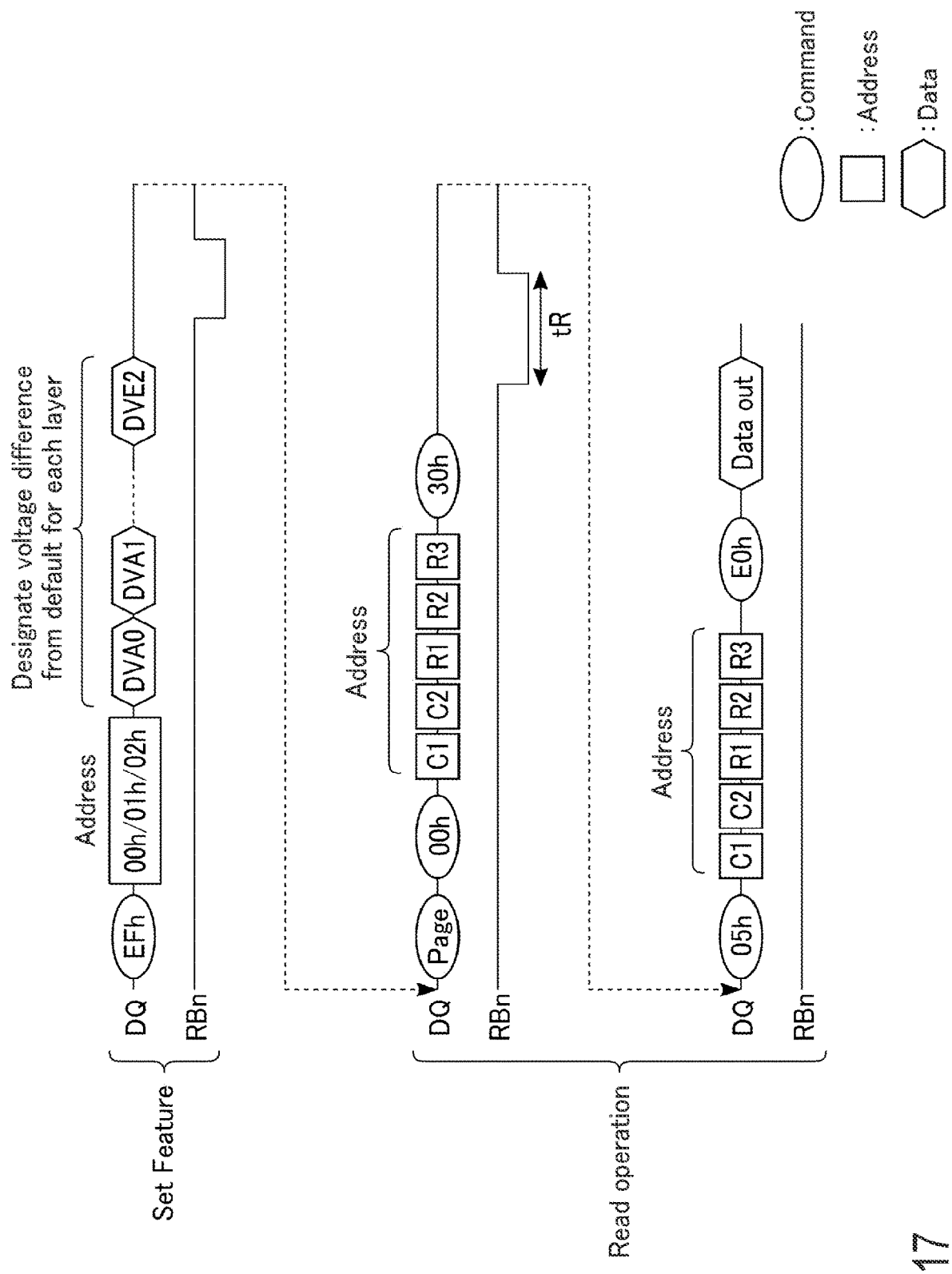
F I G. 17

| Page | Address | Data | | | | | | | | |
|---|---|---|---|---|---|---|---|---|---|---|
| | | 0 | 1 | 2 | 3 | 4 | 5 | 6 | 7 | 8 |
| Lower | 00h | DVA0 | DVA1 | DVA2 | DVE0 | DVE1 | DVE2 | Don't care | Don't care | Don't care |
| Middle | 01h | DVB0 | DVB1 | DVB2 | DVD0 | DVD1 | DVD2 | DVF0 | DVF1 | DVF2 |
| Upper | 02h | DVC0 | DVC1 | DVC2 | DVG0 | DVG1 | DVG2 | Don't care | Don't care | Don't care |

F I G. 18

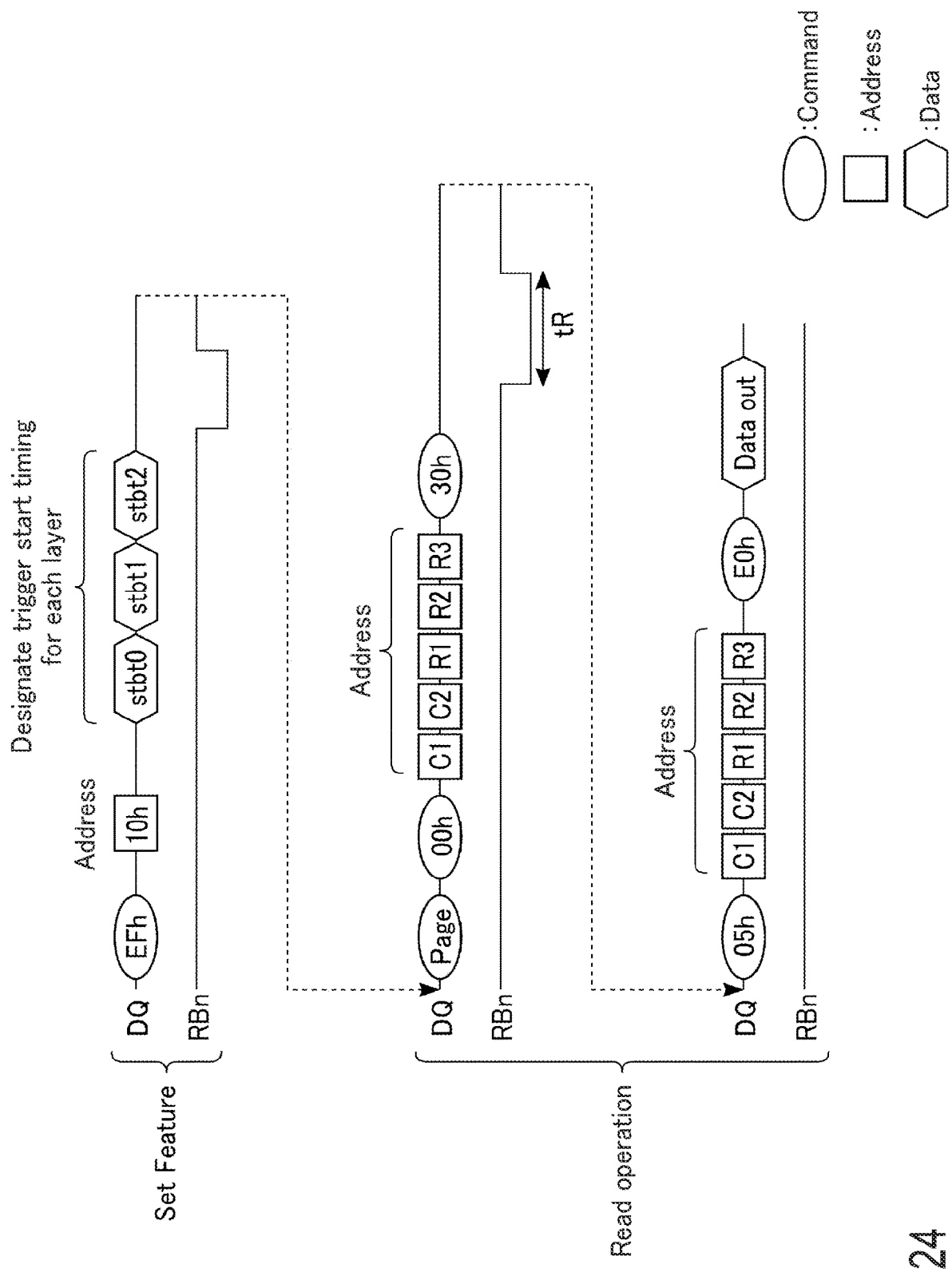
F I G. 24

| Address | Data | | | | | | | | |
|---|---|---|---|---|---|---|---|---|---|
| | 0 | 1 | 2 | 3 | 4 | 5 | 6 | 7 | 8 |
| 10h | stbt0 (L0) | stbt1 (L1) | stbt2 (L2) | Don't care | Don't care | Don't care | Don't care | Don't care | Don't care |

F I G. 25

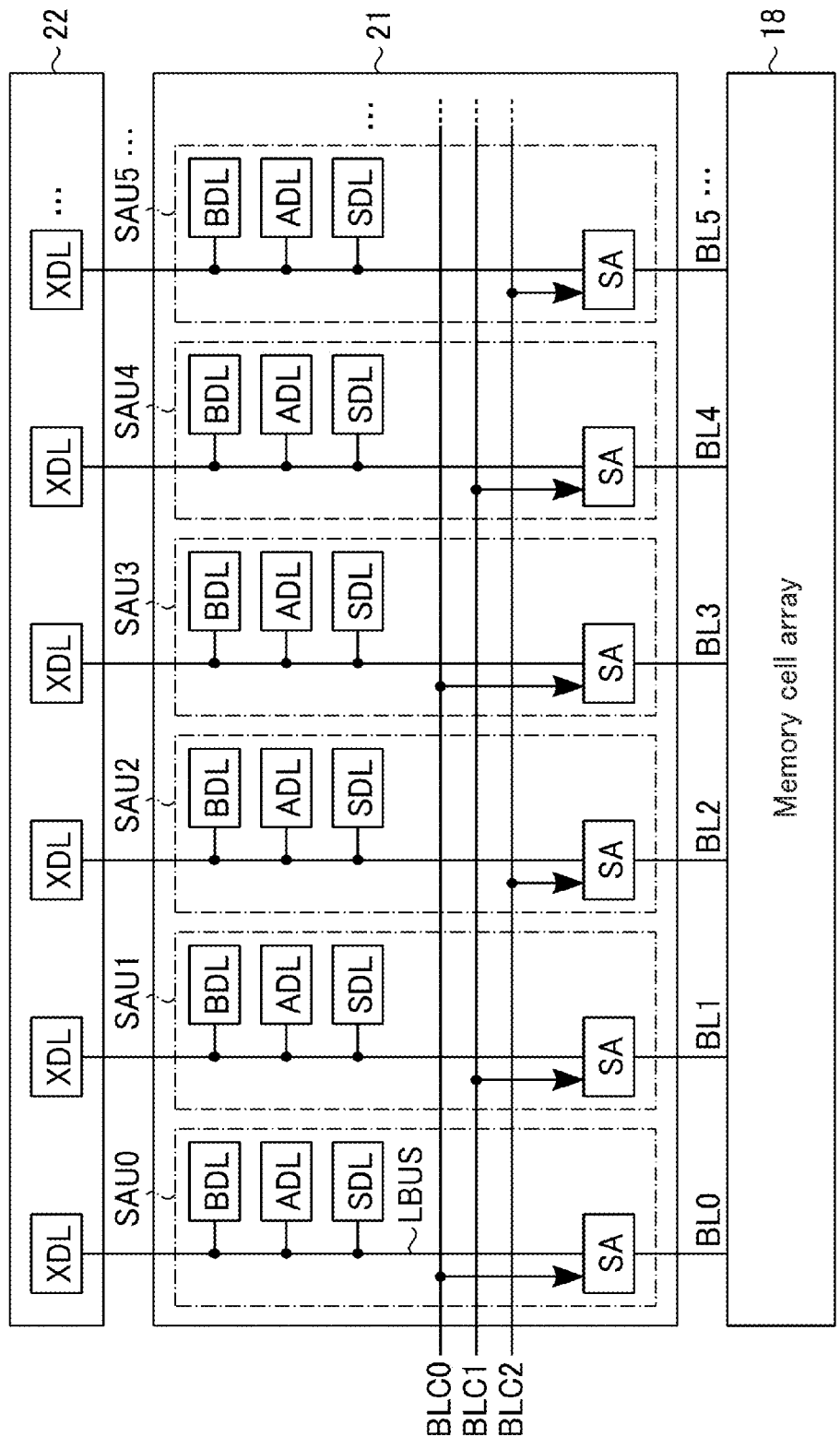
F I G. 27

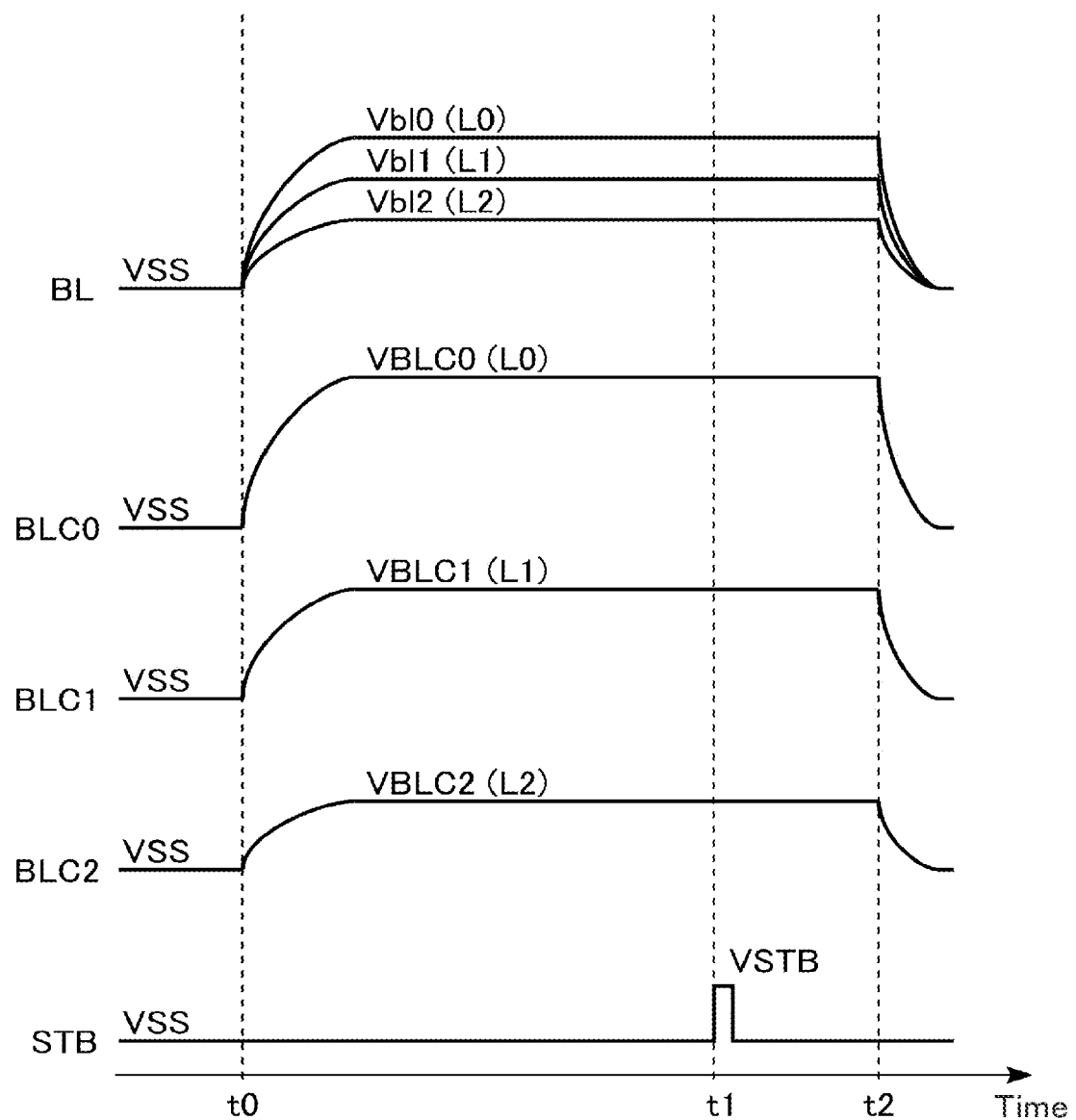
F I G. 28

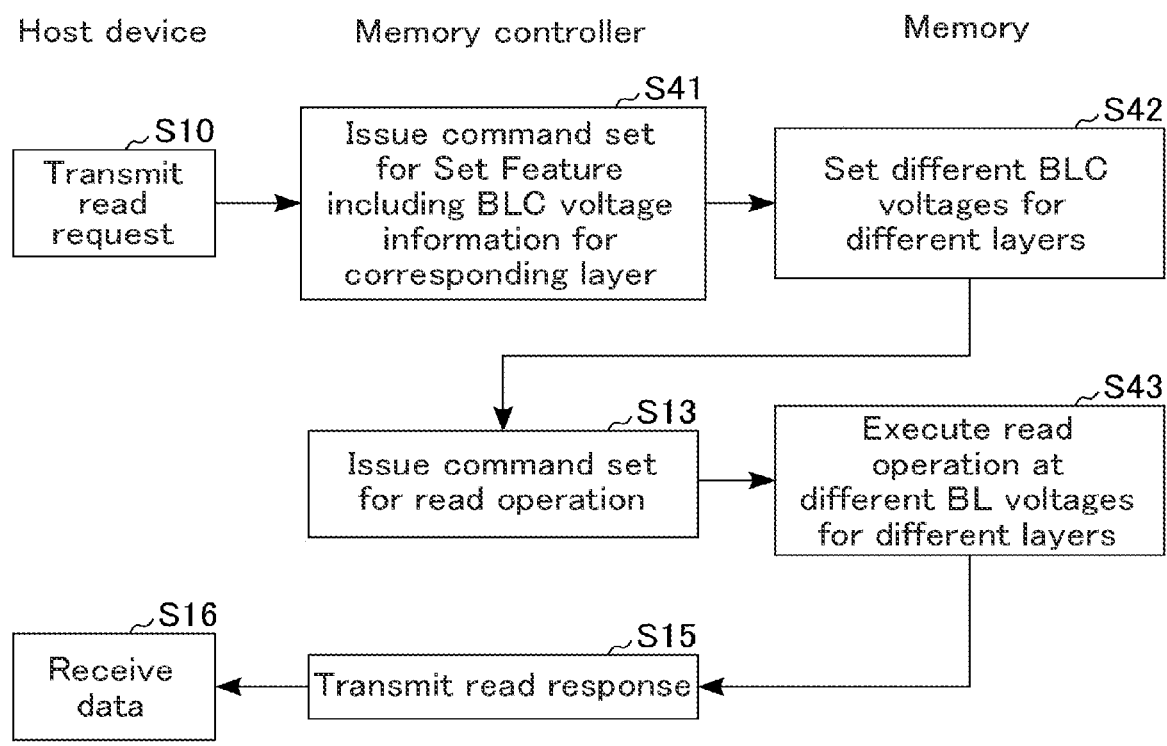
F I G. 29

| Address | Data | | | | | | | | |
|---|---|---|---|---|---|---|---|---|---|
| | 0 | 1 | 2 | 3 | 4 | 5 | 6 | 7 | 8 |
| 20h | VBLC0 (L0) | VBLC1 (L1) | VBLC2 (L2) | Don't care | Don't care | Don't care | Don't care | Don't care | Don't care |

F I G. 31

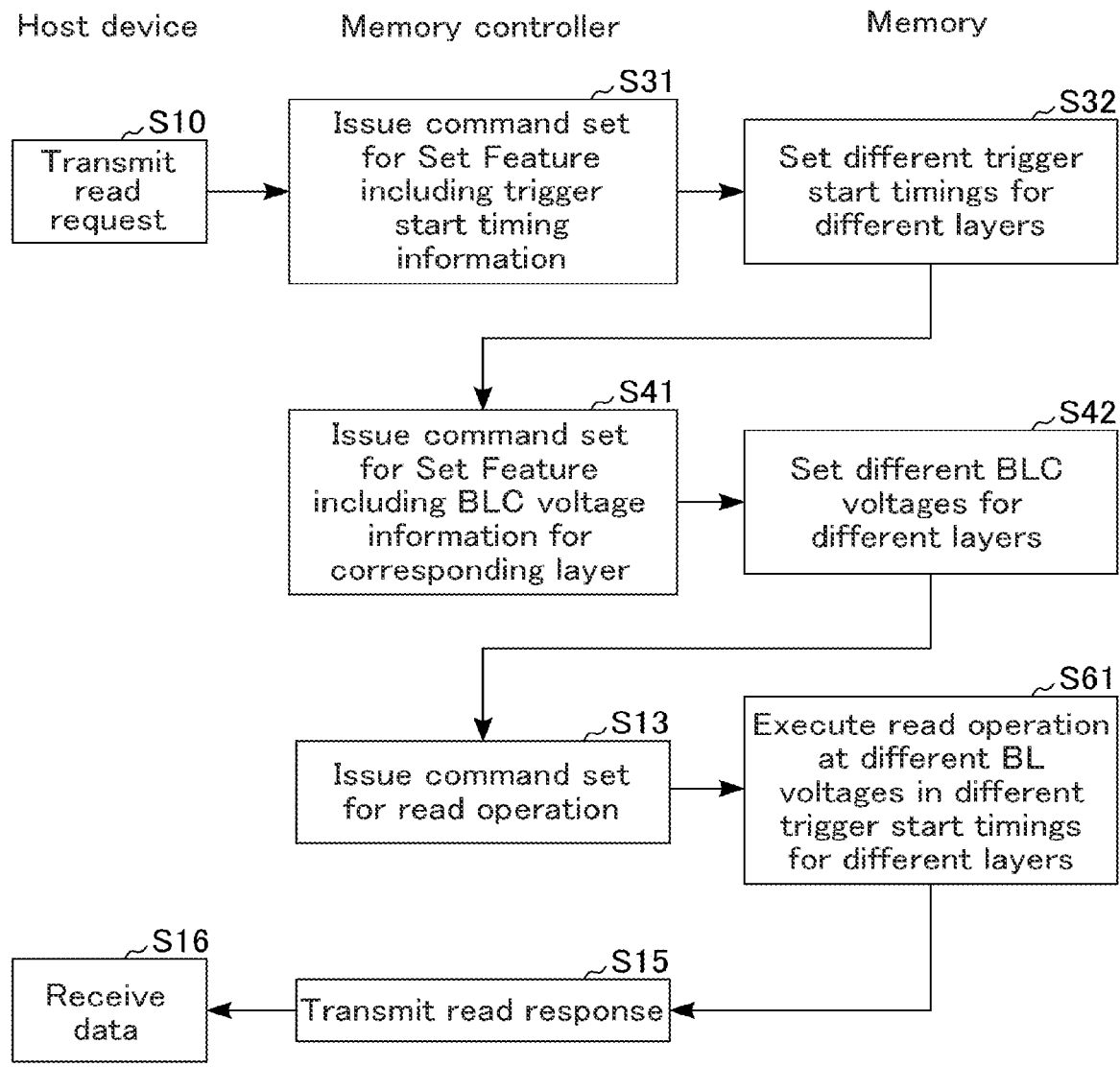
F I G. 34

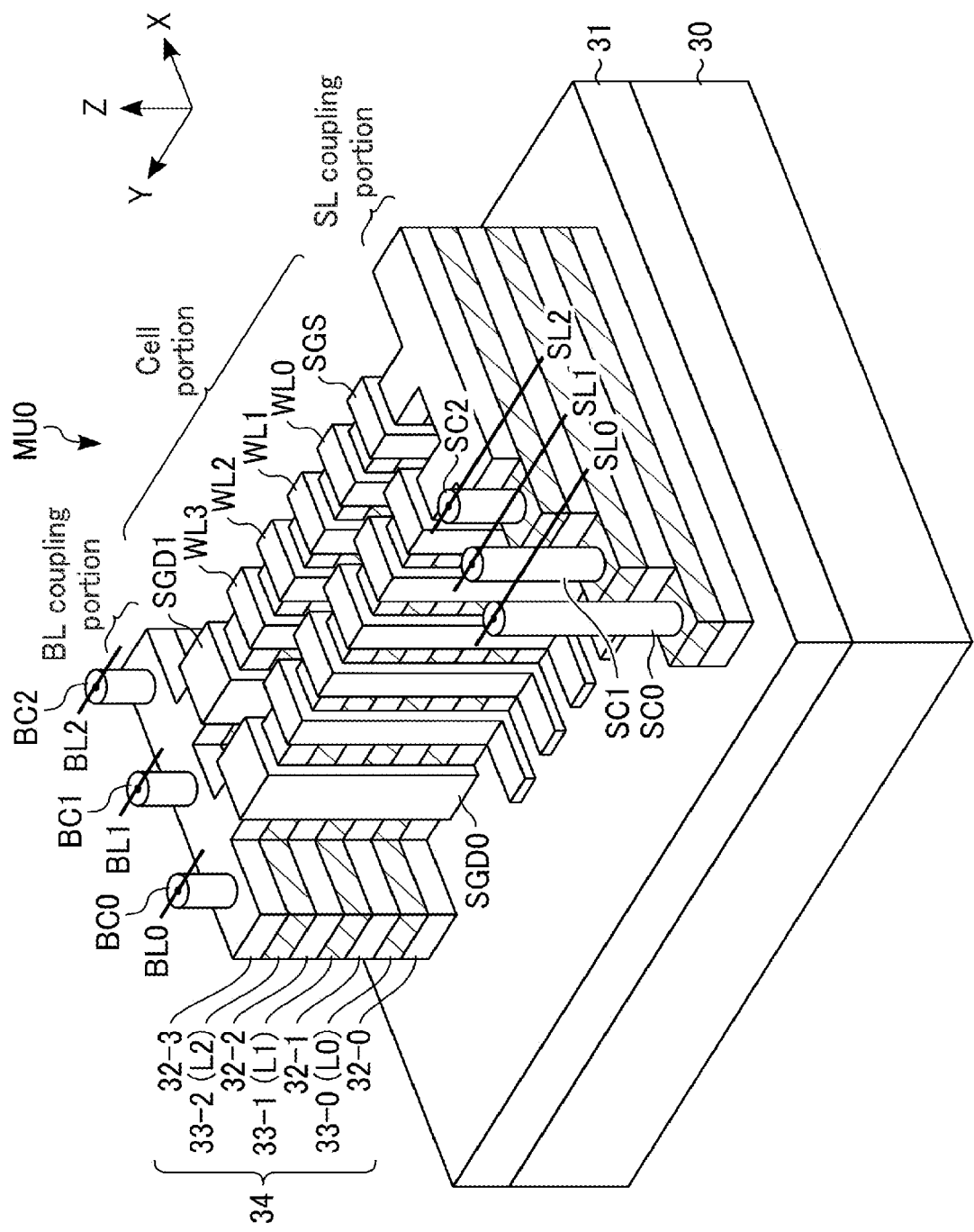
F I G. 37

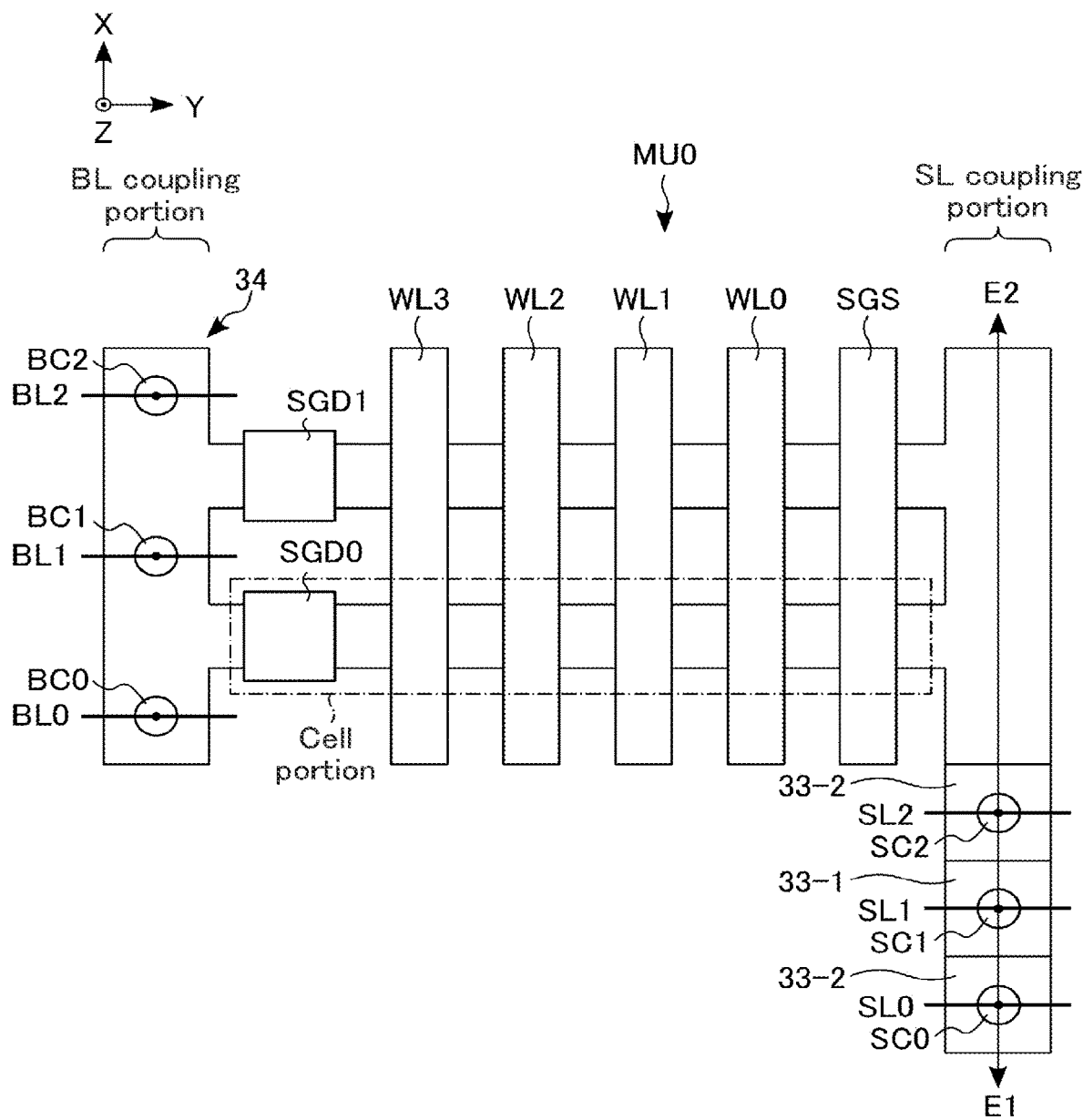
F I G. 38

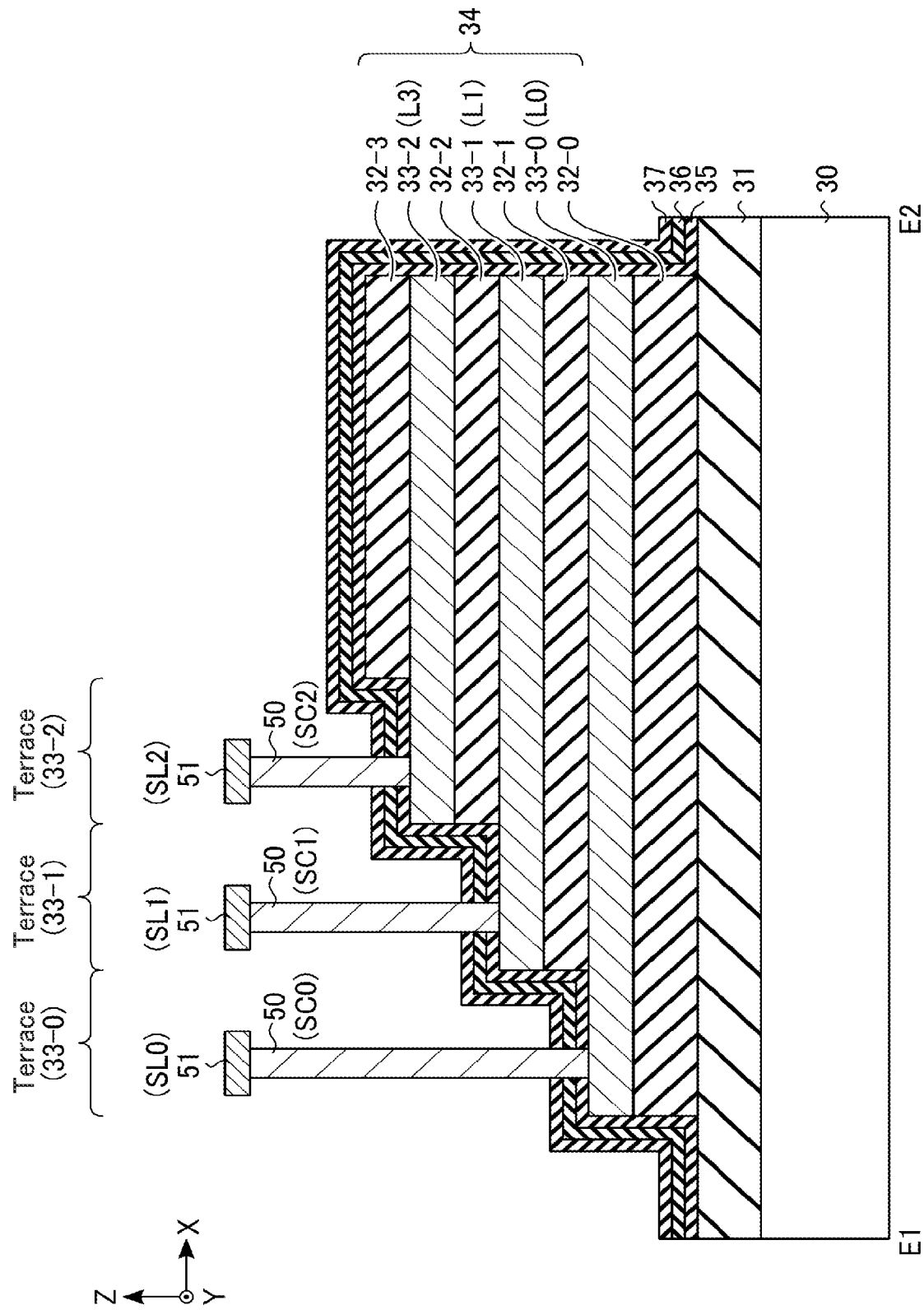
F I G. 39

| Address | Data | | | | | | | | |
|---|---|---|---|---|---|---|---|---|---|
| | 0 | 1 | 2 | 3 | 4 | 5 | 6 | 7 | 8 |
| 30h | Vsrc0 (L0) | Vsrc1 (L1) | Vsrc2 (L2) | Don't care | Don't care | Don't care | Don't care | Don't care | Don't care |

FIG. 43

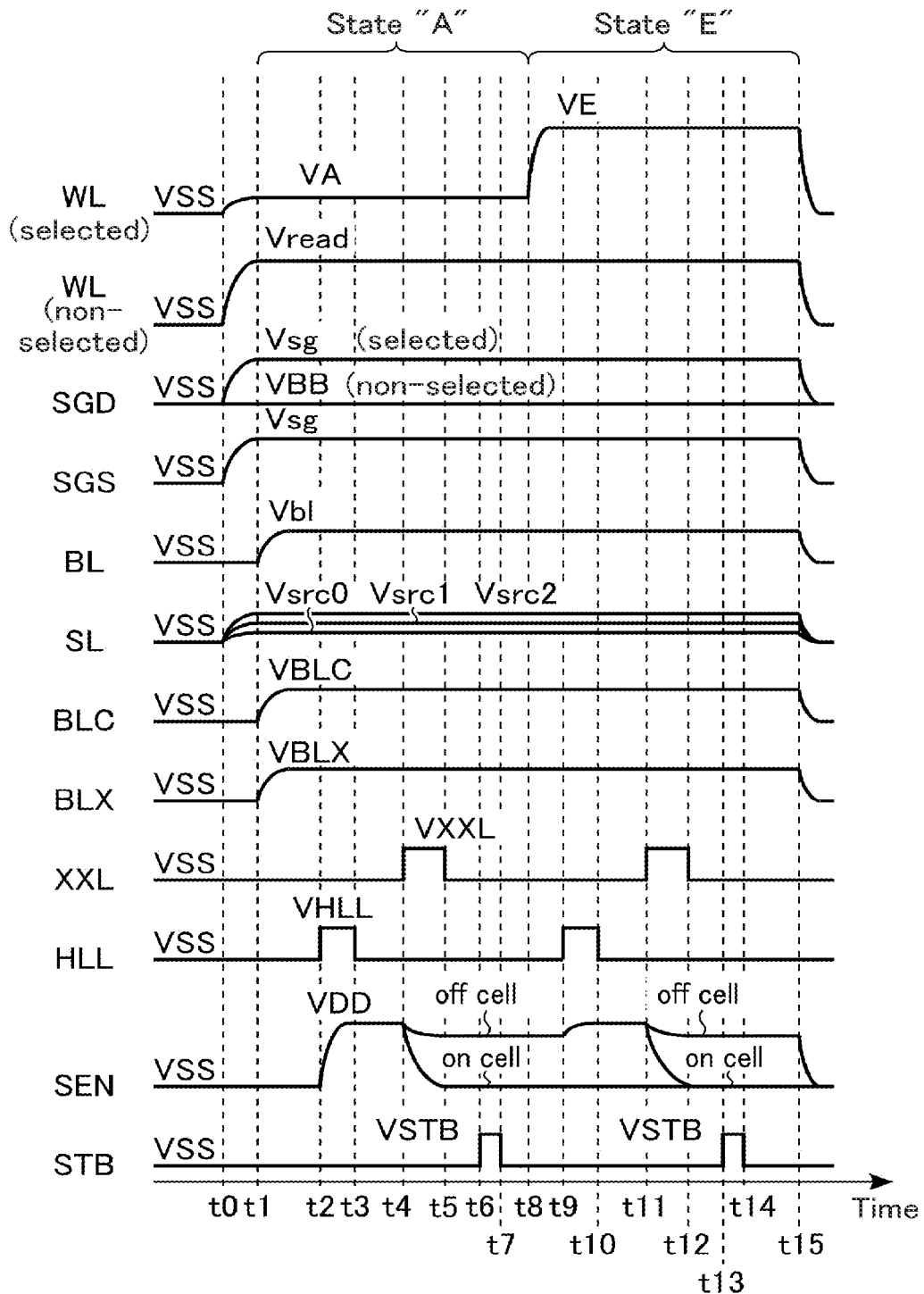
F I G. 44

MEMORY SYSTEM

CROSS-REFERENCE TO RELATED APPLICATIONS

This application is based upon and claims the benefit of priority from Japanese Patent Application No. 2020-146732, filed Sep. 1, 2020, the entire contents of which are incorporated herein by reference.

FIELD

Embodiments described herein relate generally to a memory system.

BACKGROUND

A NAND-type flash memory has been known as a semiconductor memory device of a memory system.

BRIEF DESCRIPTION OF THE DRAWINGS

FIG. 1 is a block diagram of a memory system according to a first embodiment;

FIG. 2 is a block diagram of a semiconductor memory device in the memory system according to the first embodiment;

FIG. 3 is a circuit diagram of a memory cell array of the semiconductor memory device in the memory system according to the first embodiment;

FIG. 4 is a perspective diagram of the memory cell array of the semiconductor memory device in the memory system according to the first embodiment;

FIG. 6 is a cross-sectional view of the structure of FIG. 5, taken along line A1-A2;

FIG. 7 is a cross-sectional view of the structure of FIG. 5, taken along line B1-B2;

FIG. 8 is a cross-sectional view of the structure of FIG. 5, taken along line C1-C2;

FIG. 10 is a block diagram of a data register and a sense amplifier module included in the semiconductor memory device in the memory system according to the first embodiment;

FIG. 11 is a circuit diagram of a sense circuit included in the semiconductor memory device in the memory system according to the first embodiment;

FIG. 15 is a parameter table of read voltages of the memory system according to the first embodiment;

FIG. 16 is a flowchart of a read operation in the memory system according to the first embodiment;

FIG. 17 shows a command sequence of a Set Feature operation and read operation in the memory system according to the first embodiment;

FIG. 18 shows a table of combinations of addresses and data for the Set Feature in the memory system according to the first embodiment;

FIG. 24 shows a command sequence of a Set Feature operation and read operation in the memory system according to the third embodiment;

FIG. 25 shows a table of combinations of addresses and data for the Set Feature in the memory system according to the third embodiment;

FIG. 27 is a block diagram of a data register and a sense amplifier module included in the semiconductor memory device of the memory system according to a fourth embodiment;

FIG. 28 is a timing chart of voltages of a bit line, signals BLC0 to BLC2, and signal STB during a read operation in the semiconductor memory device of the memory system according to the fourth embodiment;

FIG. 29 is a flowchart of the read operation in the memory system according to the fourth embodiment;

FIG. 31 shows a table of combinations of addresses and data for the Set Feature in the memory system according to the fourth embodiment;

FIG. 34 is a flowchart of the read operation in the memory system according to a sixth embodiment;

FIG. 37 is a perspective diagram of the memory cell array of the semiconductor memory device in the memory system according to the seventh embodiment;

FIG. 38 is a plan view of the memory cell array of the semiconductor memory device in the memory system according to the seventh embodiment;

FIG. 39 is a cross section of the structure of FIG. 38, taken along line E1-E2;

FIG. 43 shows a table of combinations of addresses and data for the Set Feature in the memory system according to the seventh embodiment;

FIG. 44 is a timing chart of voltages of individual interconnects during a read operation in the semiconductor memory device of the memory system according to the seventh embodiment;

DETAILED DESCRIPTION

Figure 5:
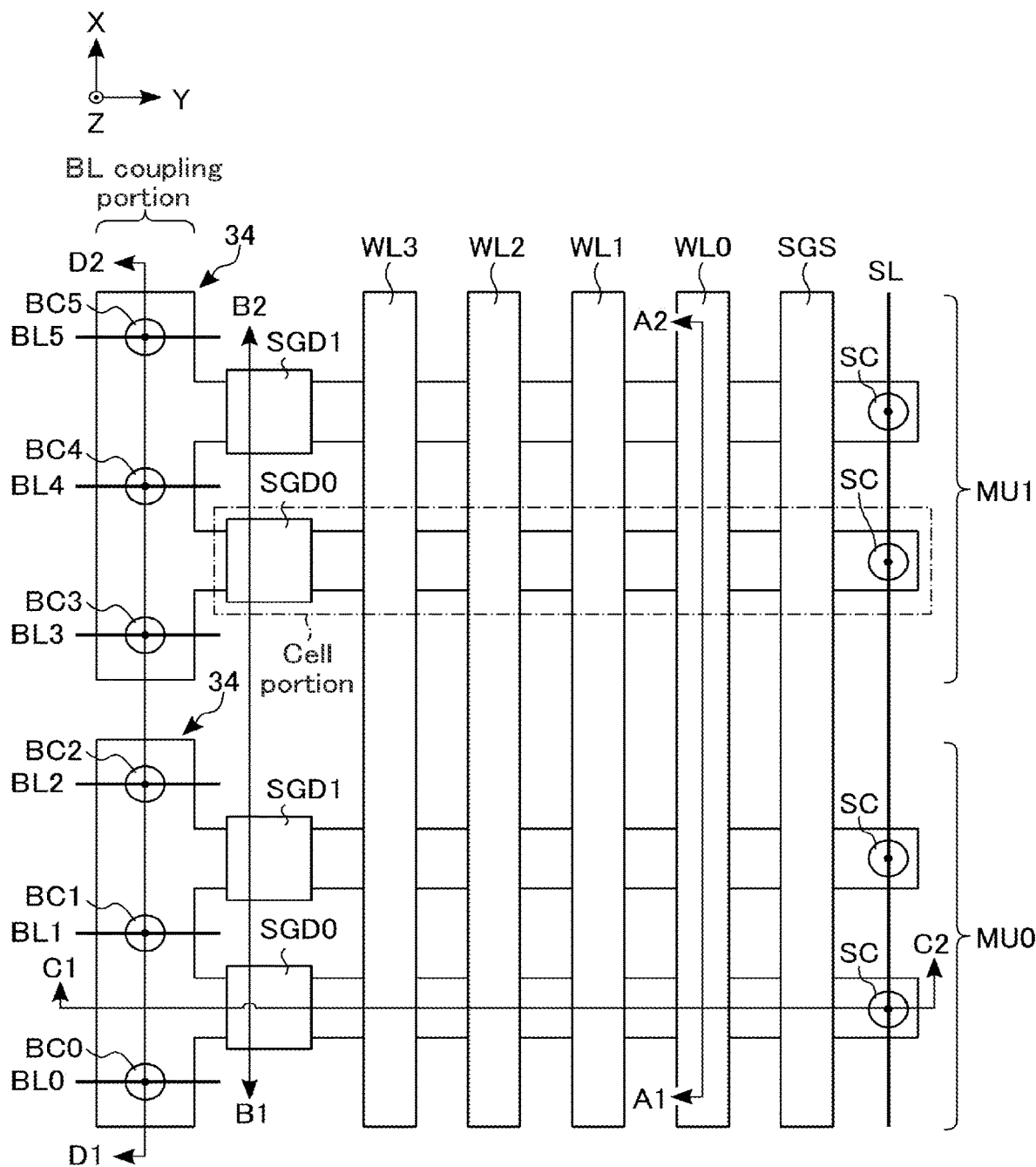
FIG. 5 is a plan view of the memory cell array of the semiconductor memory device in the memory system according to the first embodiment.

In general, according to one embodiment, a memory system includes: a semiconductor memory device; and a memory controller configured to control a read operation in the semiconductor memory device. The semiconductor memory device includes: first and second memory cells stacked above a substrate; a first word line coupled to the first and second memory cells; a first bit line coupled to the first memory cell; and a second bit line coupled to the second memory cell. A first state read operation includes a first read operation for reading data from the first memory cell and a second read operation for reading data from the second memory cell. In the first state read operation, a first read voltage is applied to the first word line during a first period for executing the first read operation, and a second read voltage differing from the first read voltage is applied to the first word line during a second period for executing the second read operation.

The embodiments will be explained below by referring to the drawings. In the explanation, structural components having basically the same functions and structures will be referred to by the same reference symbols. The embodiments are described to give examples of apparatuses and methods that realize the technical concepts of the embodiments, and the technical concepts of the embodiments are not to restrict the materials, geometries, structures, arrangements or the like of the structural components to the ones described below.

Various modifications may be made to the technical concepts of the embodiments in the scope of claims.

1. First Embodiment

A memory system according to the first embodiment will be explained. In the following description, a three-dimensionally stacked NAND-type flash memory, in which memory cell transistors are three-dimensionally stacked above a semiconductor substrate, will be discussed as an exemplary semiconductor memory device of the memory system.

1.1 Structure 1.1.1 Overall Structure of Memory System

The overall structure of the memory system according to the present embodiment will be described with reference to FIG. 1.

As illustrated in FIG. 1, a memory system 1 includes a NAND-typed flash memory 100 (which hereinafter may be simply referred to as "memory 100") and a memory controller 200. The memory controller 200 and the memory 100 may constitute, in combination, a single semiconductor memory device, examples of which include a memory card such as SD™ card, and a solid state drive (SSD).

The memory 100 includes a plurality of memory cell transistors, and stores data in a nonvolatile manner. The memory 100 is coupled to the memory controller 200 via a NAND bus so as to operate in accordance with commands from the memory controller 200. More specifically, the memory 100 transmits and receives, for example, 8-bit signals DQ [7:0] to and from the memory controller 200. A signal DQ [7:0] may include data, an address or a command.

The memory 100 receives from the memory controller 200, for example, a chip enable signal CEn, a command latch enable signal CLE, an address latch enable signal ALE, a write enable signal WEn, and a read enable signal REn. Then, the memory 100 transmits a ready/busy signal RBn to the memory controller 200.

A chip enable signal CEn enables the memory 100, and may be asserted low ("L") level. A command latch enable signal CLE indicates that the signal DQ is a command, and may be asserted high ("H") level. The address latch enable signal ALE indicates that the signal DQ is an address, and may be asserted "H" level. The write enable signal WEn is for capturing the received signal into the memory 100; this signal is asserted "L" level each time a command, address or data is received from the memory controller 200. Thus, each time WEn is toggled, the signal DQ is captured by the memory 100. The read enable signal REn is for reading data from the memory 100. The read enable signal REn may be asserted "L" level. The ready/busy signal RBn indicates whether or not the memory 100 is in a busy state (whether a command is receivable or non-receivable from the memory controller 200), and is set to "L" level when the memory 100 is busy.

In response to a request (command) from the host device 2, the memory controller 200 instructs the memory 100 to perform a read operation, write operation, or erase operation. In addition, the memory controller 200 manages a memory region of the memory 100.

The memory controller 200 includes a host interface circuit 210, an embedded memory (RAM; random access memory) 220, a processor (CPU; central processing unit) 230, a buffer memory 240, a NAND interface circuit 250, and an ECC circuit 260.

The host interface circuit 210 is coupled to the host device 2 via a controller bus to manage the communications with the host device 2. The host interface circuit 210 transfers to the CPU 230 and buffer memory 240 the request and data received from the host device 2. The host interface circuit 210 also transfers the data in the buffer memory 240 to the host device 2 in response to a command from the CPU 230.

The embedded memory 220 may be a semiconductor memory such as a DRAM, and is used as a work area for the CPU 230. The embedded memory 220 holds firmware and various management tables for managing the memory 100.

The CPU 230 controls the entire operation of the memory controller 200. For example, upon receipt of a write request (including a command, logical address, and data) from the host device 2, the CPU 230 issues a write command (including a command, physical address, and data) to the memory 100 in response. The same applies to a read operation and erase operation.

The CPU 230 further executes various processes such as wear leveling for the management of the memory 100.

The CPU 230 also executes various calculations. For example, the CPU 230 may execute a data encoding process and randomizing process.

The buffer memory 240 temporarily stores the read-out data received from the memory 100, and the write data received from the host device 2.

The NAND interface circuit 250 is coupled to the memory 100 via a NAND bus to manage communications with the memory 100. The NAND interface circuit 250 transfers to the memory 100 a command issued by the CPU 230. During a write operation, the NAND interface circuit 250 transfers to the memory 100 the write data in the buffer memory 240. During a read operation, the NAND interface circuit 250 transfers to the buffer memory 240 the data read from the memory 100.

The ECC circuit 260 executes an error checking and correcting (ECC) process upon data.

1.1.2 Overall Structure of Semiconductor Memory Device

Next, the overall structure of the semiconductor memory device (memory 100) is explained with reference to FIG. 2, which is an exemplary block diagram of a basic overall structure of the semiconductor memory device. In FIG. 2, connections of part of the blocks are indicated by arrows, but the block connections are not limited thereto. For the sake of simplicity, clock signals are omitted from this drawing.

As illustrated in FIG. 2, the memory 100 includes an input/output circuit 10, a logic control circuit 11, a status register 12, an address register 13, a command register 14, a sequencer 15, a ready/busy circuit 16, a voltage generation circuit 17, a memory cell array 18, a driver module 19, a row decoder module 20, a sense amplifier module 21, a data register 22, and a column decoder 23.

The input/output circuit 10 controls the input and output of a signal DQ with respect to the memory controller 200. More specifically, the input/output circuit 10 includes an input circuit and an output circuit. The input circuit transmits data DAT (write data) received from the memory controller 200 to the data register 22, an address ADD received from the memory controller 200 to the address register 13, and a command CMD received from the memory controller 200 to the command register 14. The output circuit transmits to the memory controller 200 status information STS received from the status register 12, data DAT (read data) received from the data register 22, and an address ADD received from the address register 13. The input/output circuit 10 and the data register 22 are coupled to each other via a data bus.

The logic control circuit 11 receives from the memory controller 200, for example, a chip enable signal CEn, a command latch enable signal CLE, an address latch enable signal ALE, a write enable signal WEn, and a read enable signal REn. In response to a received signal, the logic control circuit 11 controls the input/output circuit 10 and sequencer 15.

The status register 12 temporarily stores the status information STS received from the sequencer 15, for example, in a write operation, read operation, or erase operation, and informs the memory controller 200 as to whether the operation is completed normally.

The address register 13 temporarily stores the address ADD received from the memory controller 200 via the input/output circuit 10. The address register 13 may transmit a page address PA to the driver module 19, and a block address BA to the row decoder module 20. The address register 13 transmits a column address CA to the column decoder 23.

The command register 14 temporarily stores the command CMD received from the memory controller 200 via the input/output circuit 10, and transmits it to the sequencer 15.

The sequencer 15 controls the entire operation of the memory 100. More specifically, in response to a command CMD held in the command register 14, the sequencer 15 controls, for example, the status register 12, ready/busy circuit 16, voltage generation circuit 17, driver module 19, row decoder module 20, sense amplifier module 21, data register 22, column decoder 23 and the like to execute a write operation, read operation, and erase operation.

Under the control of the sequencer 15, the ready/busy circuit 16 transmits a ready/busy signal RBn to the memory controller 200.

Under the control of the sequencer 15, the voltage generation circuit 17 generates voltages used for a write operation, read operation, or erase operation, and supplies the generated voltage, for example to the memory cell array 18, driver module 19, sense amplifier module 21, and the like.

The memory cell array 18 includes a plurality of blocks BLK (BLK1, BLK2, . . . ), which each contain a set of nonvolatile memory cell transistors. A block BLK is used as a data erasable unit, and the data held in the memory cell transistors within a block BLK is erased in a batch. Each block BLK contains a plurality of memory units MU (MU1, MU2, . . . ). Each memory unit MU contains a plurality of string units SU (SU1, SU2, . . . ). Each string unit SU contains a plurality of NAND strings NS (NS0, NS1, NS2, . . . ). A NAND string NS contains a plurality of memory cell transistors that are serially coupled. Each of the memory cell transistors is associated with a word line and a bit line. The numbers of blocks BLK, memory units MU, string units SU, and NAND strings NS in a memory cell array 18 can be freely determined. The detailed description of the memory cell array 18 will be provided later.

The driver module 19 generates voltages to be used for a read operation, write operation, erase operation, and the like. The driver module 19 applies the generated voltages to the row decoder module 20, via the signal lines selected based on a page address PA.

The row decoder module 20 selects a block BLK in a memory cell array 18, based on the block address BA. Then, the row decoder module 20 transmits the voltages applied to the signal lines to the selected word line, etc. of the selected block BLK.

In a read operation, the sense amplifier module 21 determines the data stored in a memory cell transistors based on the voltage of the bit lines, and transfers the determination result as the read-out data DAT to the data register 22. In a write operation, the sense amplifier module 21 applies the voltages to the respective bit lines in accordance with the write data DAT received from the data register 22.

The data register 22 includes a plurality of latch circuits. A latch circuit holds data DAT. In a write operation, the data register 22 may temporarily store the write data DAT received from the input/output circuit 10, and transmit it to the sense amplifier module 21. In a read operation, the data register 22 may temporarily store the read-out data DAT received from the sense amplifier module 21, and transmit it to the input/output circuit 10.

The column decoder 23 may decode the column address CA, and select the latch circuits in the data register 22 in accordance with the decoding result in the write operation, read operation, and erase operation.

1.1.3 Circuitry Structure of Memory Cell Array

Next, the circuitry structure of the memory cell array 18 will be explained with reference to FIG. 3, which is a circuit diagram showing a block BLK in a memory cell array 18.

As illustrated in FIG. 3, the memory cell array 18 includes a plurality of memory units MU (two memory units MU0 and MU1 in the example of FIG. 3) in a block BLK.

Each of the memory units MU includes a plurality of string units SU (two string units SU0 and SU1 in the example of FIG. 3). Further, each of the string units SU includes a plurality of NAND strings NS (three NAND strings NS0 to NS2 in the example of FIG. 3).

The NAND strings NS in a string unit SU are associated with different bit lines BL. Each of the NAND strings NS includes a plurality of memory cell transistors MC (four memory cell transistors MC0 to MC3 in the example of FIG. 3) and select transistors ST1 and ST2. The numbers of memory cell transistors MC and select transistors ST1 and ST2 in a NAND string NS can be freely determined.

A memory cell transistor MC includes a control gate and a charge storage layer, and stores data in a nonvolatile manner. Each of the select transistors ST1 and ST2 is used for selection of a string unit SU and NAND string NS in various operations.

The memory cell transistor MC may be of a MONOS (metal-oxide-nitride-oxide-silicon) type adopting an insulation layer for a charge storage layer, or of an FG (floating gate) type adopting a conductive layer for a charge storage layer. In the present embodiment, a MONOS type will be discussed as an example.

In a NAND string NS, the current paths of the select transistor ST2, memory cell transistors MC0 to MC3, and select transistor ST1 are coupled in series in this order.

The control gates of the memory cell transistors MC0 to MC3 in the same block BLK are coupled commonly to the corresponding word lines WL0 to WL3 provided for each block BLK. More specifically, the control gates of the memory cell transistors MC0 in the block BLK0 are coupled commonly to the word line WL0. The memory cell transistors MC1 to MC3 are respective coupled to the word line WL1 to WL3 in the same manner. The word lines WL0 to WL3 are coupled to the row decoder module 20 so as to be independently controlled by this row decoder module 20.

Should the word lines WL0 to WL3 have no need to be distinguished from each other, they will be simply referred to as "word lines WL" below.

The gates of the select transistors ST1 included in the string units SU0 of the memory units MU in the same block BLK are commonly coupled to the select gate line SGD0. In the same manner, the gates of the select transistors ST1 in the string units SU1 of the memory units MU are commonly coupled to the select gate line SGD1. The select gate lines SGD0 and SGD1 are coupled to the row decoder module 20.

In the same block BLK, the gates of the select transistors ST2 are commonly coupled to the select gate line SGS. The select gate line SGS is coupled to the row decoder module 20. The sources of the select transistors ST2 of the blocks BLK are commonly coupled to a source line SL. In the same manner as for the select gate line SGD, the gates of the select transistors ST2 may be coupled to the select gate lines SGS that differ between the string units SU.

The bit lines BL are coupled commonly to a NAND string NS included in each string unit SU of the memory unit MU. More specifically, the bit line BL0 is commonly coupled to the NAND strings NS0 of the string units SU0 and SU1 in the memory unit MU0. The bit line BL1 is commonly coupled to the NAND strings NS1 of the string units SU0 and SU1 in the memory unit MU0. The bit line BL2 is commonly coupled to the NAND strings NS2 of the string units SU0 and SU1 in the memory unit MU0.

Similarly, the bit line BL3 is commonly coupled to the NAND strings NS1 of the string units SU0 and SU1 in the memory unit MU1. The bit line BL4 is commonly coupled to the NAND strings NS2 of the string units SU0 and SU1 in the memory unit MU1. The bit line BL5 is commonly coupled to the NAND strings NS2 of the string units SU0 and SU1 in the memory unit MU1.

A set of memory cell transistors MC commonly coupled to the same select gate line SGD and word line WL will be referred to as a "cell unit CU" below. For example, one cell unit CU contains six memory cell transistors MC3 that are included in the string units SU0 of the memory units MU0 and MU1 to which the select gate line SGD0 is coupled, and are commonly coupled to the word line WL3. A write operation and a read operation are executed in a batch upon a single cell unit CU. The storage capacity of a cell unit CU including the memory cell transistors MC, which each stores, for example, 1-bit data, is defined as "1-page data". The cell unit CU may have a storage capacity of 2-page data or more in accordance with the number of bits stored in each memory cell transistor MC.

1.1.4 Overall Structure of Memory Cell Array

Next, the overall structure of the memory cell array 18 will be explained with reference to FIG. 4, which is a perspective diagram of a memory unit MU0. In the example of FIG. 4, part of the insulating layers are omitted. In the following explanation, the direction that extends in the same direction as the word line WLs and approximately parallel to the semiconductor substrate will be referred to as "X direction". The direction that intersects the X direction, extends in the same direction as the bit lines BL and is approximately parallel to the semiconductor substrate will be referred to as "Y direction". The direction approximately vertical to the semiconductor substrate will be referred to as "Z direction".

As illustrated in FIG. 4, an insulating layer 31 is formed on the semiconductor substrate 30. The insulating layer 31 may be a silicon oxide ($SiO_2$) layer. A memory cell array 18 (memory unit MU0 in the example of FIG. 4) is formed on the insulating layer 31. The memory unit MU0 may include a layer stack 34, word lines WL0 to WL3, select gate lines SGD0 and SGD1, select gate line SGS, contact plugs BC0 to BC2, two contact plugs SC, bit lines BL0 to BL2, and a source line SL.

The layer stack 34 includes four insulating layers 32 and three semiconductor layers 33 that are alternately stacked. When the four insulating layers 32 need to be distinguished from each other, they will be referred to as "insulating layers 32-0 to 32-3" in ascending order from the bottom. When the three semiconductor layers 33 need to be distinguished from each other, they will be referred to as "semiconductor layers 33-0 to 33-2" in the ascending order from the bottom. The semiconductor layers 33-0 to 33-2 may also be referred to as "layers L0 to L2". For the insulating layers 32, $SiO_2$ may be adopted.

For the semiconductor layers 33, impurity-doped polysilicon may be adopted.

The layer stack 34 includes a BL coupling portion that extends in the X direction, and a plurality (two in the example of FIG. 4) of cell portions which have one end coupled to the BL coupling portion and extend in the Y direction. One layer stack 34 corresponds to one memory unit MU, and one cell portion corresponds to one string unit SU.

The semiconductor layer 33-0 in one cell portion corresponds to the NAND string NS0. Similarly, the semiconductor layer 33-1 corresponds to the NAND string NS1. The semiconductor layer 33-2 corresponds to the NAND string NS2. The semiconductor layer 33 of the cell portion functions as an active area in which the channel layers of the memory cell transistors MC and select transistors ST1 and ST2 are formed. The semiconductor layer 33 of the BL coupling portion functions as a current path that couples the bit lines BL to the NAND strings NS.

In the BL coupling portion, contact plugs BC0 to BC2 are provided to electrically couple the semiconductor layers 33-0 to 33-2 respectively to the bit lines BL0 to BL2 that are formed above the layer stack 34 and extend in the Y direction. The contact plugs BC0 to BC2 are respectively and electrically coupled to the corresponding semiconductor layers 33-0 to 33-2 and not to other semiconductor layers 33.

Each of the cell portions has another end at which a contact plug SC is provided to electrically couple the semiconductor layers 33-0 to 33-2 to a source line SL arranged above the layer stack 34 to extend in the X direction. A contact plug SC is electrically coupled to the semiconductor layers 33-0 to 33-2.

A tunnel insulating film, a charge storage layer, and a block insulating film (not shown) are stacked on the side and top surfaces of the layer stack 34. A select gate line SGS and word lines WL0 to WL3 are provided to extend in the X direction in such a manner as to cover (straddle) the side and top surfaces of the cell portions (as well as the tunnel insulating film, charge storage layer, and block insulating film) of the layer stack 34. The select gate line SGS and word lines WL0 to WL3 are aligned in the Y direction from the contact plug SC toward the BL coupling portion. Furthermore, a select gate line SGD is provided between the BL coupling portion and the word line WL3 in such a manner as to cover the side and top surfaces of the cell portions (as well as the tunnel insulating film, charge storage layer, and block insulating film). In the example of FIG. 4, the select gate line SGD0 is provided on the front left cell portion of the drawing sheet, while the select gate line SGD1 is provided on the rear right cell portion.

1.1.5 Plane Structure of Memory Cell Array

Next, an exemplary plane structure of the memory cell array 18 will be explained with reference to FIG. 5, which is a top view of the memory units MU0 and MU1. In the example of FIG. 5, part of the insulating layers is omitted.

As illustrated in FIG. 5, two layer stacks 34, which respectively correspond to the memory units MUG and MU1, are aligned in the X direction. The contact plugs BC0 to BC2 are formed in the BL coupling portion of the layer stack 34 corresponding to the memory unit MU0 so as to be coupled respectively to the bit lines BL0 to BL2.

Similarly, the contact plugs BC3 to BC5 are formed in the BL coupling portion of the layer stack 34 corresponding to the memory unit MU1 so as to be coupled respectively to the bit lines BL3 to BL5.

In the two cell portions of the layer stack 34 corresponding to the memory unit MU0, the select gate lines SGD0 and SGD1 are arranged respectively. Similarly, in the two cell portions of the layer stack 34 corresponding to the memory unit MU1, the select gate lines SGD0 and SGD1 are arranged respectively. The select gate lines SGD0 and the select gate lines SGD1 in a block BLK are respectively and commonly coupled to each other.

The select gate line SGS and word lines WL0 to WL3 that extend in the X direction are aligned in the Y direction from the contact plugs SC toward the BL coupling portions in such a manner as to commonly couple the cell portions of the memory units MU to each other.

A contact plug SC is provided in each cell portion to be coupled to the source line SL.

1.1.6 Cross-Sectional Structure of Memory Cell Array

Figure 9:
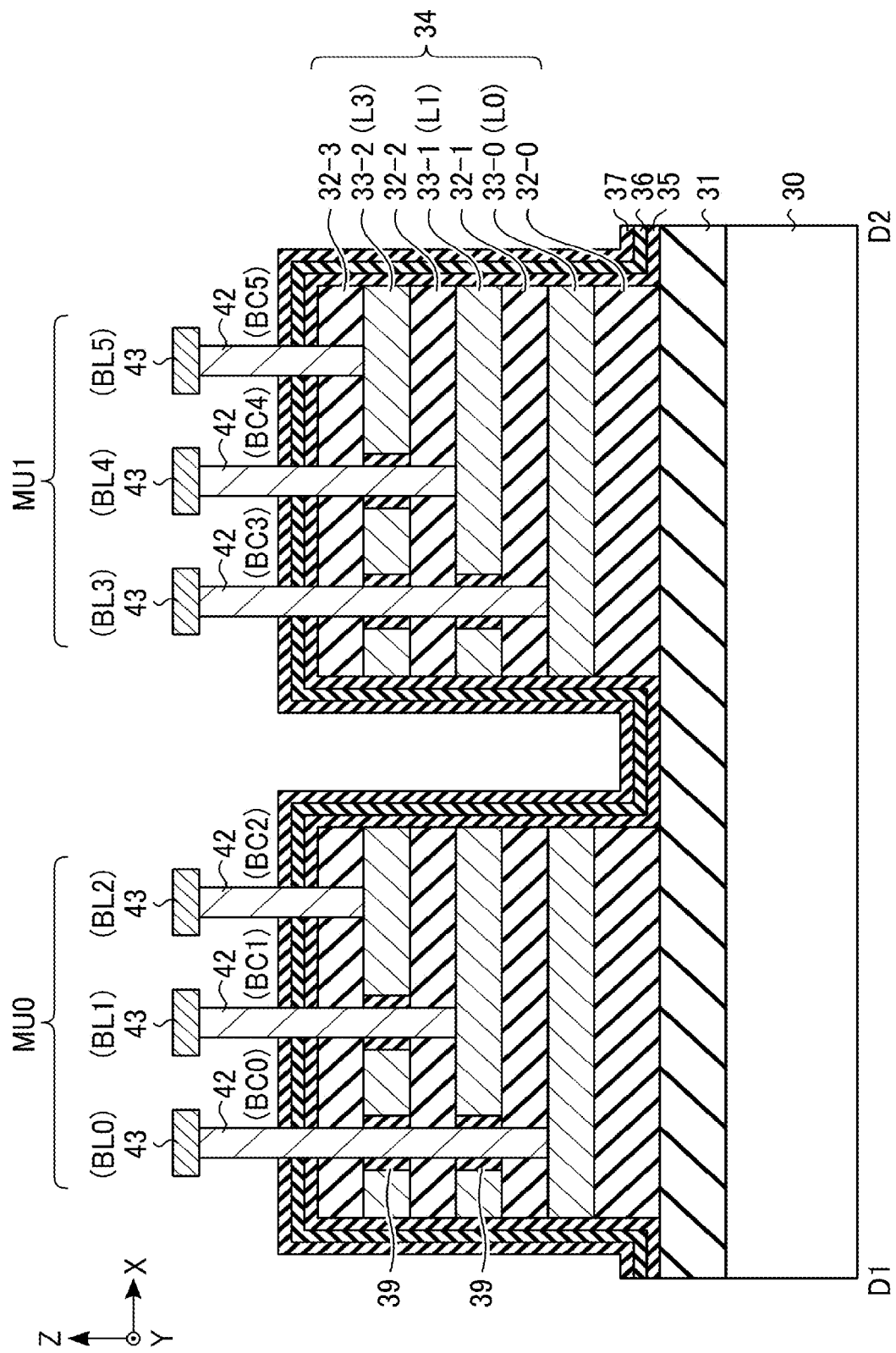
FIG. 9 is a cross section of the structure of FIG. 5, taken along line D1-D2.

Next, an exemplary cross-sectional structure of the memory cell array 18 will be explained with reference to FIGS. 6 to 9. FIG. 6 is a cross-section of the structure of FIG. 5, taken along line A1-A2; FIG. 7 is a cross section of the structure of FIG. 5, taken along line B1-B2; FIG. 8 is a cross section of the structure of FIG. 5, taken along line C1-C2; and FIG. 9 is a cross-section of the structure of FIG. 5, taken along line D1-D2.

As illustrated in FIG. 6, four cell portions corresponding to the string units SU0 and SU1 of the memory unit MU0 and the string units SU0 and SU1 of the memory unit MU1 are arranged on the insulating layer 31.

The tunnel insulating film 35, charge storage layer 36, and block insulating film 37 are sequentially stacked in such a manner as to cover (straddle) the four cell portions (layer stacks 34). The interconnect layer 38, which functions as a word line WL0, is provided on the block insulating film 37 to cover the four cell portions.

In the same manner, the interconnect layer 38, which functions as the word lines WL1 to WL3 and select gate line SGS, is also formed to straddle the four cell portions. For the tunnel insulating film 35 and block insulating film 37, $SiO_2$ may be adopted. For the charge storage layer 36, silicon nitride (SiN) may be adopted.

The interconnect layer 38 is formed of a conductive material, and may contain tungsten (W).

In a cell portion of the layer stack 34, a region that includes the semiconductor layer 33-0, tunnel insulating film 35, charge storage layer 36, block insulating film 37, and word line WL0 functions as a memory cell transistor MC0 of the NAND string NS0.

Similarly, the region that includes the semiconductor layer 33-1, tunnel insulating film 35, charge storage layer 36, block insulating film 37, and word line WL0 functions as a memory cell transistor MC0 of the NAND string NS1. A region that includes the semiconductor layer 33-2, tunnel insulating film 35, charge storage layer 36, block insulating film 37, and word line WL0 functions as a memory cell transistor MC0 of the NAND string NS2.

In the above structure, the shape of a cell portion (layer stack 34) depends on the processing property and the like of the dry etching for the processing of the layer stack 34. In a cell portion, the layer stack 34 cross-sectioned in the X direction may have a lower side longer than an upper side with the side surface being bent. The layer stack 34 cross-sectioned in the X direction may have a lower side shorter than an upper side, and its side surface need not be bent.

With the above shape of the layer stack 34, the semiconductor layers 33-0 to 33-2 differ in terms of both length in the X direction and length of the side surface in the Z direction. For this reason, the memory cell transistors MC of the NAND strings NS0 to NS2 may have different gate lengths. More specifically, the memory cell transistor MC of the NAND string NS0 containing the semiconductor layer 33-0 (layer L0) may have the shortest gate length. The memory cell transistor MC of the NAND string NS1 containing the semiconductor layer 33-1 (layer L1) may have the second shortest gate length. The memory cell transistor MC of the NAND string NS2 containing the semiconductor layer 33-2 (layer L2) may have the longest gate length. That is, the gate length increases as its memory cell transistor MC is positioned in a layer L toward the top, and shortens as its memory cell transistor MC is positioned in a layer L toward the bottom. In addition, with regard to the length (width) of the semiconductor layer 33 in the X direction, the length of the semiconductor layer 33-0 is the longest, that of the semiconductor layer 33-1 is the second longest, and that of the semiconductor layer 33-2 is the shortest. That is, the width of the semiconductor layer 33 narrows as the semiconductor layer is positioned in a layer L toward the top, and widens as it is positioned in a layer L toward the bottom.

As illustrated in FIG. 7, unlike the interconnect layers 38 that function as a word line WL and select gate line SGS, an interconnect layer 38 that functions as a select gate line SGD is independent (separated) for each cell portion (string unit SU).

As illustrated in FIG. 8, the shapes of the interconnect layers 38 that function as word lines WL and select gate lines SGD and SGS depend on the processing properties for dry etching at the time of the processing of the interconnect layer 38. For example, the length of the interconnect layer 38 in the Y direction may gradually decrease toward the upper side. If this is the case, the width of the word line WL corresponding to each semiconductor layer 33 in the Y direction, or in other words, the gate widths of the memory cell transistors MC differ among the NAND strings NS. More specifically, a memory cell transistor MC in the NAND string NS0 containing the semiconductor layer 33-0 may have the largest gate width. The memory cell transistor MC of the NAND string NS1 containing the semiconductor layer 33-1 may have the second largest gate width. The memory cell transistor MC of the NAND string NS2 containing the semiconductor layer 33-2 may have the smallest gate width. That is, the gate width decreases as its memory cell transistor MC is positioned in a layer L toward the upper side, and increases as its memory cell transistor MC is positioned in a layer L toward the bottom side.

The memory cell transistors MC that correspond to the respective semiconductor layers 33-0 to 33-2 (layers L0 to L2) may have shapes that differ from each other, depending on the production process. As a result, the properties of the memory cell transistors MC may vary among the layers L. In the examples of FIGS. 6 and 8, the process target layers toward the upper side are illustrated to be thinner. However, depending on the properties of dry etching, the layers toward the bottom side may be thinner, or the middle layer may be thinner. The present embodiment is applicable to any case.

In the vicinity of the end portion away from the BL coupling portion in the cell portion, a contact plug SC is formed to penetrate the block insulating film 37, charge storage layer 36, tunnel insulating film 35, insulating layers 32-3 to 32-1, and semiconductor layers 33-2 and 33-1, with the plug bottom surface reaching the semiconductor layer 33-0. The contact plug SC is filled with a conductor 40, and electrically coupled to the semiconductor layers 33-0 to 33-2. An interconnect layer 41 is formed on the conductor 40 to function as a source line SL.

The conductor 40 is formed of a conductive material, and may contain W. The interconnect layer 41 is formed of a conductive material, and may contain copper (Cu).

As illustrated in FIG. 9, in the BL coupling portion, the semiconductor layers 33 are coupled to different bit lines BL. More specifically, in the memory unit MU0, for example, a contact plug BC0 is formed to penetrate the block insulating film 37, charge storage layer 36, tunnel insulating film 35, insulating layers 32-3 to 32-1, and semiconductor layers 33-2 and 33-1, with the plug bottom surface reaching the semiconductor layer 33-0. An insulating layer 39 is provided between the contact plug BC0 and the semiconductor layers 33-1 and 33-2. The contact plug BC0 is therefore electrically coupled to the semiconductor layer 33-0, while not electrically coupled to the semiconductor layers 33-1 and 33-2. The contact plug BC1 penetrates the block insulating film 37, charge storage layer 36, tunnel insulating film 35, insulating layers 32-3 and 32-2, and semiconductor layer 33-2, with the plug bottom surface reaching the semiconductor layer 33-1. The insulating layer 39 is provided between the contact plug BC1 and the semiconductor layer 33-2. The contact plug BC1 is therefore electrically coupled to the semiconductor layer 33-1, while not electrically coupled to the semiconductor layers 33-0 and 33-2. The contact plug BC2 penetrates the block insulating film 37, charge storage layer 36, tunnel insulating film 35, and insulating layer 32-3, with the plug bottom surface reaching the semiconductor layer 33-2. The contact plug BC2 is therefore electrically coupled to the semiconductor layer 33-2, while not electrically coupled to the semiconductor layers 33-0 and 33-1. The contact plugs BC0 to BC2 are filled with the conductor 42. The interconnect layers 43, which function as bit lines BL0 to BL2, are provided on the contact plugs BC0 to BC2, respectively.

For the insulating layer 39, $SiO_2$ may be adopted. The conductor 42 is formed of a conductive material, and may contain W. The interconnect layer 43 is formed of a conductive material, and may contain Cu.

The memory unit MU1 has the same structure. The contact plugs BC3 to BC5 of the memory unit MU1 correspond to the contact plugs BC0 to BC2 of the memory unit MU0, respectively. The interconnect layers 43, which function as bit lines BL3 to BL5, are provided on the contact plugs BC3 to BC5, respectively.

1.1.7 Structure of Data Register and Sense Amplifier Module

Next, an exemplary structure of the data register 22 and sense amplifier module 21 will be explained with reference to FIGS. 10 and 11. FIG. 10 is a block diagram of the data register 22 and sense amplifier module 21.

FIG. 11 is a circuit diagram of the sense circuit SA.

As illustrated in FIG. 10, the sense amplifier module 21 includes a plurality of sense amplifier units SAU, each of which is provided for a bit line BL. The data register 22 includes a plurality of latch circuits XDL, each of which is provided for a sense amplifier unit SAU.

A sense amplifier unit SAU may include a sense circuit SA, and latch circuits SDL, ADL and BDL. The sense circuit SA, and latch circuits SDL, ADL and BDL are commonly coupled to the corresponding latch circuit XDL via a bus LBUS. In other words, the latch circuit XDL, sense circuit SA, and latch circuits SDL, ADL and BDL are coupled to each other via the bus LBUS in a data transmittable/receivable manner.

In a read operation, the sense circuit SA senses a voltage of the corresponding bit line BL or a current flowing through the bit line BL to judge whether the read data is "0" or "1". More specifically, the sense amplifier unit SAU determines the read data, for example at a timing of asserting a signal STB generated by the sequencer 15. According to the present embodiment, the sequencer 15 generates signals STB0 to STB2 corresponding to the layers L0 to L2, and transmits the signals to the corresponding sense amplifier units SAU. The sequencer 15 may transmit a signal STB0 to the sense amplifier unit SAU0 corresponding to the bit line BL0 and to the sense amplifier unit SAU3 corresponding to the bit line BL3. The sequencer 15 may transmit a signal STB1 to the sense amplifier unit SAU1 corresponding to the bit line BL1 and to the sense amplifier unit SAU4 corresponding to the bit line BL4. The sequencer 15 may transmit a signal STB2 to the sense amplifier unit SAU2 corresponding to the bit line BL2 and to the sense amplifier unit SAU5 corresponding to the bit line BL5.

In a write operation, the sense circuit SA applies voltage to the bit line BL based on the write data.

The latch circuits SDL, ADL and BDL temporarily store the read data and write data. The read data determined by the sense circuit SA during a read operation and write data transferred to the latch circuit XDL during a write operation may be transferred to any of the latch circuits SDL, ADL and BDL.

The latch circuit XDL is employed for input and output of data between the sense amplifier unit SAU and input/output circuit 10. More specifically, the write data received from the memory controller 200 is transmitted to the latch circuit SDL, ADL or BDL, or to the sense circuit SA, via the latch circuit XDL. The read data stored in the latch circuit SDL, ADL or BDL or in the sense circuit SA is transmitted to the memory controller 200 via the latch circuit XDL.

The structure of the sense amplifier unit SAU is not limited to the above, and various modifications can be made. For example, the number of latch circuits in a sense amplifier unit SAU may be designed based on the number of bits of the data held in a memory cell transistor MC.

Next, the structure of a sense circuit SA will be explained. According to the present embodiment, a sense circuit SA of a current sensing type will be used as an example, with which a current flowing through a bit line BL is sensed.

As illustrated in FIG. 11, a sense circuit SA may include transistors Tr0 to Tr7 and a capacitor element CA. The transistor Tr0 may be a P-type MOS transistor. Each of the transistors Tr1 to Tr7 may be an N-type MOS transistor.

A power supply voltage VDD may be applied to the source of the transistor Tr0. The drain of the transistor Tr0 is coupled to the node SSRC. The gate of the transistor Tr0 is coupled to the node INV_S in the latch circuit SDL.

The drain of the transistor Tr1 is coupled to the node SSRC. The source of the transistor Tr1 is coupled to the node SCOM. A signal BLX is input to the gate of the transistor Tr1.

The drain of the transistor Tr2 is coupled to the node SSRC. The source of the transistor Tr2 is coupled to the node SEN. A signal HLL is input to the gate of the transistor Tr2.

The drain of the transistor Tr3 is coupled to the node SEN. The source of the transistor Tr3 is coupled to the node SCOM. A signal XXL is input to the gate of the transistor Tr3.

The drain of the transistor Tr4 is coupled to the node SCOM. A signal BLC is input to the gate of the transistor Tr4. The source of the transistor Tr4 is coupled to the corresponding bit line BL. The transistor Tr4 functions as a clamp transistor for clamping the voltage of the bit line BL in accordance with the signal BLC.

The drain of the transistor Tr5 is coupled to the node SCOM. The source of the transistor Tr5 is coupled to the node SRCGND. A ground voltage VSS may be applied to the node SRCGND. The gate of the transistor Tr5 is coupled, for example to the node INV_S in the latch circuit SDL.

The source of the transistor Tr6 is grounded. The gate of the transistor Tr6 is coupled to the node SEN. The transistor Tr6 functions as a sense transistor for sensing the voltage of the node SEN.

The drain of the transistor Tr7 is coupled to the bus LBUS. The source of the transistor Tr7 is coupled to the drain of the transistor Tr6. A signal STB is input to the gate of the transistor Tr7.

One of the electrodes of the capacitor element CA is coupled to the node SEN. A clock signal CLK is input to the other electrode of the capacitor element CA.

The signals BLX, HLL, XXL, BLC and STB, as well as the clock signal CLK, may be generated by the sequencer 15. The sense circuit SA determines the data read out to the bit line BL, based on the timing of asserting the signal STB.

Next, the operation of the sense circuit SA in the read operation will be briefly explained. In the read operation, first, the node INV_S is set to the "L" level, and the transistor Tr0 is turned to the ON state. When the transistor Tr1 is turned ON and a signal BLC (clamp voltage) is applied to the transistor Tr4, the bit line BL is pre-charged to a voltage corresponding to the signal BLC via the transistors Tr0, Tr1 and Tr4. When the transistor Tr2 is turned ON, the node SEN is pre-charged to the voltage VDD.

After the transistor Tr2 is turned OFF, the transistor Tr3 is turned ON. When the threshold voltage of the read-target memory cell transistor MC (which hereinafter may be referred to as "selected memory cell transistor MC") is lower than the read voltage, the selected memory cell transistor MC is turned ON (such a transistor may hereinafter be referred to as an "ON cell"). If this is the case, a current flows from the bit line BL to the source line SL, lowering the voltage of the node SEN. When the voltage of the node SEN falls below the threshold voltage of the transistor Tr6, the transistor Tr6 is turned OFF. On the other hand, when the threshold voltage of the selected memory cell transistor MC is higher than or equal to the read voltage, the selected memory cell transistor MC is turned OFF (such a transistor may hereinafter be referred to as an "OFF cell"). If this is the case, a current scarcely flows from the bit line BL to the source line SL, as a result of which the voltage of the node SEN is maintained, and the transistor Tr6 is in the ON state.

When the signal STB is set to the "H" level and the transistor Tr7 is in the ON state (such an operation will hereinafter be referred to as a "strobe operation"), the voltage corresponding to the determination of the ON/OFF state of the transistor Tr6 is read out to the bus LBUS. When the transistor Tr6 is in the OFF state, or in other words when the selected memory cell transistor is an ON cell, the bus LBUS is set to the "H" level through the strobe operation. When the transistor Tr6 is in the ON state, or in other words when the selected memory cell transistor is an OFF cell, the bus LBUS is set to the "L" level through the strobe operation. With the bus LBUS at "H" level, data "1" is held in the latch circuit SDL, whereas with the bus LBUS at "L" level, data "0" is held in the latch circuit SDL.

When the latch circuit SDL holds data "1", the node INV_S is set to the "H" level. On the other hand, when the latch circuit SDL holds data "0", the node INV_S is set to the "L" level.

1.2 Threshold Voltage Distribution of Memory Cell Transistor

An exemplary distribution of threshold voltages that a memory cell transistor MC may adopt will be explained with reference to FIG. 12, which illustrates the relationship between the threshold voltage distribution of memory cell transistors MC and allocation of data. In the present embodiment, a memory cell transistor MC being a triple level cell (TLC) that can hold octal (3-bit) data will be discussed. The data that can be held in a memory cell transistor MC is not limited to octal, however. A memory cell transistor MC according to the present embodiment can be configured to hold binary (1-bit) data or data of any higher base.

Figure 12:
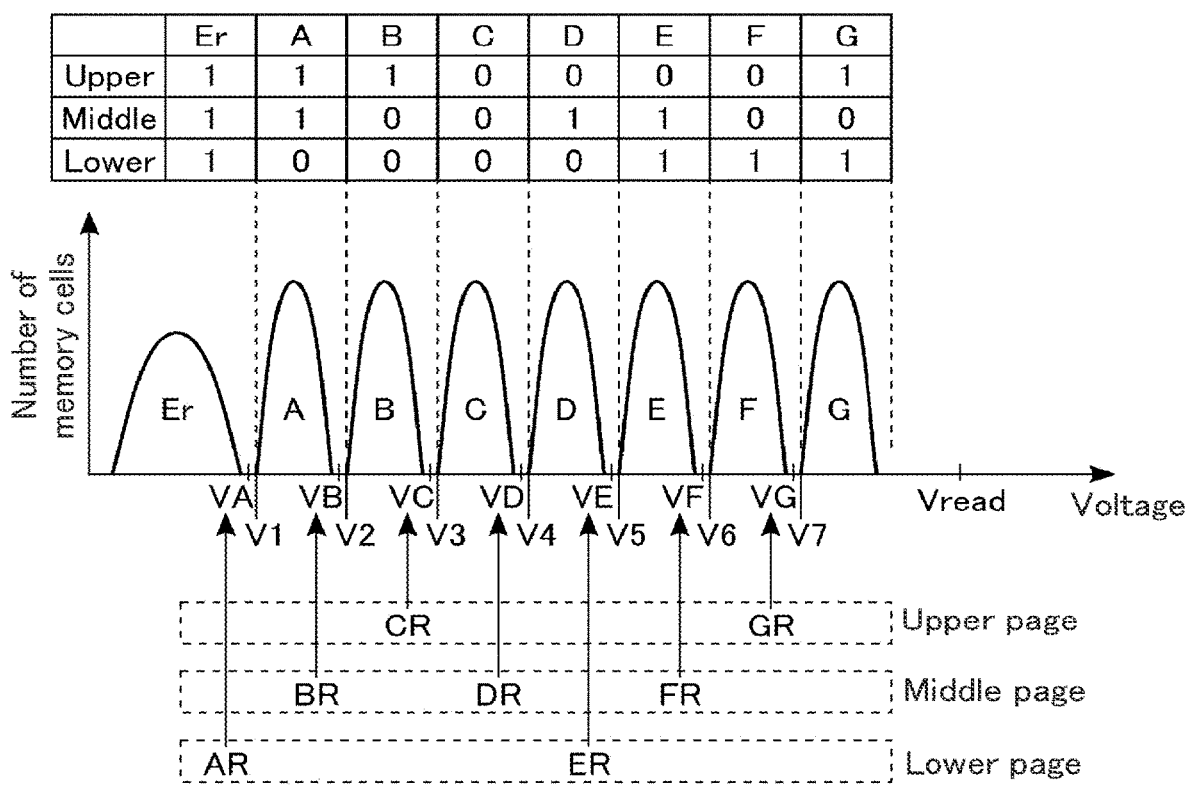
FIG. 12 is a threshold voltage distribution diagram of memory cell transistors included in the semiconductor memory device of the memory system according to the first embodiment.

As illustrated in FIG. 12, the threshold voltages of the memory cell transistors MC may respectively take any of the discretely distributed eight values. Here, the octal distribution includes states "Er", "A", "B", "C", "D", "E", "F", and "G" in the ascending order of the threshold voltages.

The state "Er" may represent a data erased state. The states "A" to "G" represent different states of data being written by injecting charge into the charge storage layer. When V1 to V7 denote verify voltages corresponding to the threshold voltages of the distribution in a write operation, the voltage values satisfy a relationship of $V1<V2<V3<V4<V5<V6<V7<Vread$. The voltage Vread is a voltage that is applied to the non-selected word line WL in a read operation. A memory cell transistor MC is turned ON under the application of a voltage Vread to its gate, regardless of the data held within.

More specifically, the threshold voltage in the state "Er" is lower than the voltage V1. The threshold voltage in the state "A" is higher than or equal to the voltage V1, and is lower than the voltage V2. The threshold voltage in the state "B" is higher than or equal to the voltage V2, and is lower than the voltage V3. The threshold voltage in the state "C" is higher than or equal to the voltage V3, and is lower than the voltage V4. The threshold voltage in the state "D" is higher than or equal to the voltage V4, and is lower than the voltage V5. The threshold voltage in the state "E" is higher than or equal to the voltage V5, and is lower than the voltage V6. The threshold voltage in the state "F" is higher than or equal to the voltage V6, and is lower than the voltage V7. The threshold voltage in the state "G" is higher than or equal to the voltage V7, and is lower than the voltage Vread.

The read voltages corresponding to the aforementioned states will be referred to as VA to VG.

The read voltages VA to VG may be the same as the corresponding verify voltages V1 to V7, or may differ from them. In the explanation below, the verify voltages and read voltages are set, for the sake of simplicity, to the same values.

The read operations in the states "A" to "G" will be referred to as read operations "AR", "BR", "CR", "DR", "ER", "FR", and "GR", respectively. The read operation AR is to determine whether the threshold voltage of a memory cell transistor MC is lower than the voltage VA. The read operation BR is to determine whether the threshold voltage of the memory cell transistor MC is lower than the voltage VB. The read operation CR is to determine whether the threshold voltage of the memory cell transistor MC is lower than the voltage VC. Other read operations are executed in a similar manner.

As discussed above, a memory cell transistor MC takes one of the eight threshold voltages in the distribution, and thus can be in one of eight different states. These states are assigned to "000" to "111" in binary notation so that each memory cell transistor MC can hold 3-bit data. Hereinafter, the three bits of the 3-bit data will be expressed as a lower bit, a middle bit, and an upper bit. A set of lower bits to be written into (or read from) a cell unit CU in a batch will be referred to as a "lower page", a set of middle bits will be referred to as a "middle page", and a set of upper bits will be referred to as an "upper page".

In the example of FIG. 12, data is assigned to the "upper bit/middle bit/lower bit" of the memory cell transistors MC in the threshold voltage distribution in the manner indicated below.

State "Er": data "111"
State "A": data "110"
State "B": data "100"
State "C": data "000"
State "D": data "010"
State "E": data "011"
State "F": data "001"
State "G": data "101"

When reading such allocated data, its lower bit can be determined by the read operations AR and ER. The middle bit can be determined by the read operations BR, DR and FR. The upper bit can be determined by the read operations CR and GR. That is, the values of the lower bit, middle bit, and upper bit are determined through two, three, and two read operations, respectively. This data allocation will be referred to as "2-3-2 coding". The data allocation to the states "Er" to "G" is not limited to 2-3-2 coding, however.

1.3 Layer Dependency of Threshold Voltage Distribution

Figure 13:
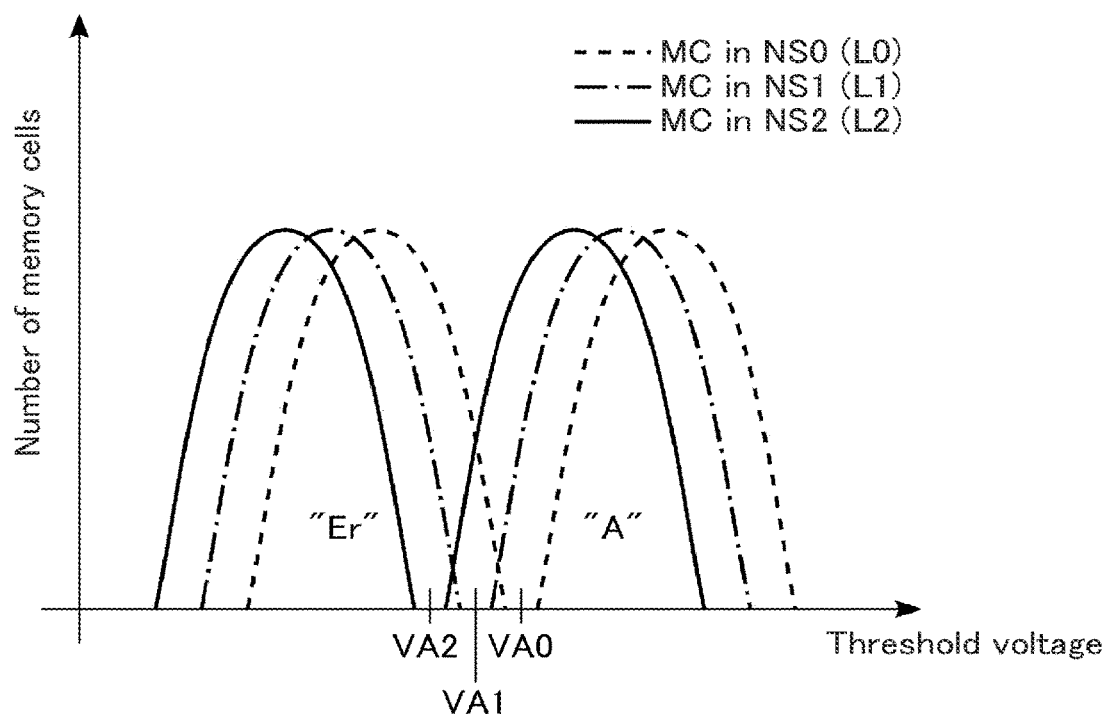
FIG. 13 is a diagram showing an example of the distribution of the threshold voltages of individual layers L in the memory cell transistors included in the semiconductor memory device of the memory system according to the first embodiment.

An example of layer dependency of the threshold voltage distribution will be explained with reference to FIG. 13, which illustrates the distribution of threshold voltages of the layers L in the state "Er" and state "A" for.

The memory cell transistors MC in the respective layers L differ from each other in sizes (gate lengths, gate widths, etc.), depending on the processing properties of the layer stack 34 and interconnect layers 38 (word lines WL). For this reason, even under the same write conditions applied, the threshold voltage distribution tends to be shifted in accordance with the layer L. In the example of FIG. 13, the threshold voltage distribution of the layer L2, or in other words the memory cell transistor MC of the NAND string NS2, takes the lowest range. The threshold voltage distribution of the layer L1, or in other words the memory cell transistor MC of the NAND string NS1, takes the second lowest range. The threshold voltage distribution of the layer L0, or in other words the memory cell transistor MC of the NAND string NS0, takes the highest range. That is, in the threshold voltage distribution of memory cell transistors MC, a layer L positioned toward the bottom takes a higher voltage-side range.

Depending on the different sizes of the memory cell transistors MC of the layers L, the threshold voltage distribution of memory cell transistors MC of an upper layer L may be on the higher voltage side, or the threshold voltage distribution of memory cell transistors MC of a middle layer L may be on the higher voltage side.

For the above threshold voltage distributions according to the present embodiment, the read voltages are set to different values to correspond to the respective layers L. For example, in the read operation AR of the state "A", the memory cell transistor MC of the layer L0 has a read voltage set to VA0. The memory cell transistor MC of the layer L1 has a read voltage set to VA1. The memory cell transistor MC of the layer L2 has a read voltage set to VA2. The voltages VA0 to VA2 exhibit different values from each other, obtained by shifting the read voltage VA explained with reference to FIG. 12. The read voltages VA to VG in FIG. 12 may be considered as default read voltages, and may be referred to as "default voltages". In the example of FIG. 13, voltages VA0 to VA2 satisfy a relationship of $VA2<VA1<VA0$. Similarly, in the read operations of the states "B" to "G", different read voltages are set for different layers L in accordance with the shift of the threshold voltage distribution.

1.4 Read Operation

The read operation will be explained. In the present embodiment, read voltages are set for respective layers L, and read operations are executed for respective layers L in different time periods.

1.4.1 Layers and Read Voltages

Figure 14:
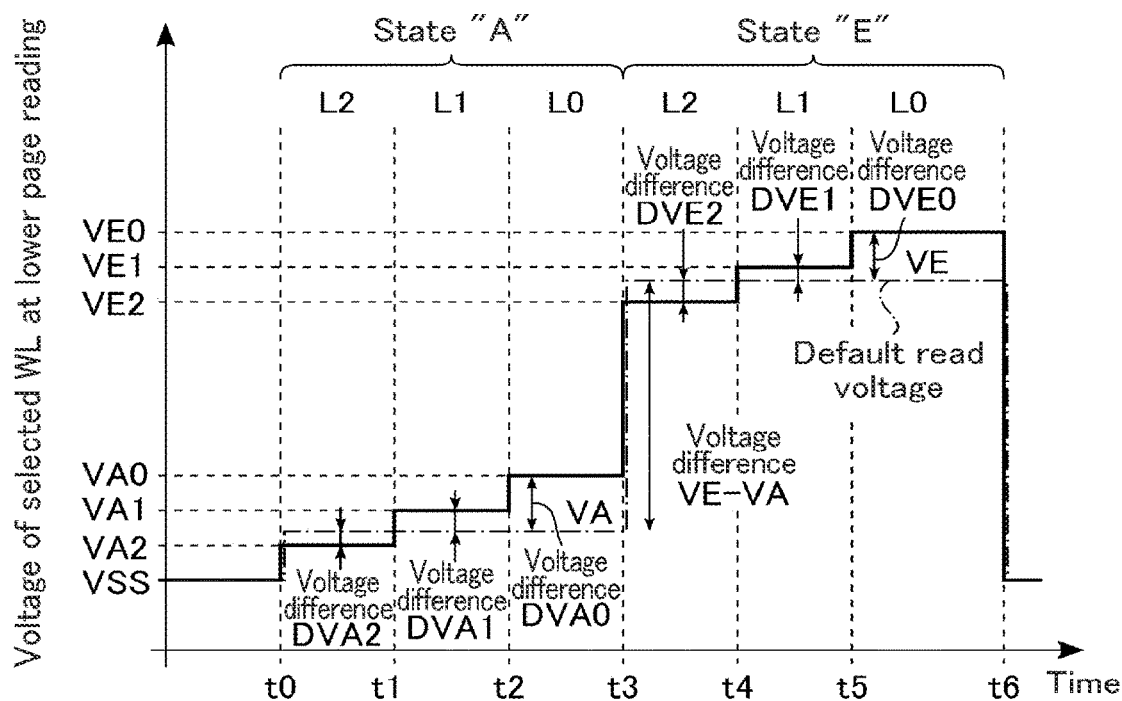
FIG. 14 is a timing chart showing the voltages of a selected word line during a lower page read operation in the semiconductor memory device of the memory system according to the first embodiment.

First, the relationship between a layer L and a read voltage will be described with reference to FIG. 14. FIG. 14 provides a timing chart for showing the voltages of a selected word line WL in the read operation of a lower page.

As illustrated in FIG. 14, in the read operation of a lower page, the read operation AR of the state "A" and the read operation ER of the state "E" are executed. In this case, the read operation AR corresponding to the layer L2 having a low set voltage is first executed, then the read operation AR corresponding to the layer L1 is executed, and lastly the read operation AR corresponding to the layer L0 is executed. In the same manner, the read operations ER corresponding to the layers L2 to L0 are sequentially executed. That is, in the read operations of each state, the read voltage applications and read operations are repeated for a number of times corresponding to the number of layers L.

More specifically, during a period between time points t0 and t1, the read operation AR is executed upon the selected memory cell transistor MC of the layer L2. In this operation, a read voltage VA2 is applied to the word line WL (hereinafter referred to as a "selected word line WL") of the selected memory cell transistor MC. The voltage difference between the default voltage VA and the set voltage (read voltage VA2) will be expressed as DVA2. The voltages VA, VA2 and DVA2 satisfy the relationship of VA2=VA+DVA2.

During the period between time points t1 and t2, a read operation AR is executed upon the selected memory cell transistor MC of the layer L1. Here, a read voltage VA1 is applied to the selected word line WL. When the voltage difference between the default voltage VA and the read voltage VA1 is expressed as DVA1, the voltages VA, VA1 and DVA1 satisfy the relationship of VA1=VA+DVA1.

During the period between time points t2 and t3, the read operation AR is executed upon the selected memory cell transistor MC of the layer L0. Here, a read voltage VA0 is applied to the selected word line WL. When the voltage difference between the default voltage VA and the read voltage VA0 is expressed as DVA0, the voltages VA, VA0 and DVA0 satisfy the relationship of VA0=VA+DVA0.

The read operation ER in the state "E" is executed in a similar manner.

During the period between time points t3 and t4, the read operation ER is executed upon the selected memory cell transistor MC of the layer L2. Here, a read voltage VE2 is applied to the selected word line WL. When the voltage difference between the default voltage VE and the read voltage VE2 is expressed as DVE2, the voltages VE, VE2 and DVE2 satisfy the relationship of VE2=VE+DVE2.

During the period between time points t4 and t5, the read operation ER is executed upon the selected memory cell transistor MC of the layer L1. Here, a read voltage VE1 is applied to the selected word line WL. When the voltage difference between the default voltage VE and the read voltage VE1 is expressed as DVE1, the voltages VE, VE1 and DVE1 satisfy the relationship of VE1-VE+DVE1.

During the period between time points t5 and t6, the read operation ER is executed upon the selected memory cell transistor MC of the layer L0. Here, a read voltage VE0 is applied to the selected word line WL. When the voltage difference between the default voltage VE and the read voltage VE0 is expressed as DVE0, the voltages VE, VE0 and DVE0 satisfy the relationship of VE0=VE+DVE0.

The difference between the default voltages of different states is greater than the difference between the default voltage and the read voltage of each layer. For example, in the read operation of a lower page, the voltage difference (VE−VA) between the default voltage VA of the state "A" and the default voltage VE of the state "E" is greater than any of the voltage differences DVA0 to DVA2 and voltage differences DVE0 to DVE2 between the read voltages of the layers.

The same holds for the read operations of the middle page and upper page. The order of the read operations corresponding to different layers L may be freely determined for each state.

1.4.2 Parameter Table of Read Voltages

Next, an exemplary parameter table of read voltages will be explained with reference to FIG. 15, which provides a parameter table for read voltages of different states. This parameter table may be stored in the RAM 220 of the memory controller 200.

As shown in FIG. 15, the parameter table may include default voltages of different states, voltage differences between the default voltage and set voltage for each layer L (which hereinafter may be referred to as "voltage difference information"), and set voltages of the read voltages. If default voltages are held in the memory 100, the parameter table may not need to contain the default voltages. Furthermore, if the memory controller 200 sends voltage difference information to the memory 100 when setting the read voltage, the parameter table need not contain the set voltages of the read voltages. If this is the case, the memory 100 calculates a set voltage from the default voltage and the voltage difference information received from the memory controller 200. On the other hand, if the memory controller 200 sends a set voltage to the memory 100 when setting the read voltage, the parameter table need not contain the voltage difference information.

The details of the table will be provided below. Similarly to the states "A" and "E", the read voltages of the state "B" for the layers L0 to L2 will be expressed as VB0 to VB2, respectively. The voltage differences between the default voltage VB and the read voltages VB0 to VB2 will be expressed as DVB0 to DVB2, respectively. The read voltages of the state "C" for the layers L0 to L2 will be expressed as VC0 to VC2, respectively. The voltage differences between the default voltage VC and the read voltages VC0 to VC2 will be expressed as DVC0 to DVC2, respectively. The read voltages of the state "D" will be expressed as VD0 to VD2, respectively. The voltage differences between the default voltage VD and the read voltages VD0 to VD2 will be expressed as DVD0 to DVD2, respectively. The read voltages of the state "E" will be expressed as VE0 to VE2, respectively. The voltage differences between the default voltage VE and the read voltages VE0 to VE2 will be expressed as DVE0 to DVE2, respectively. The read voltages of the state "F" will be expressed as VF0 to VF2, respectively. The voltage differences between the default voltage VF and the read voltages VF0 to VF2 will be expressed as DVF0 to DVF2, respectively. The read voltages of the state "G" will be expressed as VG0 to VG2, respectively. The voltage differences between the default voltage VG and the read voltages VG0 to VG2 will be expressed as DVG0 to DVG2, respectively.

1.4.3 Overall Flow of Read Operation

Next, the overall flow of a read operation will be explained with reference to FIG. 16, which shows a flowchart of a read operation. According to the present embodiment, the memory controller 200 transmitting voltage difference information as a parameter to the memory 100 when setting a read voltage will be discussed. Along with the parameter, the memory controller 200 may also transmit a specific command to the memory 100. The operation of setting parameters will be referred to as a "Set Feature". A combination of commands corresponding to respective operations will be referred to as a "command set".

As illustrated in FIG. 16, first, the host device 2 transmits a read request to the memory system 1 (step S10).

Upon receipt of the read request from the host device 2, the CPU 230 checks voltage difference information for the state and layer L by referring to the parameter table of read voltages. More specifically, the CPU 230 checks the voltage difference between the default voltage and the set voltage of each layer L for every state corresponding to the read target page. Then, the CPU 230 issues a command set for the Set Feature including voltage difference information (step S11), and transmits the command set to the memory 100.

Upon receipt of the command set for the Set Feature, the sequencer 15 calculates a read voltage for each layer L, based on the default voltage and voltage difference information (step S12). The calculated read voltage may be stored in an internal register (not shown) in the sequencer 15.

When the setting of parameters is completed, the CPU 230 issues a command set for a read operation (step S13), and transmits it to the memory 100.

Upon receipt of the command set for a read operation, the sequencer 15 executes a read operation in each state at different periods for the different layers L (step S14). When the read operation is completed, the sequencer 15 transmits the read-out data to the memory controller 200.

After executing ECC processing or the like upon the read-out data received from the memory 100, the CPU 230 transmits the error-corrected read-out data to the host device 2, as a read response to the read request (step S15).

The host device 2 receives the data (step S16), and the read operation is terminated.

1.4.4 Command Sequences for Set Feature and Read Operation

Exemplary command sequences for the Set Feature and read operation will be explained with reference to FIG. 17, which shows a command sequence for the Set Feature and for the read operation. In the example of FIG. 17, signals CEn, CLE, ALE, WEn, and signal REn are omitted for the sake of simplicity. The signals DQ and ready/busy signals RBn are illustrated. In a signal DQ, a command is placed in an oval frame, an address is placed in a square frame, and data is placed in a hexagonal frame. The command CMD input to the memory 100 will be stored in the command register 14. The address ADD is stored in the address register 13. The data DAT is stored in the data register 22.

As illustrated in FIG. 17, the CPU 230 transmits to the memory 100 a command set for the Set Feature in order to set parameters for a read operation in the memory 100.

More specifically, the CPU 230 first issues a command "EFh" and transmits it to the memory 100. The command "EFh" is to recognize a Set Feature.

Next, the CPU 230 issues an address corresponding to a read target page and transmits it to the memory 100. If the read target is a lower page, the CPU 230 issues an address "00h". If the read target is a middle page, the CPU 230 issues an address "01h". If the read target is an upper page, the CPU 230 issues an address "02h".

Thereafter, the CPU 230 transmits data that designates a voltage difference with respect to the default voltage for each layer L. The example of FIG. 17 shows the case of a lower page, where the CPU 230 transmits data "DVA0", "DVA1", "DVA2", "DVE0", "DVE1" and "DVE2" to the memory 100.

Upon receipt of the command set for the Set Feature, the sequencer 15 sets the ready/busy signal RBn to the "L" level and sets the parameters. After setting the parameters, the sequencer 15 sets the ready/busy signal RBn to the "H" level.

Upon receipt of the "H"-level ready/busy signal RBn, the CPU 230 transmits a command set for a read operation.

More specifically, the CPU 230 first issues a command "Page" that designates a read target page, and transmits it to the memory 100.

Next, the CPU 230 issues a command "00h" and transmits it to the memory 100. The command "00h" is to notify a read operation.

Thereafter, the CPU 230 transmits to the memory 100, for example 5-cycle address (two cycles of column addresses "C1" and "C2" and three cycles of row addresses "R1", "R2" and "R3").

Next, the CPU 230 issues a command "30h" and transmits it to the memory 100. The command "30h" is to instruct the execution of a read operation.

Upon receipt of the command "30h" via the command register 14, the sequencer 15 sets the ready/busy signal RBn to the "L" level. Then, the sequencer 15 executes a read operation based on the parameters set in the Set Feature. When the read data is stored, for example in the data register 22, the sequencer 15 sets the ready/busy signal RBn to the "H" level. Hereinafter, the period in which the sequencer 15 executes a read operation with the ready/busy signal set to the "L" level will be referred to as a "read-out period tR".

Upon receipt of an "H"-level ready/busy signal RBn, the CPU 230 reads the read data "Data out" from the memory 100.

More specifically, the CPU 230 first issues a command "05h" and transmits it to the memory 100. A command "05h" notifies a data output operation (hereinafter referred to as a "cache read operation") from the data register 22.

Next, the CPU 230 transmits, for example a 5-cycle address to the memory 100.

Thereafter, the CPU 230 issues a command "E0h" and transmits it to the memory 100. The command "E0h" is to instruct the execution of a cache read operation.

Upon receipt of the command "E0h" via the command register 14, the sequencer 15 transmits the read data "Data out" stored in the data register 22 to the memory controller 200, maintaining the ready/busy signal RBn at "H" level.

1.4.5 Address Table for Set Feature

The address and data attached to a command set for the Set Feature will be explained with reference to FIG. 18, which provides an address table for the Set Feature.

As illustrated in FIG. 18, after the issuance of an address "00h" in a read operation of a lower page, the CPU 230 sequentially attaches data "DVA0", "DVA1" and "DVA2" corresponding to the layers L0 to L2 for the state "A", and data "DVE0", "DVE1" and "DVE2" corresponding to the layers L0 to L2 for the state "E". In a read operation for a middle page, the CPU 230 issues an address "01h", and sequentially attaches data "DVB0", "DVB1" and "DVB2" corresponding to the layers L0 to L2 for the state "B", data "DVD0", "DVD1" and "DVD2" corresponding to the layers L0 to L2 for the state "D", and data "DVF0", "DVF1" and "DVF2" corresponding to the layers L0 to L2 for the state "F". In a read operation for an upper page, the CPU 230, after the issuance of an address "02h", sequentially attaches data "DVC0", "DVC1" and "DVC2" corresponding to the layers L0 to L2 for the state "C", and data "DVG0", "DVG1" and "DVG2" corresponding to the layers L0 to L2 for the state "G".

The number of effective data items may be freely determined in accordance with the number of states and the number of layers L. Furthermore, the data according to the present embodiment has been illustrated here as data in which a voltage difference with respect to a default voltage is attached to a command set. This is not a limitation, however. The set value of the read voltage may be attached to a command set. If the memory 100 holds a parameter table, the data may be address data for designating the corresponding layer L.

1.4.6 Voltages of Interconnects in Read Operation

Voltages of the interconnects in an exemplary read operation will be described with reference to FIGS. 19 and 20, which provide timing charts indicating the voltages of the interconnects in a read operation of a lower page.

Figure 19:
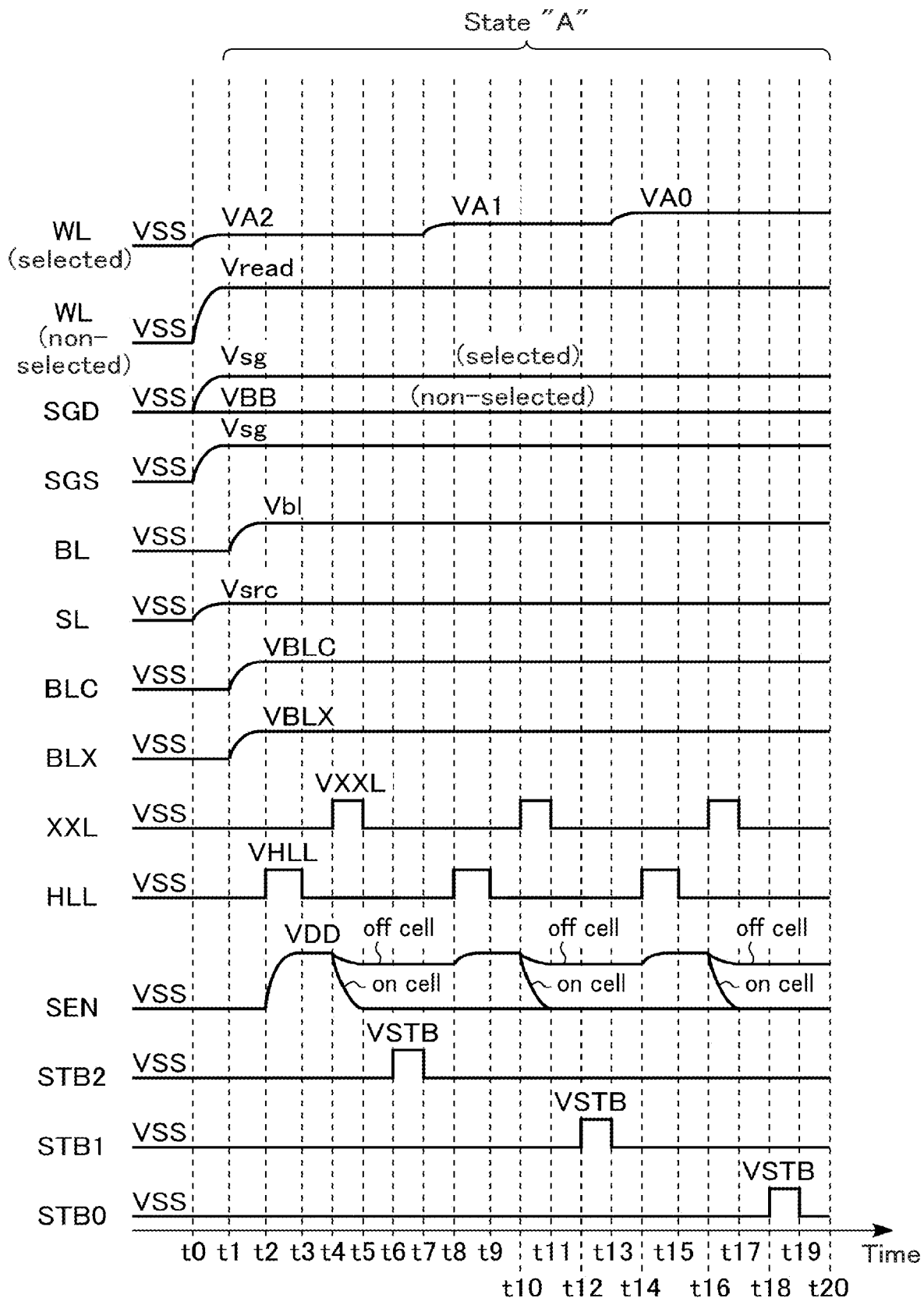
FIGS. 19 and 20 are timing charts of voltages of individual interconnects during a read operation in the semiconductor memory device of the memory system according to the first embodiment.

As illustrated in FIG. 19, at time point t0, the row decoder module 20 applies a read voltage VA2 to the selected word line WL, and a voltage Vread to the non-selected word lines WL. The row decoder module 20 further applies a voltage Vsg to the select gate line SGD corresponding to a string unit SU (hereinafter referred to as "selected string unit SU") that includes the selected memory cell transistors MC, and applies a negative voltage VBB to the select gate lines SGD corresponding to the non-selected string units SU. The row decoder module 20 also applies a voltage Vag to the select gate line SGS. The voltage Vsg is at a level that turns the select transistors ST1 and ST2 to the ON state.

The negative voltage VBB is at a level that turns the select transistor ST1 to the OFF state. A voltage Vsrc is applied to the source line SL, for example from a source line driver module (not shown). The voltage Vsrc is a positive voltage higher than the voltage VSS and lower than the voltage Vbl of a bit line BL.

During the period between time points t1 and t8, the sequencer 15 executes a read operation AR upon the layer L2. More specifically, at time point t1, the sense circuit SA of the sense amplifier unit SAU sets the node INV_S to the "L" level, and the transistor Tr0 to the ON state. The sequencer 15 sets the signal BLX to a voltage VBLX, and the signal BLC to a voltage VBLC. The voltage VBLX is an "H" level voltage of the signal BLX, which allows the transistor Tr1 to transmit the voltage VDD. The voltage VBLC is to clamp the voltage of the bit line BL to Vbl. When the threshold voltage of the transistor Tr4 is Vth, the voltage VBLC and voltage Vbl satisfy Vbl=VBLC−Vth. As a result, the transistors Tr1 and Tr4 are turned ON. The sense amplifier unit SAU thereby applies the voltage Vbl to the corresponding bit line BL (to pre-charge the bit line BL).

During the period between time points t2 and t3, the sequencer 15 sets the signal HLL to the voltage VHLL. The voltage VHLL is an "H" level voltage of the signal HLL, which allows the transistor Tr2 to transmit the voltage VDD. As a result, the transistor Tr2 is turned to the ON state, and the node SEN is pre-charged to the voltage VDD.

During the period between time points t4 and t5, the sequencer 15 sets the signal XXL to a voltage VXXL. The voltage VXXL is an "H" level voltage of the signal XXL. Thus, the transistor Tr3 is turned to the ON state. When the selected memory cell transistor MC is in the ON state (when it is an ON cell), the current flows from the bit line BL to the source line SL. The node SEN is therefore discharged. Thus, the transistor Tr6 is turned to the OFF state. On the other hand, if the selected memory cell transistor MC is in the OFF state (when it is an OFF cell), the current scarcely flows from the bit line BL to the source line SL, the voltage of the node SEN is practically not lowered (does not fall below the determination level of the read data or, in other words, the threshold voltage of the transistor Tr6). Thus, the transistor Tr6 is turned to the ON state.

During the period between time points t6 and t7, a strobe operation corresponding to the layer L2 is executed. More specifically, the sequencer 15 sets the signal STB2 corresponding to the layer L2 to the voltage VSTB. The voltage VSTB is an "H" level voltage of the signal STB. Thus, the transistor Tr7 is turned to the ON state in the sense amplifier unit SAU corresponding to the layer L2. As a result, when the transistor Tr6 is in the OFF state, or in other words in the case of an ON cell, the voltage of the bus LBUS is set to the "H" level. In contrast, when the transistor Tr6 is in the ON state, or in other words when in the case of an OFF cell, the voltage of the bus LBUS is set to the "L" level.

During the period between time points t7 and t8, if the bus LBUS is at "H" level, data "1" is entered into the latch circuit SDL. If the bus LBUS is at "L" level, data "0" is entered into the latch circuit SDL. The node INV_S of the latch circuit SDL holding data "1" is set to the "H" level. As a result, the transistor Tr0 of the corresponding sense circuit SA is turned OFF, while the transistor Tr5 is turned ON. That is, of the memory cell transistors MC corresponding to the layer L2, any bit lines BL that correspond to the memory cell transistors MC determined to be ON cells are coupled to the node SRCGND. At time point t7, the row decoder module 20 applies a read voltage VA1 to the selected word line WL.

During the period between time points t8 and t14, the sequencer 15 executes a read operation AR corresponding to the layer L1. More specifically, during a period between time points t8 and t9, the sequencer 15 sets the signal HLL to the voltage VHLL in the same manner as in the period between time points t2 and t3.

Here, the transistor Tr0 is turned OFF in the sense circuit SA corresponding to the latch circuit SDL holding data "1", the voltage VDD is not applied to the node SEN (i.e., the node SEN is not pre-charged).

During the period between time points t10 and t11, the sequencer 15 sets the signal XXL to the voltage VXXL, in the same manner as in the period between time points t4 and t5. The node SEN, in the case of an ON cell, is discharged. In the case of an OFF cell, the voltage of the node SEN is scarcely lowered.

During the period between time points t12 and t13, a strobe operation corresponding to the layer L1 is executed. More specifically, the sequencer 15 sets the signal STB1 corresponding to the layer L1 to the voltage VSTB. Thus, the transistor Tr7 is turned to the ON state in the sense amplifier unit SAU corresponding to the layer L1. As a result, when the transistor Tr6 is in the OFF state, or in other words in the case of an ON cell, the voltage of the bus LBUS is set to the "H" level. In contrast, when the transistor Tr6 is in the ON state, or in other words in the case of an OFF cell, the voltage of the bus LBUS is set to the "L" level.

During the period between time points t13 and t14, if the bus LBUS is at "H" level, data "1" is entered into the latch circuit SDL in the same manner as in the period between time points t7 and t8. That is, of the memory cell transistors MC corresponding to the layers L1 and L2, any bit lines BL that correspond to the memory cell transistors MC determined to be ON cells are coupled to the node SRCGND. At time point t13, the row decoder module 20 applies a read voltage VA0 to the selected word line WL.

During a period between time points t14 and t20, the sequencer 15 executes a read operation AR corresponding to the layer L0. More specifically, during the period between time points t14 and t15, the sequencer 15 sets the signal HLL to the voltage VHLL in the same manner as in the period between time points t2 and t3 and the period between time points t8 and t9. Here, with the transistor Tr0 turned to the OFF state in the sense circuit SA corresponding to the latch circuit SDL holding data "1", the voltage VDD is not applied to the node SEN (i.e., the node SEN is not pre-charged).

More specifically, during the period between time points t16 and t17, the sequencer 15 sets the signal XXL to the voltage VXXL in the same manner as in the period between time points t4 and t5 and the period between time points t10 and t11. The node SEN is discharged in the case of an ON cell. In the case of an OFF cell, the voltage of the node SEN is scarcely lowered.

During the period between time points t18 and t19, a strobe operation corresponding to the layer L0 is executed. More specifically, the sequencer 15 sets the signal STB0 corresponding to the layer L0 to the voltage VSTB. Thus, the transistor Tr7 is turned to the ON state in the sense amplifier unit SAU corresponding to the layer L0. As a result, when the transistor Tr6 is in the OFF state, or in other words in the case of an ON cell, the voltage of the bus LBUS is set to the "H" level. In contrast, when the transistor Tr6 is in the ON state, or in other words in the case of an OFF cell, the voltage of the bus LBUS is set to the "L" level.

During the period between time points t19 and t20, if the bus LBUS is at "H" level, data "1" is entered into the latch circuit SDL in the same manner as in the period between time points t7 and t8 and the period between time points t13 and t14. That is, of the memory cell transistors MC corresponding to the layers L0 to L2, any bit lines BL that correspond to the memory cell transistors MC determined to be ON cells are coupled to the node SRCGND.

Figure 20:
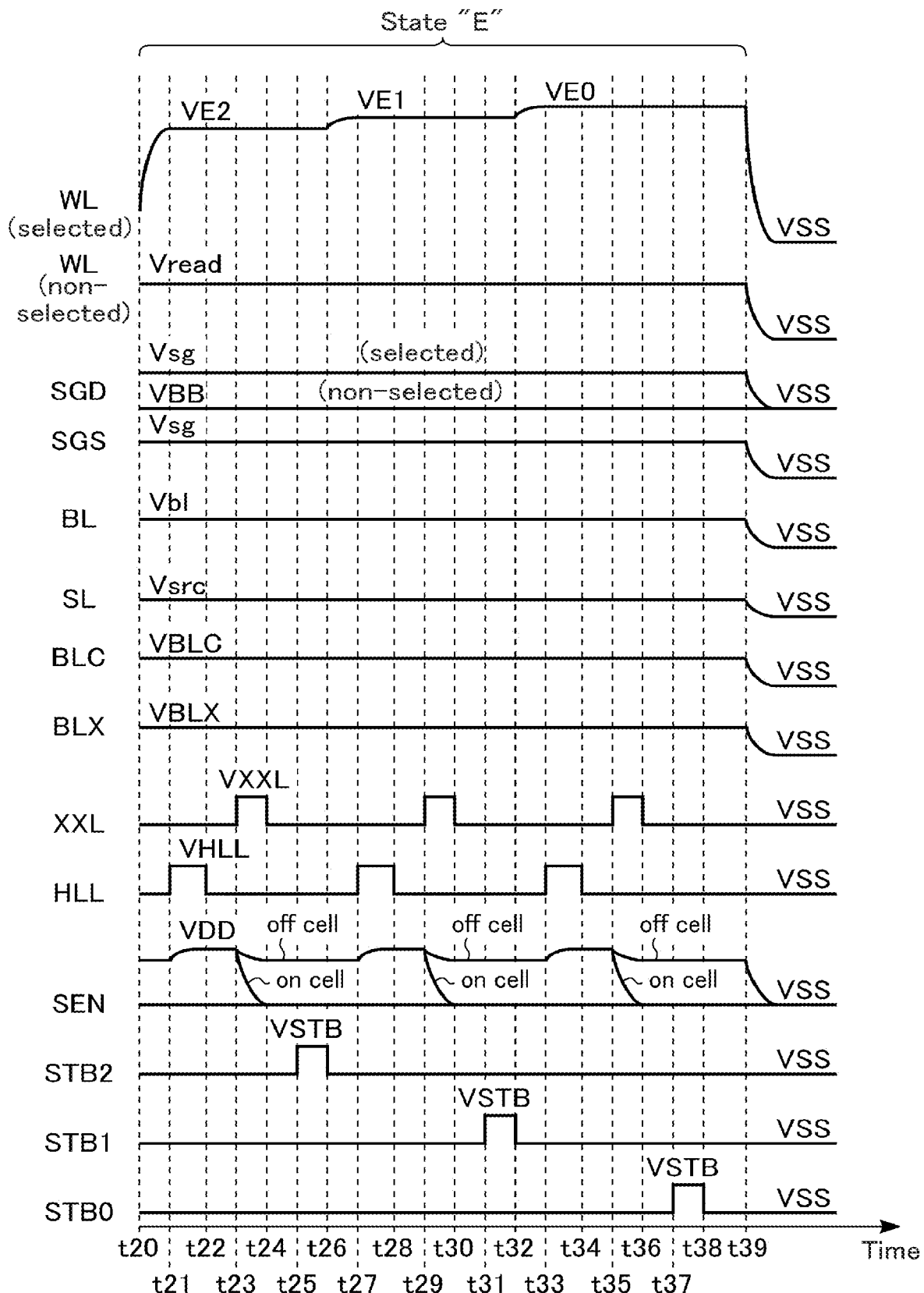

As illustrated in FIG. 20, at time point t20, the row decoder module 20 applies a read voltage VE2 to the selected word line WL.

During a period between time points t21 and t27, the sequencer 15 executes a read operation ER upon the layer L2 in the same procedure as that of time points t2 to t8.

At time point t26, the row decoder module 20 applies the read voltage VE1 to the selected word line WL.

During the period between time points t27 and t33, the sequencer 15 executes the read operation ER upon the layer L1 in the same procedure as that of time points t8 to t14.

At time point t32, the row decoder module 20 applies the read voltage VE0 to the selected word line WL.

During the period between time points t33 and t39, the sequencer 15 executes the read operation ER upon the layer L0 in the same procedure as that of time points t14 to t20.

At time point t39, a refresh operation is executed, through which the voltage VSS is applied to individual interconnects. Furthermore, the read-out data held in the latch circuit SDL is transferred to the latch circuit XDL.

1.5. Effects of Present Embodiment

With the configuration of the present embodiment, a memory system that can enhance reliability is offered. The effect of the embodiment will be described in detail below.

When the sizes (gate lengths, gate widths, etc.) of the memory cell transistors MC included in one cell unit CU differ among the layers L, the threshold voltage distribution may differ depending on the size. If the read operation is executed in the same conditions upon the memory cell transistors MC for which the threshold voltage distribution differs among the layers L, the possibility of errors in the read operation increases. With the increase in the number of error bits due to the erroneous reading, the errors cannot be corrected through the ECC processing, which lowers the reliability of the data.

In contrast, with the configuration of the present embodiment, different read conditions can be applied to different layers L. More specifically, a read voltage that differs in accordance with the layers L may be set, and a read operation may be executed at a time period that differs in accordance with the layers L. With such a configuration, a read condition suitable for the threshold voltage distribution of each layer L can be adopted, which suppresses erroneous reading. The reliability of the memory system can be thereby enhanced.

2. Second Embodiment

The second embodiment will be explained. According to the second embodiment, a memory 100 holding a parameter table for read voltages will be described. The following explanation will mainly focus on the points that differ from the first embodiment.

2.1 Overall Flow of Read Operation

The overall flow of a read operation will be explained with reference to FIG. 21, which provides a flowchart of the read operation. In the present embodiment, a parameter table of read voltages stored in the internal register of the sequencer 15 will be discussed.

Figure 21:
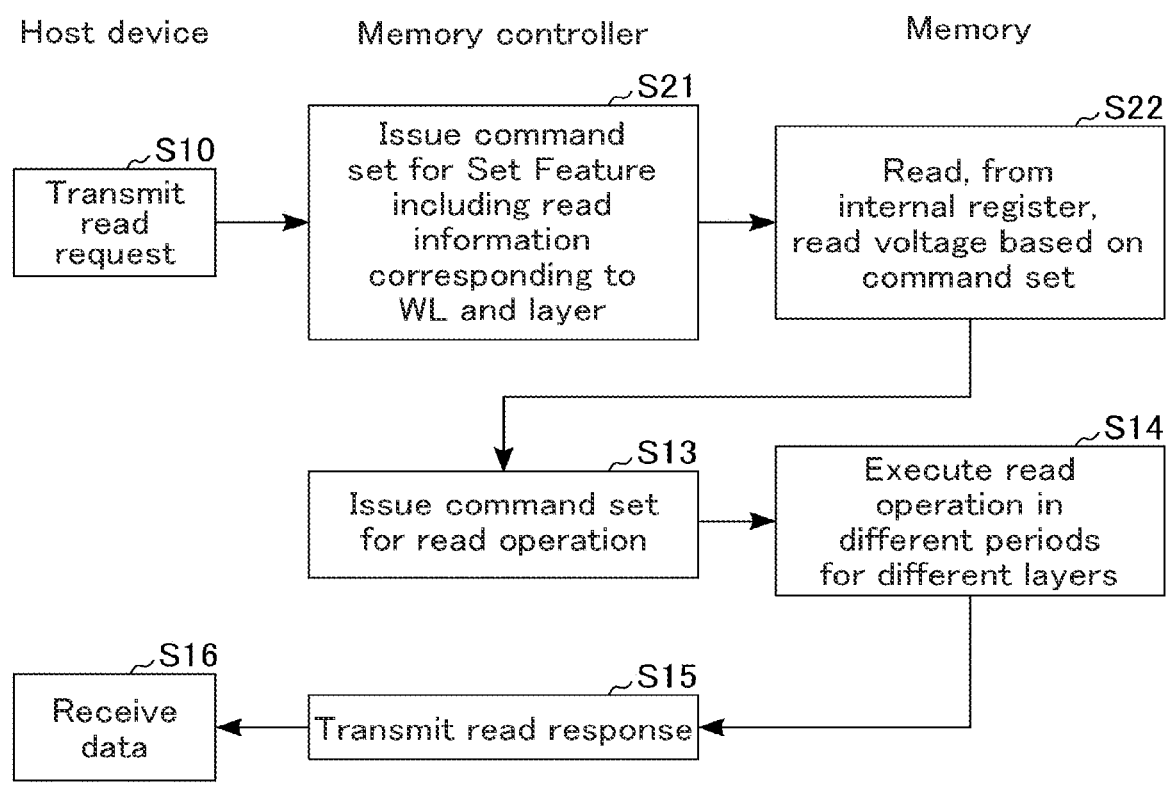
FIG. 21 is a flowchart of a read operation in the memory system according to a second embodiment.

As illustrated in FIG. 21, first, the host device 2 transmits a read request to the memory system 1 (step S10).

Upon receipt of a read request from the host device 2, the CPU 230 issues a command set for a Set Feature operation that includes read information corresponding to the selected word line WL and layer L used for the read voltage setting (step S21), and transmits the command set to the memory 100.

Upon receipt of the command set for the Set Feature, the sequencer 15 reads a read voltage from the internal register based on the command set for the Set Feature (step S22).

When the setting of parameters is completed, the CPU 230 issues a command set for a read operation (step S13), and transmits it to the memory 100.

Upon receipt of the command set for a read operation, the sequencer 15 executes read operations in different states at different periods in accordance with the respective layers L (step S14). When the read operations are completed, the sequencer 15 transmits the read-out data to the memory controller 200.

After executing ECC processing upon the read-out data received from the memory 100, the CPU 230 transmits the error-corrected read-out data to the host device 2, as a read response to the read request (step S15).

The host device 2 receives the data (step S16), and the read operation is terminated.

2.2 Effects of Present Embodiment

With the structure according to the present embodiment, the same effects as the first embodiment can be achieved.

3. Third Embodiment

The third embodiment will be explained. According to the third embodiment, the time points for starting a strobe operation (hereinafter referred to as "trigger start timings" or "sense timings") that differ among the layers L in a read operation will be described. The following explanation will mainly focus on the points that differ from the first and second embodiments.

3.1 Layers and Trigger Start Timings

First, the relationship between the layers L and trigger start timings will be explained with reference to FIG. 22, which provides a timing chart for the voltages of the node SEN and signals STB0 to STB2 in a read operation AR.

Figure 22:
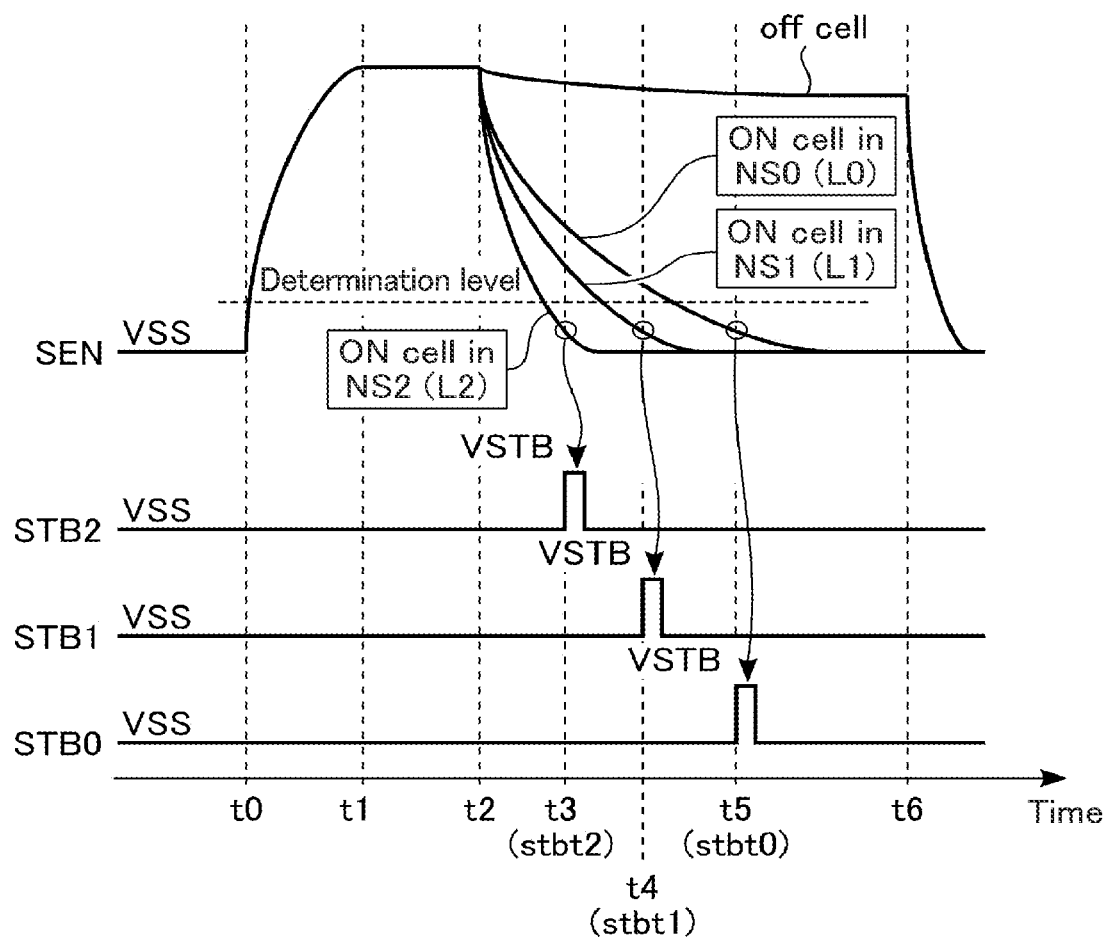
FIG. 22 is a timing chart of voltages of a node SEN and signals STB0 to STB2 during a read operation in the semiconductor memory device of the memory system according to a third embodiment.

As illustrated in FIG. 22, during a period between time points t0 and t1, the signal HLL is turned to the "H" level, and the node SEN is pre-charged. In this condition, during the period between time points t2 and t6, if the signal XXL is at "H" level, the node SEN is discharged in accordance with the threshold voltage of the corresponding memory cell transistor MC. The threshold voltages of the memory cell transistors MC corresponding to the layers L0 to L2 will be referred to as "VtL0" to "VtL2", respectively. The threshold voltages VtL0 to VtL2 and read voltage VA satisfy the relationship VA>VtL0>VtL1>VtL2. In this case, because of the threshold voltage VtL2 being sufficiently lower than the read voltage VA, the memory cell transistor MC corresponding to the layer L2 is turned to a relatively highly intensified ON state, and the node SEN is discharged at a relatively high rate. The threshold voltage VtL1 is the lowest after the threshold voltage VtL2, and therefore the node SEN corresponding to the layer L1 is discharged at the second highest rate after the node SEN corresponding to the layer L2. With the threshold voltage VtL0 being slightly lower than the read voltage VA, the memory cell transistor MC corresponding to the layer L0 is turned to a relatively weak ON state, and the node SEN is discharged at a relatively low rate.

By changing the trigger start timings for the layers L in accordance with the discharge rate, the memory cell transistors MC of different layers L can be suitably dealt with in a single read operation.

More specifically, at time point t3, the sequencer 15 may set the signal STB2 to the voltage VSTB ("H" level). That is, the sequencer 15 sets the time point t3 to be the trigger start timing stbt2 for the layer L2 to execute a strobe operation. Here, the voltage of the node SEN corresponding to the ON cell of the layer L2 is lower than a determination level. In this manner, the data is read out in the sense amplifier unit SAU corresponding to the layer L2.

At time point t4, the sequencer 15 may set the signal STB1 to the voltage VSTB ("H" level). That is, the sequencer 15 sets the time point t4 to be the trigger start timing stbt1 corresponding to the layer L1 to execute a strobe operation. Here, the voltage of the node SEN corresponding to the ON cell of the layer L1 is lower than the determination level. In this manner, data is read out in the sense amplifier unit SAU corresponding to the layer L1.

At time point t5, the sequencer 15 may set the signal STB0 to the voltage VSTB ("H" level). That is, the sequencer 15 sets the time point t5 to be the trigger start timing stbt0 corresponding to the layer L0 to execute a strobe operation. Here, the voltage of the node SEN corresponding to the ON cell of the layer L0 is lower than the determination level. In this manner, data is read out in the sense amplifier unit SAU corresponding to the layer La.

3.2 Overall Flow of Read Operation

Next, the overall flow of a read operation will be explained with reference to FIG. 23, which provides a flowchart of the read operation.

Figure 23:
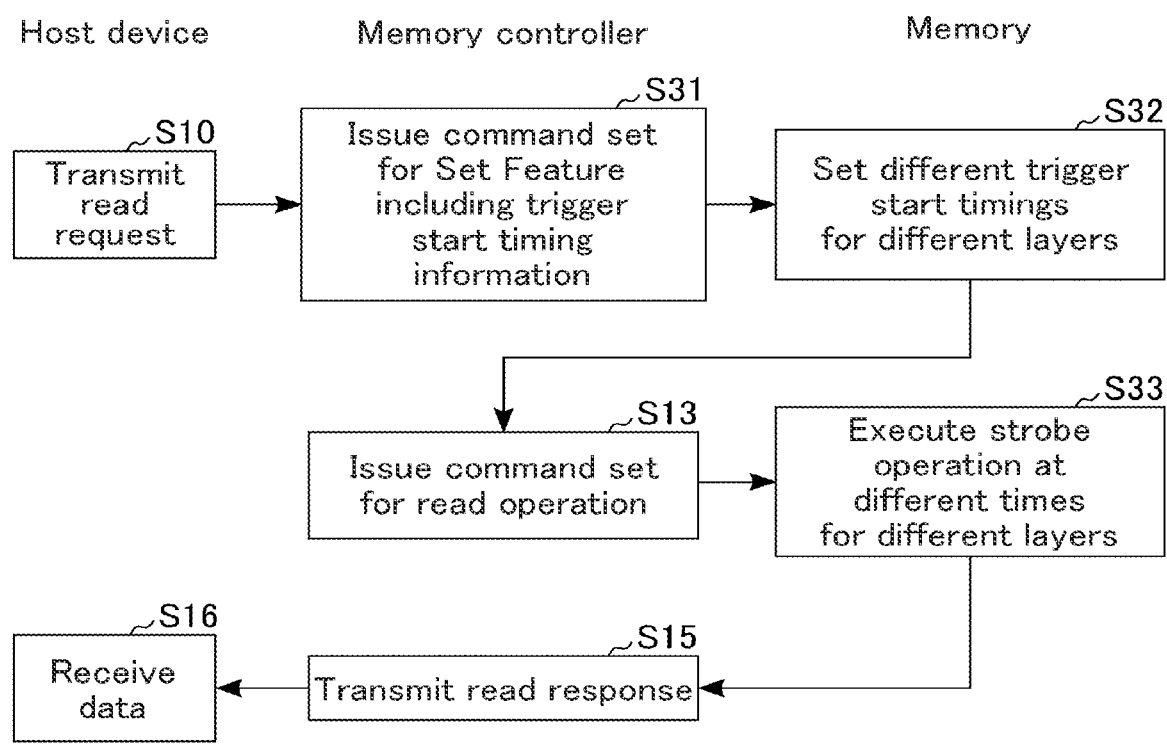
FIG. 23 is a flowchart of the read operation in the memory system according to the third embodiment.

As illustrated in FIG. 23, first, the host device 2 transmits a read request to the memory system 1 (step S10).

Upon receipt of a read request from the host device 2, the CPU 230 issues a command set for the Set Feature that includes the trigger start timing information of the corresponding layer L (step S31), and transmits the command set to the memory 100.

Upon receipt of the command set for the Set Feature, the sequencer 15 sets different trigger start timings (stbt0 to stbt2) for respective layers L (step S32).

When the setting of parameters is completed, the CPU 230 issues a command set for a read operation (step S13), and transmits it to the memory 100.

Upon receipt of the command set for the read operation, the sequencer 15 executes a read operation, in which a strobe operation is started at different trigger start timings for different layers L (step S33). When the read operation is completed, the sequencer 15 transmits the read-out data to the memory controller 200.

After executing ECC processing upon the read-out data received from the memory 100, the CPU 230 transmits the error-corrected read-out data to the host device 2, as a read response to the read request (step S15).

The host device 2 receives the data (step S16), and the read operation is terminated.

3.3 Command Sequences for Set Feature and Read Operation

Exemplary command sequences for the Set Feature and read operation will be explained with reference to FIG. 24, which shows a command sequence for the Set Feature and for the read operation. In the example of FIG. 24, signals CEn, CLE, ALE, and WEn, and signal REn are omitted for the sake of simplicity. The signals DQ and ready/busy signals RBn are illustrated. In a signal DQ, a command is placed in an oval frame, an address is placed in a square frame, and data is placed in a hexagonal frame.

As illustrated in FIG. 24, the CPU 230 transmits to the memory 100 a command set for the Set Feature in order to set parameters for a trigger start timing in the memory 100. More specifically, the CPU 230 first issues a command "EFh" and transmits it to the memory 100.

Then, the CPU 230 issues an address "10h" to designate the trigger start timing setting, and transmits the address to the memory 100.

Thereafter, the CPU 230 transmits to the memory 100 the data (stbt0 to stbt2) that designates the trigger start timing for each layer L.

Upon receipt of the command set for the Set Feature, the sequencer 15 sets the ready/busy signal RBn to the "L" level to set the parameters. After setting the parameters, the sequencer 15 sets the ready/busy signal RBn to the "H" level. The command set for the read operation is the same as that in the first embodiment as illustrated in FIG. 17.

3.4 Address Table for Set Feature

The address and data attached to a command set for the Set Feature will be explained with reference to FIG. 25, which provides an address table for the Set Feature.

As illustrated in FIG. 25, after issuing the address "10h" that designates the trigger start timing setting, the CPU 230 sequentially designates data "stbt0", "stbt1" and "stbt2" corresponding to the layers L0 to L2, respectively.

The number of effective data items may be freely determined in accordance with the number of layers.

Furthermore, the data according to the present embodiment has been discussed as a trigger start timing attached to a command set, but this is not a limitation. The difference between a default trigger start timing and an start timing set value for each layer L may be attached to a command set. If the memory 100 holds a parameter table for trigger start timings, the data may be address data for designating the corresponding layer L.

3.5 Voltages of Interconnects in Read Operation

An example of voltages of the interconnects in an exemplary read operation will be described with reference to FIG. 26, which provides a timing chart indicating the voltages of the interconnects in a read operation of a lower page.

Figure 26:
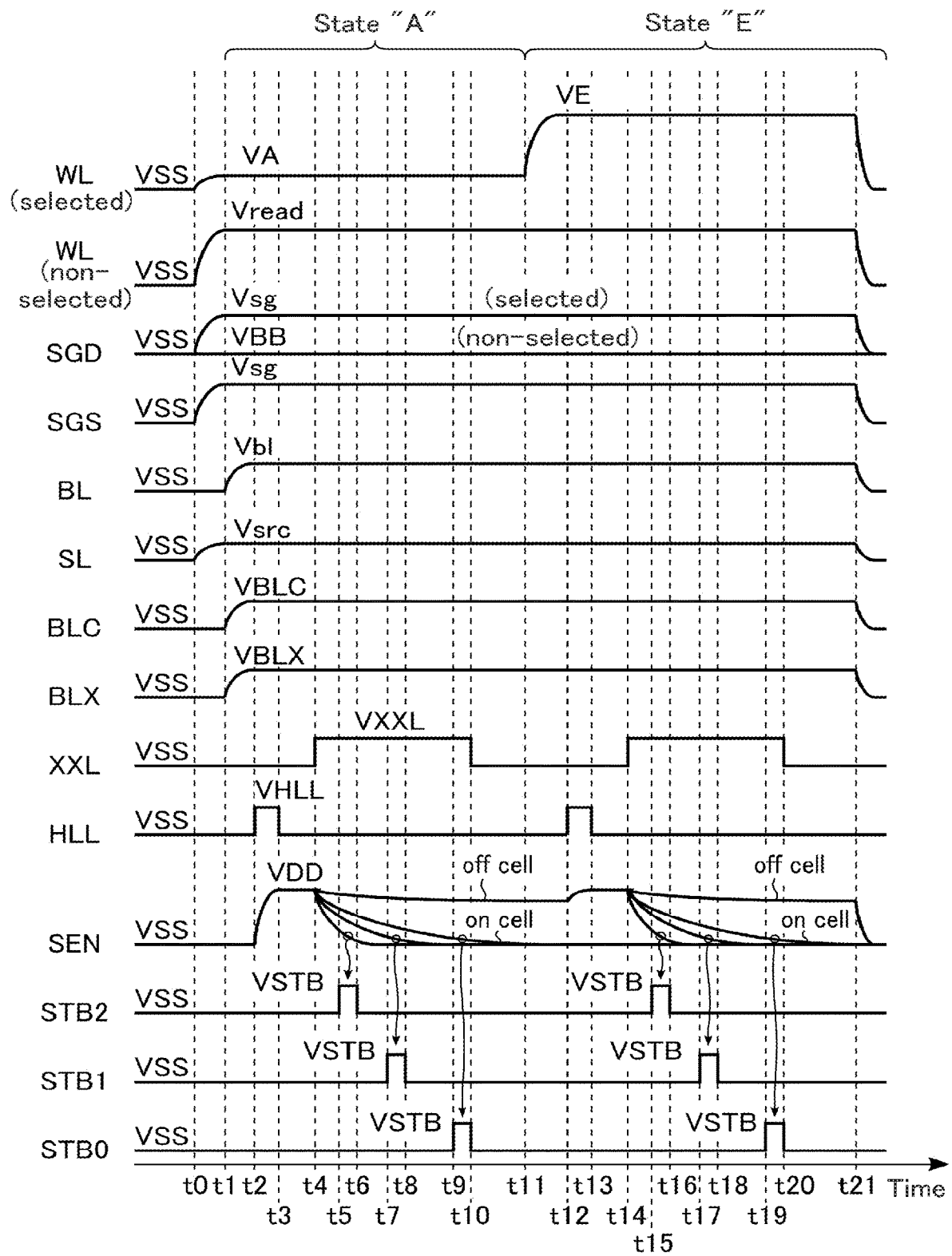
FIG. 26 is a timing chart of voltages of individual interconnects during a read operation in the semiconductor memory device of the memory system according to the third embodiment.

As illustrated in FIG. 26, at time point t0, the row decoder module 20 applies a read voltage VA to the selected word line WL, and a voltage Vread to the non-selected word lines WL. The row decoder module 20 further applies a voltage Vsg to the select gate line SGD corresponding to a selected string unit SU, and applies a negative voltage VBB to the select gate lines SGD corresponding to the non-selected string units SU. The row decoder module 20 also applies a voltage Vsg to the select gate line SGS. A voltage Vsrc is applied to the source line SL.

During a period between time points t1 and t11, the sequencer 15 executes a read operation AR. More specifically, at time point t1, the sense circuit SA of the sense amplifier unit SAU sets the node INV_S to the "L" level, and the transistor Tr0 to the ON state. The sequencer 15 sets the signal BLX to a voltage VBLX, and the signal BLC to a voltage VBLC. As a result, the transistors Tr1 and Tr4 are turned to the ON state. The sense amplifier unit SAU thereby applies the voltage Vbl to the corresponding bit line BL.

During the period between time points t2 and t3, the sequencer 15 sets the signal HLL to the voltage VHLL. As a result, the transistor Tr2 is turned to the ON state, and the node SEN is pre-charged to the voltage VDD.

During a period between time points t4 and t10, the sequencer 15 sets the signal XXL to a voltage VXXL. The node SEN corresponding to the ON cell is discharged during this period.

Under this condition, the sequencer 15 sets the signal STB2 corresponding to the layer L2 to the voltage VSTB during the period between time points t5 and t6. The time point t5 corresponds to the trigger start timing stbt2. In this manner, a strobe operation is executed in the sense amplifier unit SAU corresponding to the layer L2.

The sequencer 15 sets the signal STB1 corresponding to the layer Lb to the voltage VSTB during the period between time points t7 and t8. The time point t7 corresponds to the trigger start timing stbt1. In this manner, a strobe operation is executed in the sense amplifier unit SAU corresponding to the layer Lb.

The sequencer 15 sets the signal STB0 corresponding to the layer L0 to the voltage VSTB during the period between time points t9 and t10. The time point t9 corresponds to the trigger start timing stbt0. In this manner, a strobe operation is executed in the sense amplifier unit SAU corresponding to the layer La.

As a result of the above strobe operations, the voltage of the bus LBUS is set to the "H" level in the sense amplifier unit SAU corresponding to the ON cell. On the other hand, the voltage of the bus LBUS is set to the "L" level in the sense amplifier unit SAU corresponding to the OFF cell.

During a period between time points t10 and t11, if the bus LBUS is at "H" level, data "1" is entered into the latch circuit SDL.

At time point t11, the row decoder module 20 applies the read voltage VE to the selected word line WL.

During a period between time points t12 and t21, the sequencer 15 executes a read operation ER in the same procedure as that of time points t2 to t11. More specifically, during the period between time points t12 and t13, the sequencer 15 sets the signal HLL to the voltage VHLL in a manner similar to the period between time points t2 and t3. Here, the transistor Tr0 is turned OFF in the sense circuit SA corresponding to the latch circuit SDL holding data "1", and the voltage VDD is therefore not applied to the node SEN (i.e., the node SEN is not pre-charged).

During a period between time points t14 and t20, the sequencer 15 sets the signal XXL to a voltage VXXL, in the same manner as in the period between time points t4 and t10. The node SEN corresponding to the ON cell is discharged during this period.

Under this condition, the sequencer 15 sets the signal STB2 corresponding to the layer L2 to the voltage VSTB during the period between time points t15 and t16, in the same manner as in the period between time points t5 and t6. The time point t15 corresponds to the trigger start timing stbt2 of the state "E". In this manner, a strobe operation is executed in the sense amplifier unit SAU corresponding to the layer L2.

The sequencer 15 sets the signal STB1 corresponding to the layer L1 to the voltage VSTB during the period between time points t17 and t18, in the same manner as in the period between time points t7 and t8. The time point t17 corresponds to the trigger start timing stbt1 of the state "E". In this manner, a strobe operation is executed in the sense amplifier unit SAU corresponding to the layer L1.

The sequencer 15 sets the signal STB0 corresponding to the layer L0 to the voltage VSTB during the period between time points t19 and t20, in the same manner as in the period between time points t9 and t10. The time point t19 corresponds to the trigger start timing stbt0 of the state "E". In this manner, a strobe operation is executed in the sense amplifier unit SAU corresponding to the layer L0.

As a result of the above strobe operations, the voltage of the bus LBUS is set to the "H" level in the sense amplifier unit SAU corresponding to the ON cell. On the other hand, the voltage of the bus LBUS is set to the "L" level in the sense amplifier unit SAU corresponding to the OFF cell.

During a period between time points t20 and t21, if the bus LBUS is at "H" level, data "1" is entered into the latch circuit SDL.

At time point t21, a refresh operation is executed, through which the voltage VSS is applied to individual interconnects. Furthermore, the read-out data held in the latch circuit SDL is transferred to the latch circuit XDL.

3.6 Effects of Present Embodiment

With the configuration according to the present embodiment, the same effects as in the first embodiment can be achieved.

In addition, with the configuration according to the present embodiment, different trigger start timings can be set for different layers L in one read operation. As a result, the read-out time period, which tends to increase by adopting different read conditions for respective layers L, can be suppressed from increasing.

4. Fourth Embodiment

The fourth embodiment will be explained. In the description of the fourth embodiment, different voltages of bit lines BL (which hereinafter may be referred to as "bit line voltages") are adopted for different layers L. The following explanation will mainly focus on the points that differ from the first to third embodiments.

4.1 Structure of Data Register and Sense Amplifier Module

First, an exemplary structure of the data register 22 and sense amplifier module 21 will be explained with reference to FIG. 27, which provides a block diagram of the data register 22 and sense amplifier module 21.

As illustrated in FIG. 27, the structure of the sense amplifier module 21 and data register 22 is the same as that of the first embodiment as illustrated in FIG. 10.

According to the present embodiment, the sequencer 15 generates signals BLC0 to BLC2 corresponding to the layers L0 to L2, respectively, and transmits these signals to the sense amplifier units SAU. The sequencer 15 may transmit a signal BLC0 to the sense amplifier unit SAU0 corresponding to the bit line BL0 and to the sense amplifier unit SAU3 corresponding to the bit line BL3. The sequencer 15 may transmit a signal BLC1 to the sense amplifier unit SAU1 corresponding to the bit line BL1 and to the sense amplifier unit SAU4 corresponding to the bit line BL4. The sequencer 15 may further transmit a signal BLC2 to the sense amplifier unit SAU2 corresponding to the bit line BL2 and to the sense amplifier unit SAU5 corresponding to the bit line BL5.

4.2 Relationship Between Layer and Voltage of Bit Line

Next, the relationship between the layer L and the voltage of the bit line BL will be explained with reference to FIG. 28, which provides a timing chart showing the voltages of the bit line BL, signals BLC, and signal STB in a read operation of one state.

As illustrated in FIG. 28, during a period between time points t0 and t2, the sequencer 15 may apply voltages VBLC0 to VBLC2 to the signals BLC0 to BLC2, respectively. As a result, a voltage Vbl0 is applied to the bit line BL corresponding to the layer L0; a voltage Vbl1 is applied to the bit line BL corresponding to the layer L1; and a voltage Vbl2 is applied to the bit line BL corresponding to the layer L2. For example, when the memory cell transistor MC of the layer L2 has the lowest threshold voltage, the memory cell transistor MC of the layer L1 has the second lowest threshold voltage, and the memory cell transistor MC of the layer L0 has the highest threshold voltage, the voltages VBLC0 to VBLC2 satisfy the relationship of VBLC0>VBLC1>VBLC2. Thus, the voltages Vbl0 to Vbl2 of the bit lines BL satisfy the relationship of Vbl0>Vbl1>Vbl2. As the voltage of a bit line BL increases, the cell current increases. With the discharge rate of the node SEN increased, the threshold voltage of the corresponding memory cell transistor MC appears to be lowered. According to the present embodiment, the shifted threshold voltage distribution is corrected by the voltages of the bit lines BL.

In the above situation, the sequencer 15 applies the voltage VSTB to the signal STB so that the signal STB may be set to the "H" level at time point t1, and a strobe operation thus executed in a batch upon the sense amplifier units SAU corresponding to the layers L0 to L2.

4.3 Overall Flow of Read Operation

Next, the overall flow of a read operation will be explained with reference to FIG. 29. FIG. 29 shows a flowchart of the read operation.

As illustrated in FIG. 29, first, the host device 2 transmits a read request to the memory system 1 (step S10).

Upon receipt of a read request from the host device 2, the CPU 230 issues a command set for the Set Feature that includes the voltage information of the signal BLC for the corresponding layer L (step S41), and transmits the command set to the memory 100. Hereinafter, the voltage of the signal BLC may be referred to as a "BLC voltage".

Upon receipt of the command set for the Set Feature, the sequencer 15 sets different BLC voltages (VBLC0 to VBLC2) for different layers L (step S42).

When the setting of parameters is completed, the CPU 230 issues a command set for a read operation (step S13), and transmits it to the memory 100.

Upon receipt of the command set for the read operation, the sequencer 15 executes the read operation at a BLC voltage that differs among the layers L, or in other words at the voltage of the bit line BL (which hereinafter may be referred as "BL voltage") that differs among the layers L (step S43). When the read operation is completed, the sequencer 15 transmits the read-out data to the memory controller 200.

After executing the ECC processing upon the read-out data received from the memory 100, the CPU 230 transmits the error-corrected read-out data to the host device 2, as a read response to the read request (step S15).

The host device 2 receives the data (step S16), and the read operation is terminated.

4.4 Command Sequences for Set Feature and Read Operation

Figure 30:
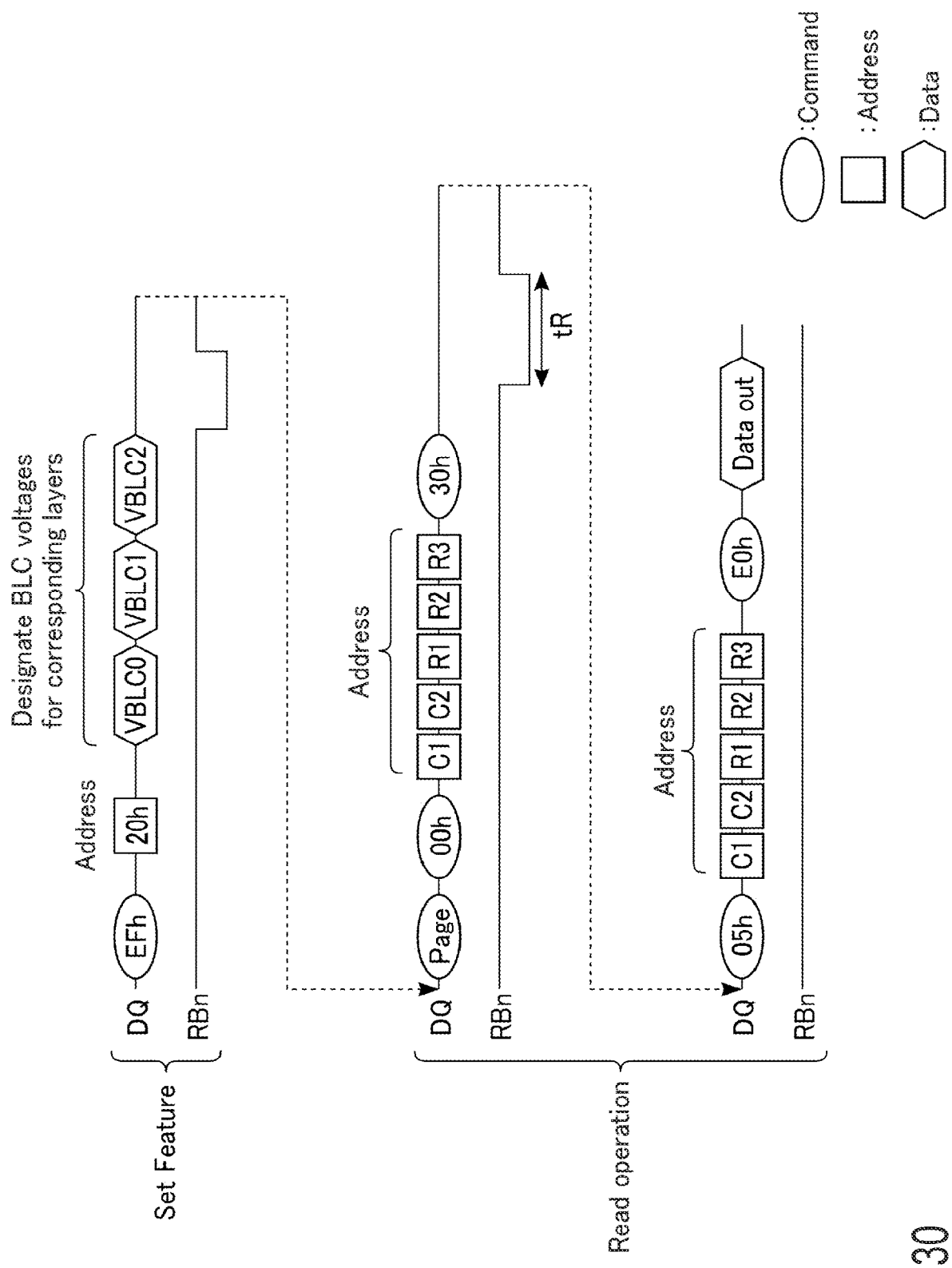
FIG. 30 shows a command sequence of a Set Feature operation and read operation in the memory system according to the fourth embodiment.

Exemplary command sequences for the Set Feature and read operation will be explained with reference to FIG. 30, which shows a command sequence for the Set Feature and for the read operation. In the example of FIG. 30, signals CEn, CLE, ALE, WEn, and signal REn are omitted for the sake of simplicity. The signals DQ and ready/busy signals RBn are illustrated. In a signal DQ, a command is placed in an oval frame, an address is placed in a square frame, and data is placed in a hexagonal frame.

As illustrated in FIG. 30, the CPU 230 transmits to the memory 100 a command set for the Set Feature in order to set the parameters for the BLC voltage in the memory 100. More specifically, the CPU 230 first issues a command "EFh" and transmits it to the memory 100.

Then, the CPU 230 issues an address "20h" to designate the BLC voltage setting, and transmits the address to the memory 100.

Thereafter, the CPU 230 transmits to the memory 100 the data (VBLC0 to VBLC2) that designates the BLC voltage for each layer L.

Upon receipt of the command set for the Set Feature, the sequencer 15 sets the ready/busy signal RBn to the "L" level to set the parameters. After setting the parameters, the sequencer 15 sets the ready/busy signal RBn to the "H" level. The command set for the read operation is the same as that in the first embodiment as illustrated in FIG. 17.

4.5 Address Table for Set Feature

The address and data attached to a command set for the Set Feature will be explained with reference to FIG. 31, which provides an address table for the Set Feature.

As illustrated in FIG. 31, after issuing the address "20h" that designates the BLC voltage setting, the CPU 230 sequentially designates data "VBLC0", "VBLC1" and "VBLC2" corresponding to the layers L0 to L2, respectively.

The number of effective data items may be freely determined in accordance with the number of layers.

Furthermore, the data according to the present embodiment has been discussed as a BLC voltage attached to a command set, but this is not a limitation. The difference between a default BLC voltage and the BLC voltage for each layer L may be attached to a command set. If the memory 100 holds a parameter table for the BLC voltages, the data may take the form of address data for designating the corresponding layer L.

4.6 Voltages of Interconnects in Read Operation

Voltages of the interconnects in an exemplary read operation will be described with reference to FIG. 32, which shows a timing chart indicating the voltages of the interconnects in a read operation of a lower page.

Figure 32:
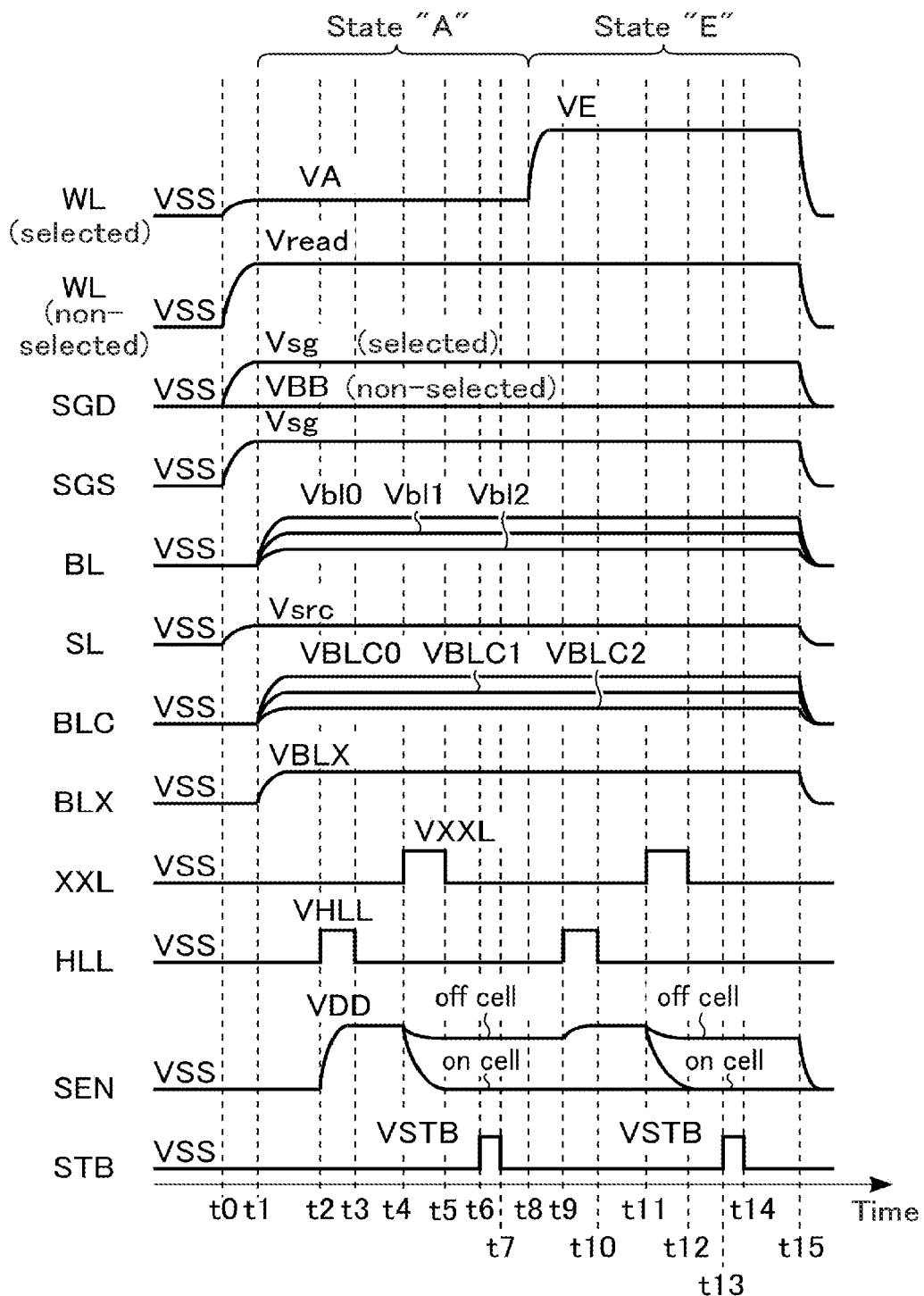
FIG. 32 is a timing chart of voltages of individual interconnects during a read operation in the semiconductor memory device of the memory system according to the fourth embodiment.

As illustrated in FIG. 32, at time point t0, the row decoder module 20 applies a read voltage VA to the selected word line WL, and a voltage Vread to the non-selected word lines WL. The row decoder module 20 further applies a voltage Vsg to the select gate line SGD corresponding to a selected string unit SU, and applies a negative voltage VBB to the select gate line SGD corresponding to the non-selected string units SU. The row decoder module 20 also applies a voltage Vsg to the select gate line SGS. A voltage Vsrc is applied to the source line SL.

During a period between time points t1 and t8, the sequencer 15 executes a read operation AR. More specifically, at time point t1, the sense circuit SA of the sense amplifier unit SAU sets the node INV_S to the "L" level, and the transistor Tr0 to the ON state. The sequencer 15 sets the signal BLX to the voltage VBLX. The sequencer 15 further sets the signals BLC0 to BLC2 to voltages VBLC0 to VBLC2, respectively. In this manner, the transistors Tr1 and Tr4 are turned ON. As a result, voltages Vbl0 to Vbl2 are applied to the bit lines BL corresponding to the layers L0 to L2, respectively.

During the period between time points t2 and t3, the sequencer 15 sets the signal HLL to the voltage VHLL. As a result, the transistor Tr2 is turned ON, and the node SEN is pre-charged to the voltage VDD.

During the period between time points t4 and t5, the sequencer 15 sets the signal XXL to a voltage VXXL. The node SEN corresponding to the ON cell is thereby discharged.

During the period between time points t6 and t7, the sequencer 15 sets the signal STB to a voltage VSTB. In this manner, a strobe operation is executed in the sense amplifier units SAU corresponding to the layers L0 to L2.

As a result of the strobe operation, the voltage of the bus LBUS is set to the "H" level in the sense amplifier unit SAU corresponding to an ON cell. On the other hand, the voltage of the bus LBUS is set to the "L" level in the sense amplifier unit SAU corresponding to the OFF cell.

During a period between time points t7 and t8, if the bus LBUS is at "H" level, data "1" is entered into the latch circuit SDL.

At time point t8, the row decoder module 20 applies the read voltage VE to the selected word line WL.

During a period between time points t9 and t15, the sequencer 15 executes a read operation ER in the same procedure as that of time points t2 to t8. More specifically, during a period between time points t9 and t10, the sequencer 15 sets the signal HLL to the voltage VHLL in a manner similar to the period between time points t2 and t3. Here, the transistor Tr0 is turned OFF in the sense circuit SA corresponding to the latch circuit SDL holding data "1", and therefore the voltage VDD is not applied to the node SEN (i.e., is not pre-charged).

During a period between time points t11 and t12, the sequencer 15 sets the signal XXL to a voltage VXXL, in the same manner as in the period between time points t4 and t5. The node SEN corresponding to the ON cell is discharged during this period.

During a period between time points t13 and t14, the sequencer 15 sets the signal STB to a voltage VSTB, in the same manner as in the period between time points t6 and t7. In this manner, a strobe operation is executed in the sense amplifier units SAU corresponding to the layers L0 to L2.

As a result of the strobe operation, the voltage of the bus LBUS is set to the "H" level in the sense amplifier unit SAU corresponding to an ON cell. On the other hand, the voltage of the bus LBUS is set to the "L" level in the sense amplifier unit SAU corresponding to the OFF cell.

During a period between time points t14 and t15, if the bus LBUS is at "H" level, data "1" is entered into the latch circuit SDL.

At time point t15, a refresh operation is executed, through which the voltage VSS is applied to the individual interconnects. Furthermore, the read-out data held in the latch circuit SDL is transferred to the latch circuit XDL.

4.7. Effects of Present Embodiment

With the configuration according to the present embodiment, the same effects as the first and third embodiments can be achieved.

5. Fifth Embodiment

The fifth embodiment will be explained. According to the fifth embodiment, the memory 100 holding the set values of the BLC voltages described in the fourth embodiment will be discussed. The following explanation will mainly focus on the points that differ from the fourth embodiment.

5.1 Overall Flow of Read Operation

Figure 33:
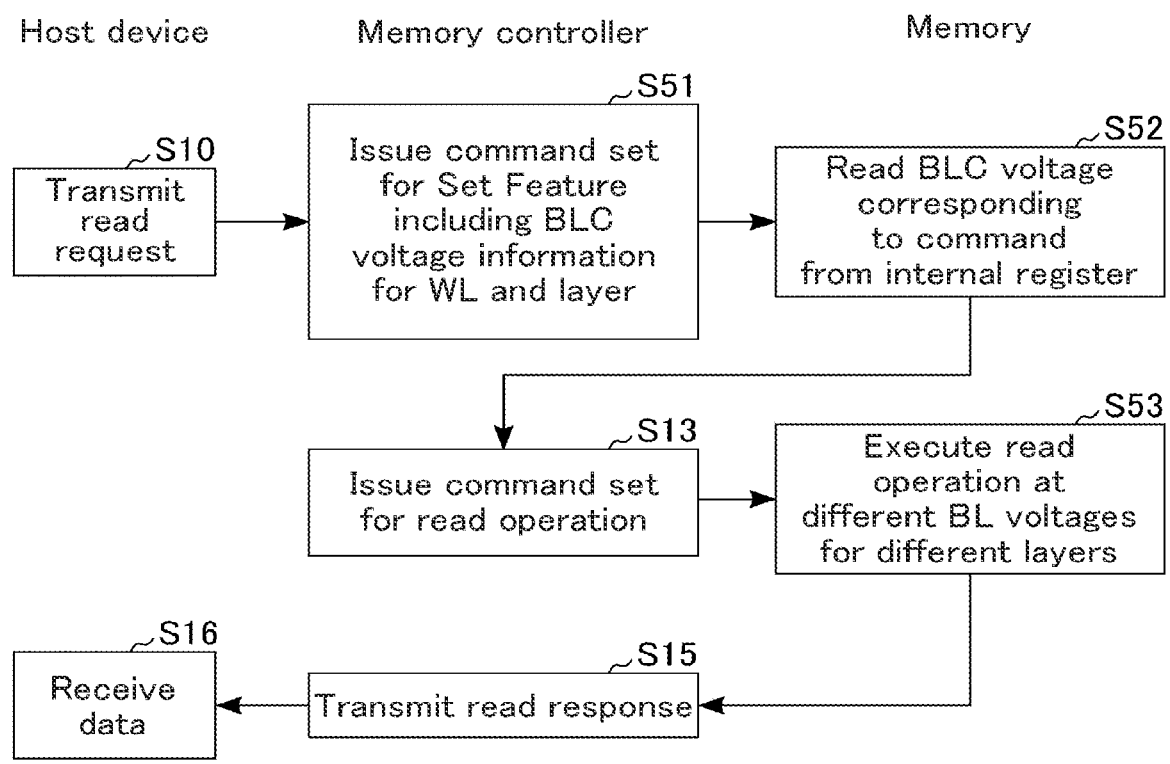
FIG. 33 is a flowchart of the read operation in the memory system according to a fifth embodiment.

The overall flow of a read operation will be explained with reference to FIG. 33, which shows a flowchart of the read operation. According to the present embodiment, a parameter table of BLC voltages is stored in the internal register of the sequencer 15.

First, the host device 2 transmits a read request to the memory system 1 (step S10).

Upon receipt of a read request from the host device 2, the CPU 230 issues a command set for the Set Feature that includes read information corresponding to the selected word line WL and layer L used for the BLC voltage setting (step S51), and transmits the command set to the memory 100.

Upon receipt of the command set for the Set Feature from the sequencer 15, a BLC voltage is read from the internal register based on the command set for the Set Feature (step S52).

When the setting of parameters is completed, the CPU 230 issues a command set for a read operation (step S13), and transmits it to the memory 100.

Upon receipt of the command set for the read operation, the sequencer 15 executes the read operation at a BLC voltage that differs in accordance with the layer L, or in other words at the BL voltage that differs in accordance with the layer L (step S53). When the read operation is completed, the sequencer 15 transmits the read-out data to the memory controller 200.

After executing the ECC processing upon the read-out data received from the memory 100, the CPU 230 transmits the error-corrected read-out data to the host device 2, as a read response to the read request (step S15).

The host device 2 receives the data (step S16), and the read operation is terminated.

5.2. Effects of Present Embodiment

With the configuration according to the present embodiment, the same effects as the fourth embodiment can be achieved.

6. Sixth Embodiment

The sixth embodiment will be described. In the sixth embodiment, the explanation will focus on a combination of the third and fourth embodiment. In other words, a trigger start timing and BLC voltage that differ in accordance with a layer L are adopted. The following explanation will mainly focus on the points that differ from the first to fifth embodiments.

6.1 Overall Flow of Read Operation

The overall flow of a read operation will be first explained with reference to FIG. 34, which shows a flowchart of the read operation.

As illustrated in FIG. 34, first, the host device 2 transmits a read request to the memory system 1 (step S10).

Upon receipt of a read request from the host device 2, the CPU 230 issues a command set for the Set Feature that includes the trigger start timing information of the corresponding layer L (step S31), and transmits the command set to the memory 100.

Upon receipt of the command set for the Set Feature, the sequencer 15 sets different trigger start timings (stbt0 to stbt2) for different layers L (step S32).

When the setting of parameters is completed, the CPU 230 issues a command set for the Set Feature that includes the BLC voltage information for the corresponding layer L (step S41), and transmits it to the memory 100.

Upon receipt of the command set for the Set Feature, the sequencer 15 sets different BLC voltages (VBLC0 to VBLC2) for different layers L (step S42).

When the setting of parameters is completed, the CPU 230 issues a command set for a read operation (step S13), and transmits it to the memory 100.

Upon receipt of the command set for the read operation, the sequencer 15 executes the read operation at a trigger start timing that differs in accordance with the layer L, and at a BL voltage that differs in accordance with the layer (step S61). When the read operation is completed, the sequencer 15 transmits the read-out data to the memory controller 200.

After executing the ECC processing upon the read-out data received from the memory 100, the CPU 230 transmits the error-corrected read-out data to the host device 2, as a read response to the read request (step S15).

The host device 2 receives the data (step S16), and the read operation is terminated.

6.2 Command Sequences for Set Feature and Read Operation

Figure 35:
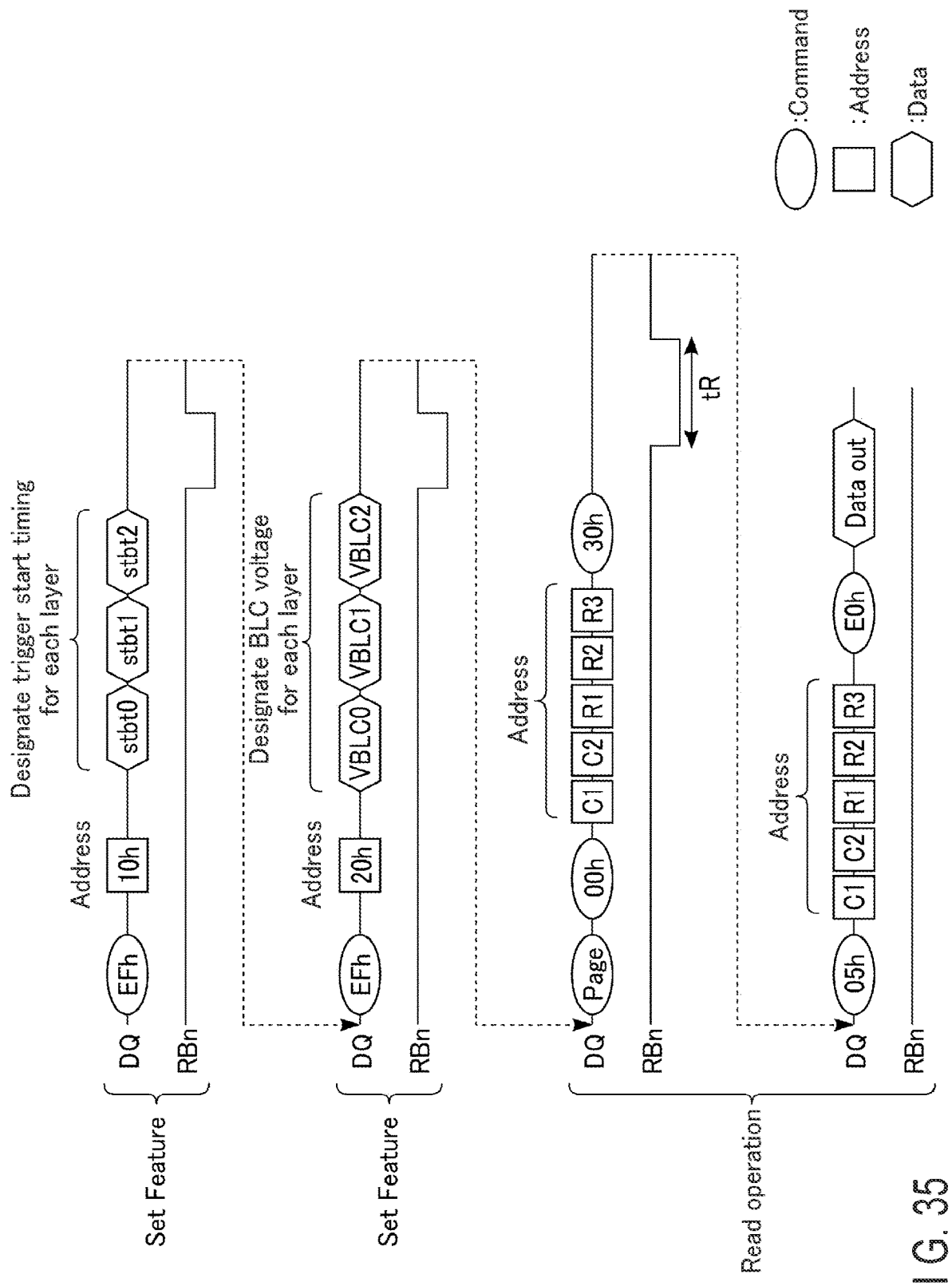
FIG. 35 shows a command sequence of a Set Feature operation and read operation in the memory system according to the sixth embodiment.

Exemplary command sequences for the Set Feature and read operation will be explained with reference to FIG. 35, which shows a command sequence for the Set Feature and for the read operation. In the example of FIG. 35, signals CEn, CLE, ALE, WEn, and signal REn are omitted for the sake of simplicity. The signals DQ and ready/busy signals RBn are illustrated. In a signal DQ, a command is placed in an oval frame, an address is placed in a square frame, and data is placed in a hexagonal frame.

As illustrated in FIG. 35, the CPU 230 transmits to the memory 100 a command set for the Set Feature relating to the trigger start timing, for example, of FIG. 24 explained in the third embodiment. When the trigger start timing setting is completed (when the ready/busy signal RBn is turned to the "H" level) at the memory 100, the CPU 230 transmits to the memory 100 a command set for the Set Feature relating to the BLC voltage, for example, of FIG. 30 explained in the fourth embodiment. When the BLC voltage setting is completed (when the ready/busy signal RBn is turned to the "H" level) at the memory 100, the CPU 230 transmits a command set for the read operation to the memory 100. The command set for the read operation is the same as that in the first embodiment as illustrated in FIG. 17.

6.3. Effects of Present Embodiment

With the configuration according to the present embodiment, the same effects as the third and fourth embodiments can be achieved. In addition, with the configuration according to the present embodiment, by controlling both the trigger start timing and BLC voltage (voltage of the bit line BL), suitable read conditions can be adopted for each layer L, thereby effectively suppressing erroneous reading.

7. Seventh Embodiment

The seventh embodiment will be described. According to the seventh embodiment, the memory cell array 18 has a distinctive structure. The following explanation will mainly focus on the points that differ from the first to sixth embodiments.

7.1 Structure 7.1.1 Circuitry Structure of Memory Cell Array

First, the circuitry structure of the memory cell array 18 will be explained with reference to FIG. 36, which provides a circuit diagram of a block BLK in a memory cell array 18.

Figure 36:
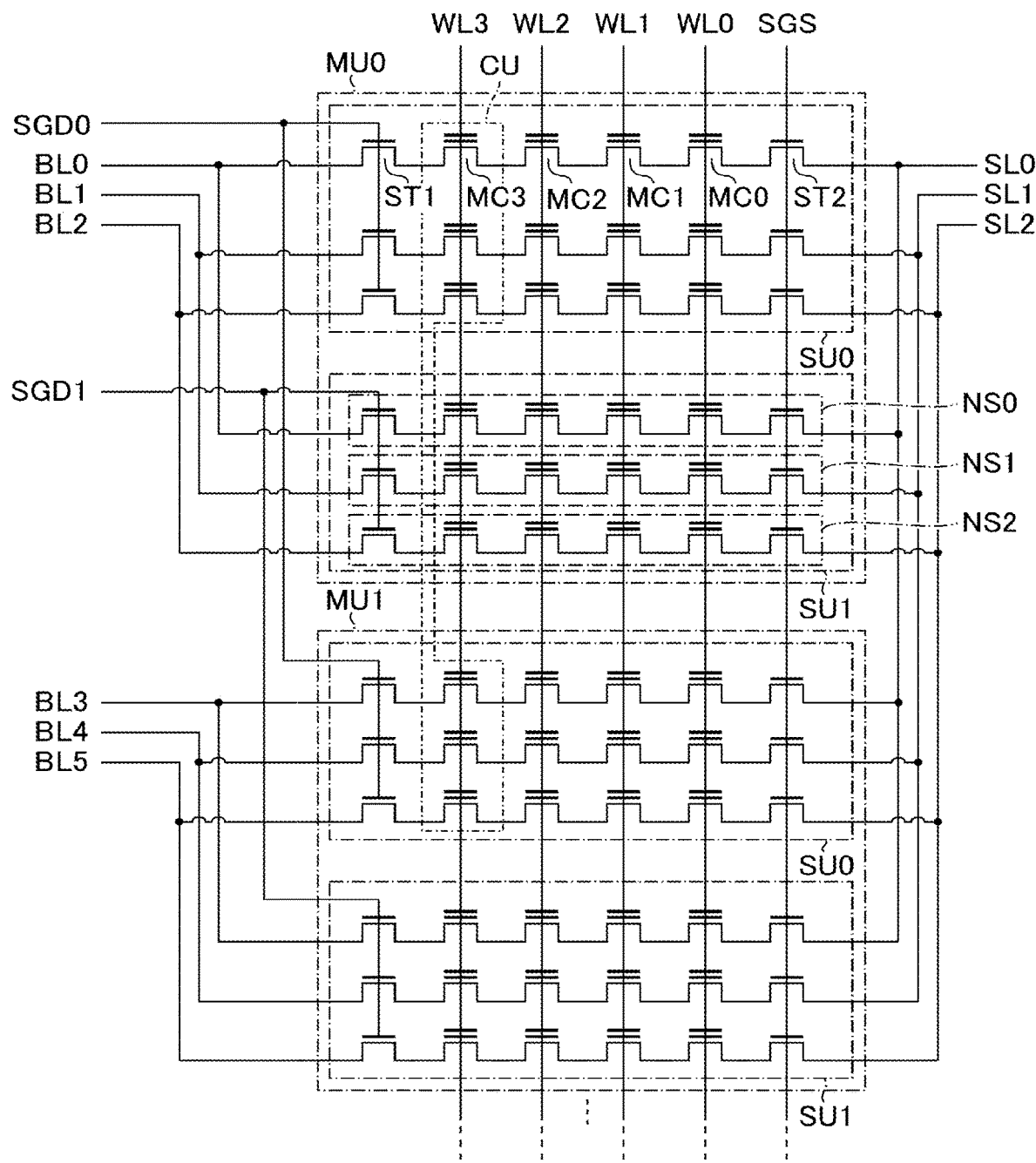
FIG. 36 is a circuit diagram of a memory cell array of the semiconductor memory device in the memory system according to a seventh embodiment.

As illustrated in FIG. 36, according to the present embodiment, the sources of the select transistors ST2 included in the NAND strings NS0 in the same block BLK are commonly coupled to the source line SL0. In the same manner, the sources of the select transistors ST2 included in the NAND strings NS1 are commonly coupled to the source line SL1. The sources of the select transistors ST2 included in the NAND strings NS2 are commonly coupled to the source line SL2. That is, according to the present embodiment, the NAND strings NS are coupled to the source lines SL that differ in accordance with the layers L. The rest of the structure is the same as in the first embodiment as illustrated in FIG. 3.

7.1.2 Overall Structure of Memory Cell Array

Next, the overall structure of the memory cell array 18 will be explained with reference to FIG. 37, which provides a perspective diagram of the memory unit MU0. In the example of FIG. 37, part of the insulating layers is omitted.

As illustrated in FIG. 37, the memory unit MU0 according to the present embodiment may include a layer stack 34, word lines WL0 to WL3, select gate lines SGD0 and SGD1, select gate line SGS, contact plugs BC0 to BC2, contact plugs SC0 to SC2, bit lines BL0 to BL2, and source lines SL0 to SL2.

The layer stack 34 includes a BL coupling portion which extends in the X direction, a plurality of cell portions which have one end coupled to the BL coupling portion and extend in the Y direction, and an SL coupling portion which is coupled to the other end of the cell portions and extends in the X direction.

The semiconductor layers 33 in the SL coupling portion serve as a current path that connects the source lines SL to the NAND string NS.

In the SL coupling portion, contact plugs SC0 to SC2 are provided to electrically couple the semiconductor layers 33-0 to 33-2 respectively to the source lines SL0 to SL2 that are formed above the layer stack 34 and extend in the Y direction. More specifically, the semiconductor layers 33-0 to 33-2 extending in the X direction in the SL coupling portion are formed, at one end, into a staircase pattern. The contact plugs SC0 to SC2 are respectively formed on the staircase pattern of the semiconductor layers 33-0 to 33-2.

7.1.3 Plane Structure of Memory Cell Array

Next, an exemplary plane structure of the memory cell array 18 will be explained with reference to FIG. 38, which is a top view of the memory unit MU0. In the example of FIG. 38, part of the insulating layers is omitted.

As illustrated in FIG. 38, in the SL coupling portion of the layer stack 34, contact plugs SC0 to SC2 are provided to be coupled to the source lines SL0 to SL2, respectively.

7.1.4 Cross-Sectional Structure of Memory Cell Array

Next, an exemplary cross-sectional structure of the memory cell array 18 will be explained with reference to FIG. 39, which is a cross-sectional view of the structure of FIG. 38, taken along line E1-E2.

As illustrated in FIG. 39, the semiconductor layers 33-0 to 33-2 in the SL coupling portion are formed into a staircase pattern, each having a portion (hereinafter referred to as "terrace") that does not overlap the upper semiconductor layer 33. The contact plug SC0 is provided on the terrace of the semiconductor layer 33-0, while not electrically coupled to the semiconductor layers 33-1 and 33-2. In the same manner, the contact plug SC1 is provided on the terrace of the semiconductor layer 33-1, while not electrically coupled to the semiconductor layers 33-0 and 33-2. The contact plug SC2 is provided on the terrace of the semiconductor layer 33-2, while not electrically coupled to the semiconductor layers 33-0 and 33-1. The contact plugs SC0 to SC2 are filled with the conductor 50. Interconnect layers 51, which function as source lines SL0 to SL2, are provided on the contact plugs SC0 to SC2, respectively.

The conductor 50 is formed of a conductive material, and may contain W. The interconnect layer 51 is formed of a conductive material, and may contain Cu.

In the example of FIG. 39, in the SL coupling portion, terraces are formed in the semiconductor layers 33-0 to 33-2, but this is not a limitation. The semiconductor layers 33-0 to 33-2 may not be provided with terraces. If this is the case, the contact plugs SC0 to SC2 may be coupled to the semiconductor layers 33-0 to 33-2, respectively, in the same manner as the contact plugs BC0 to BC2.

7.2 Relationship Between Layer and Voltage of Source Line

Next, the relationship between the layer L and the voltage of the source line SL will be explained with reference to FIG. 40, which provides a timing chart for the voltages of the bit line BL, source lines SL, and signal STB in a read operation of one state.

Figure 40:
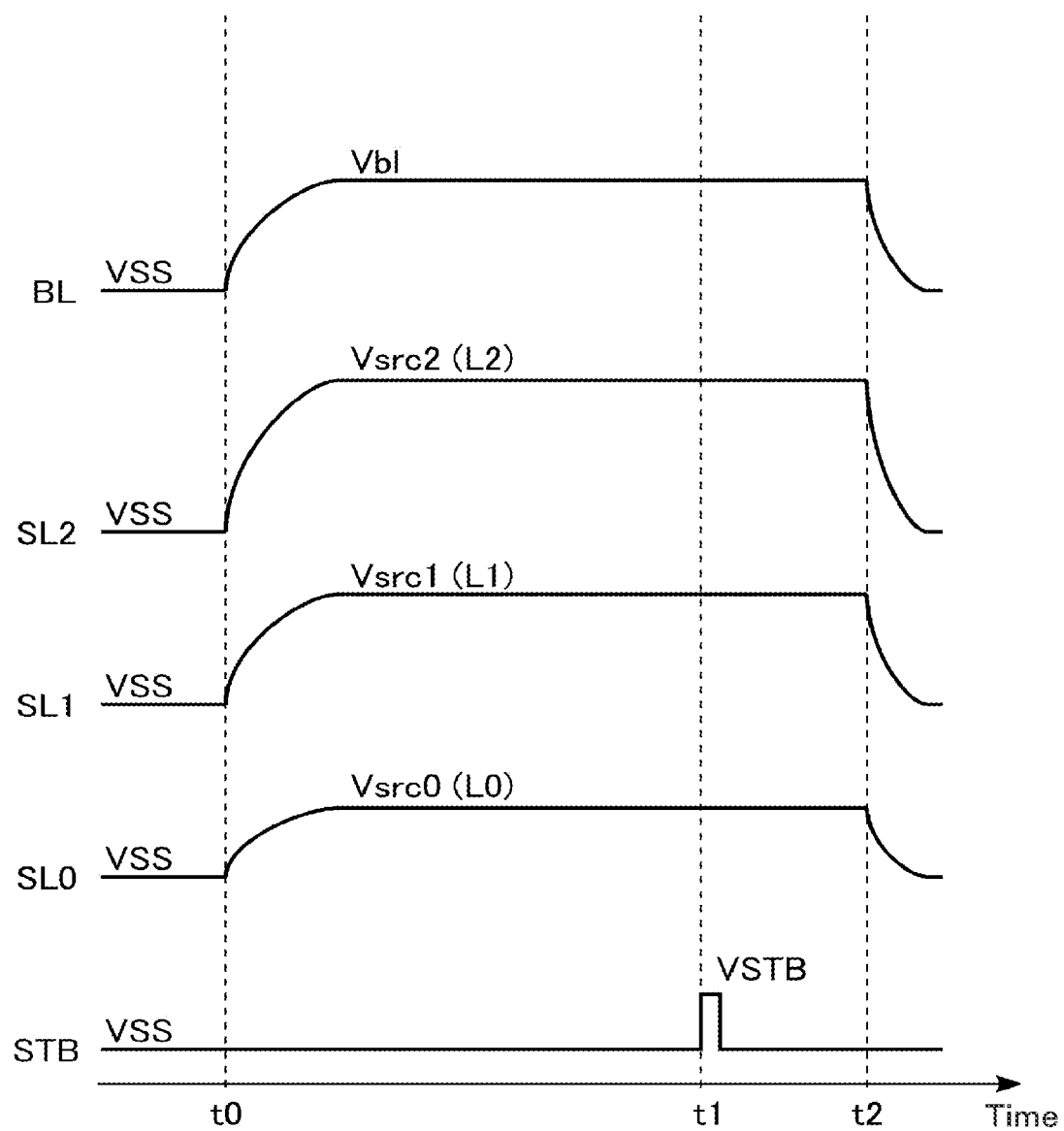
FIG. 40 is a timing chart of voltages of a bit line, source lines SL0 to SL2, and signal STB during a read operation in the semiconductor memory device of the memory system according to the seventh embodiment.

As illustrated in FIG. 40, according to the present embodiment, a voltage Vbl is applied to the bit lines BL regardless of the layers L during the period between time points t0 and t2, unlike the fourth embodiment. As a result, a voltage Vsrc0 is applied to the source line SL0 corresponding to the layer L0; a voltage Vsrc1 is applied to the source line SL1 corresponding to the layer L1; and a voltage Vsrc2 is applied to the source line SL2 corresponding to the layer L2. For example, when the memory cell transistor MC of the layer L2 has the lowest threshold voltage, the memory cell transistor MC of the layer L1 has the second lowest threshold voltage, and the memory cell transistor MC of the layer L0 has the highest threshold voltage, the voltages Vsrc0 to Vsrc2 satisfy the relationship of Vsrc0<Vsrc1<Vsrc2. As the voltage of a source line SL decreases, the voltage difference between the voltages of the source line SL and bit line BL increases, which increases the cell current. This increases the discharge rate of the node SEN, as a result of which the threshold voltage of the corresponding memory cell transistor MC appears to be lowered. According to the present embodiment, the shifted threshold voltage distribution is corrected by the voltage of the source line SL.

Under this condition, the sequencer 15 applies a voltage VSTB to the signal STB to set to the "H" level at time point t1, and thereby starts a strobe operation in a batch to the sense amplifier units SAU corresponding to the layers L0 to L2.

7.3 Overall Flow of Read Operation

Next, the overall flow of a read operation will be explained with reference to FIG. 41, which provides a flowchart of the read operation.

Figure 41:
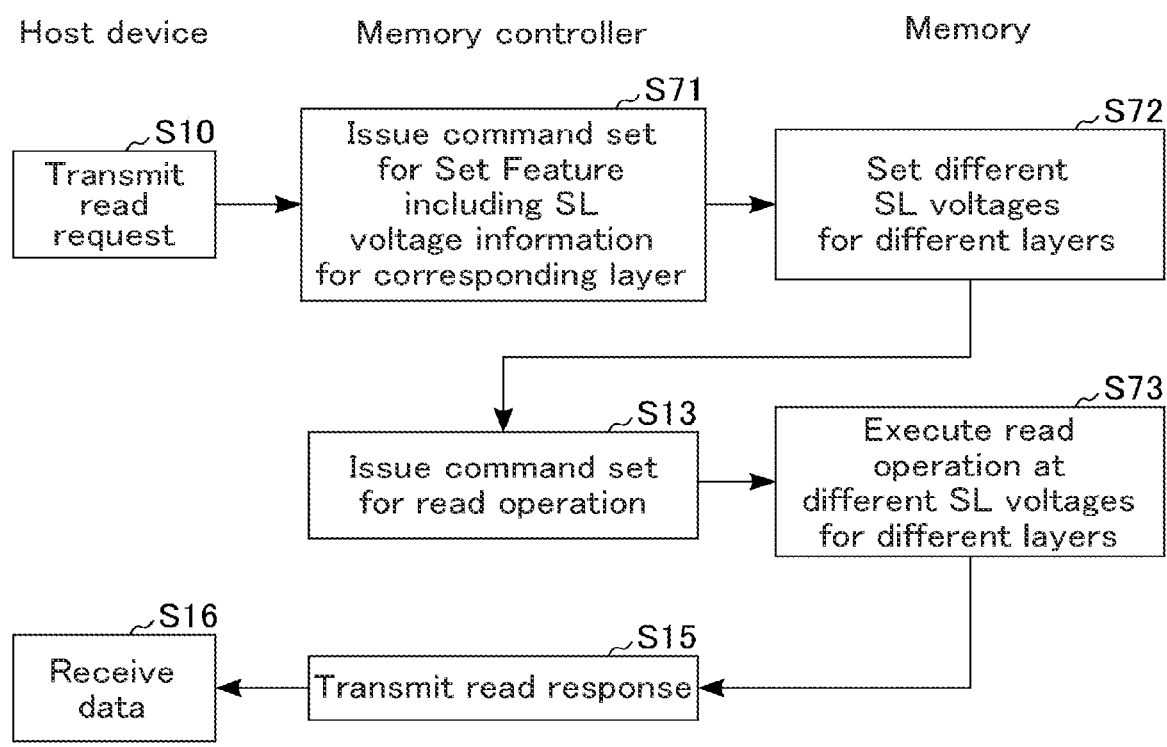
FIG. 41 is a flowchart of the read operation in the memory system according to the seventh embodiment.

As illustrated in FIG. 41, first, the host device 2 transmits a read request to the memory system 1 (step S10).

Upon receipt of a read request from the host device 2, the CPU 230 issues a command set for the Set Feature that includes the voltage information of the source line SL for the corresponding layer L (step S71), and transmits the command set to the memory 100. Hereinafter, the voltage of the source line SL may be referred to as an "SL voltage".

Upon receipt of the command set for the Set Feature, the sequencer 15 sets different SL voltages (Vsrc0 to Vsrc2) for different layers L (step S72).

When the setting of parameters is completed, the CPU 230 issues a command set for a read operation (step S13), and transmits it to the memory 100.

Upon receipt of the command set for the read operation, the sequencer 15 executes a read operation at different SL voltages for different layers L (step S73). When the read operation is completed, the sequencer 15 transmits the read-out data to the memory controller 200.

After executing the ECC processing upon the read-out data received from the memory 100, the CPU 230 transmits the error-corrected read-out data to the host device 2, as a read response to the read request (step S15).

The host device 2 receives the data (step S16), and the read operation is terminated.

7.4 Command Sequences for Set Feature and Read Operation

Figure 42:
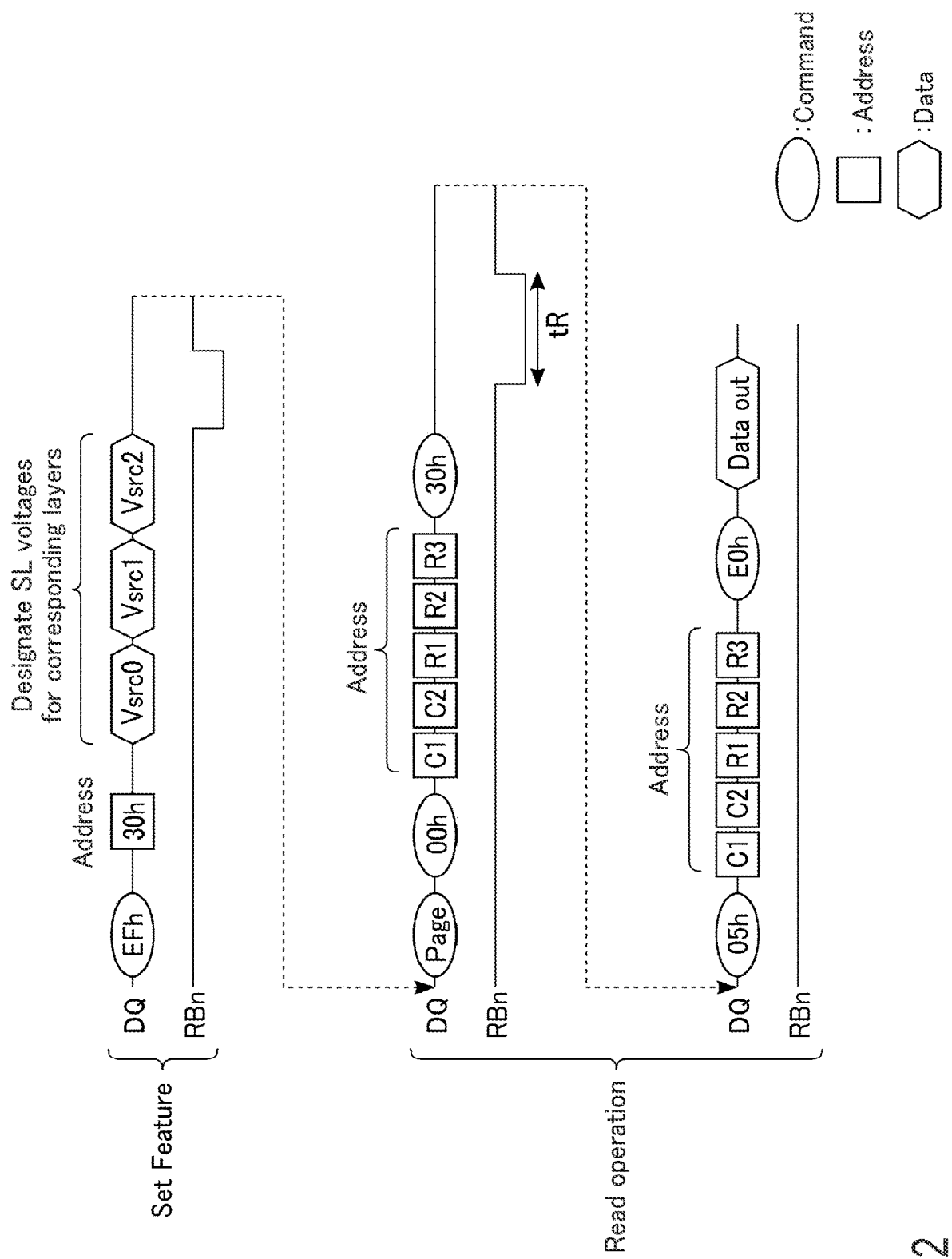
FIG. 42 shows a command sequence of a Set Feature operation and read operation in the memory system according to the seventh embodiment.

Exemplary command sequences for the Set Feature and read operation will be explained with reference to FIG. 42, which shows a command sequence for the Set Feature and for the read operation. In the example of FIG. 42, signals CEn, CLE, ALE, WEn, and signal REn are omitted for the sake of simplicity. The signals DQ and ready/busy signals RBn are illustrated. In a signal DQ, a command is placed in an oval frame, an address is placed in a square frame, and data is placed in a hexagonal frame.

As illustrated in FIG. 42, the CPU 230 transmits to the memory 100 a command set for the Set Feature in order to set parameters for the SL voltage in the memory 100.

More specifically, the CPU 230 first issues a command "EFh" and transmits it to the memory 100.

Then, the CPU 230 issues an address "30h" to designate the SL voltage setting, and transmits the address to the memory 100.

Thereafter, the CPU 230 transmits to the memory 100 the data (Vsrc0 to Vsrc2) that designates the SL voltage for each layer L.

Upon receipt of the command set for the Set Feature, the sequencer 15 sets the ready/busy signal RBn to the "L" level to set the parameters. After setting the parameters, the sequencer 15 sets the ready/busy signal RBn to the "H" level. The command set for the read operation is the same as that in the first embodiment as illustrated in FIG. 17.

7.5 Address Table for Set Feature

The address and data attached to a command set for the Set Feature will be explained with reference to FIG. 43, which provides an address table for a Set Feature.

As illustrated in FIG. 43, after issuing the address "30h" that designates the SL voltage setting, the CPU 230 sequentially designates data "Vsrc0", "Vsrc1" and "Vsrc2" corresponding to the layers L0 to L2, respectively.

The number of effective data items may be freely determined in accordance with the number of layers.

Furthermore, the data according to the present embodiment has been illustrated here as an SL voltage attached to a command set. This is not a limitation, however. The difference between a default SL voltage and the SL voltage for each layer L may be attached to a command set. If the memory 100 holds a parameter table of the SL voltages, the data may be address data for designating the corresponding layer L.

7.6 Voltages of Interconnects in Read Operation

The voltages of the interconnects in an exemplary read operation will be described with reference to FIG. 44, which provides a timing chart indicating the voltages of the interconnects in a read operation of a lower page.

As illustrated in FIG. 44, at time point t0, the row decoder module 20 applies a read voltage VA to the selected word line WL, and a voltage Vread to the non-selected word lines WL. The row decoder module 20 further applies a voltage Vsg to the select gate line SGD corresponding to a selected string unit SU, and a negative voltage VBB to the select gate lines SGD corresponding to the non-selected string units SU. The row decoder module 20 also applies a voltage Vsg to the select gate line SGS. The voltages Vsrc0 to Vsrc2 are applied to the source lines SL corresponding to the layers L0 to L2, respectively.

During a period between time points t1 and t8, the sequencer 15 executes a read operation AR. More specifically, at time point t1, the node INV_S is set to the "L" level in the sense circuit SA of the sense amplifier unit SAU, and the transistor Tr0 is turned ON. The sequencer 15 sets the signal BLX to a voltage VBLX, and the signal BLC to a voltage VBLC. As a result, the transistors Tr1 and Tr4 are turned ON. The sense amplifier unit SAU therefore applies the voltage Vbl to the corresponding bit lines BL.

The operations at time point t2 and after are the same as in the fourth embodiment as illustrated in FIG. 32.

7.7. Effects of Present Embodiment

With the configuration according to the present embodiment, the same effects as the fourth embodiment can be achieved.

8. Eighth Embodiment

The eighth embodiment will be described. In the eighth embodiment, the explanation will focus on a combination of the fourth and seventh embodiments. In other words, the voltages that vary in accordance with the layers L are applied to the bit lines BL and the source lines SL. The following explanation will mainly focus on the points that differ from the first to seventh embodiments.

8.1 Relationship Between Layer and Voltages of Bit Line and Source Line

The relationship between the layer L and the voltages of the bit line BL and source line SL will be explained with reference to FIG. 45, which provides a timing chart of the voltages of the bit lines BL, source lines SL, and signal STB in a read operation of one state.

Figure 45:
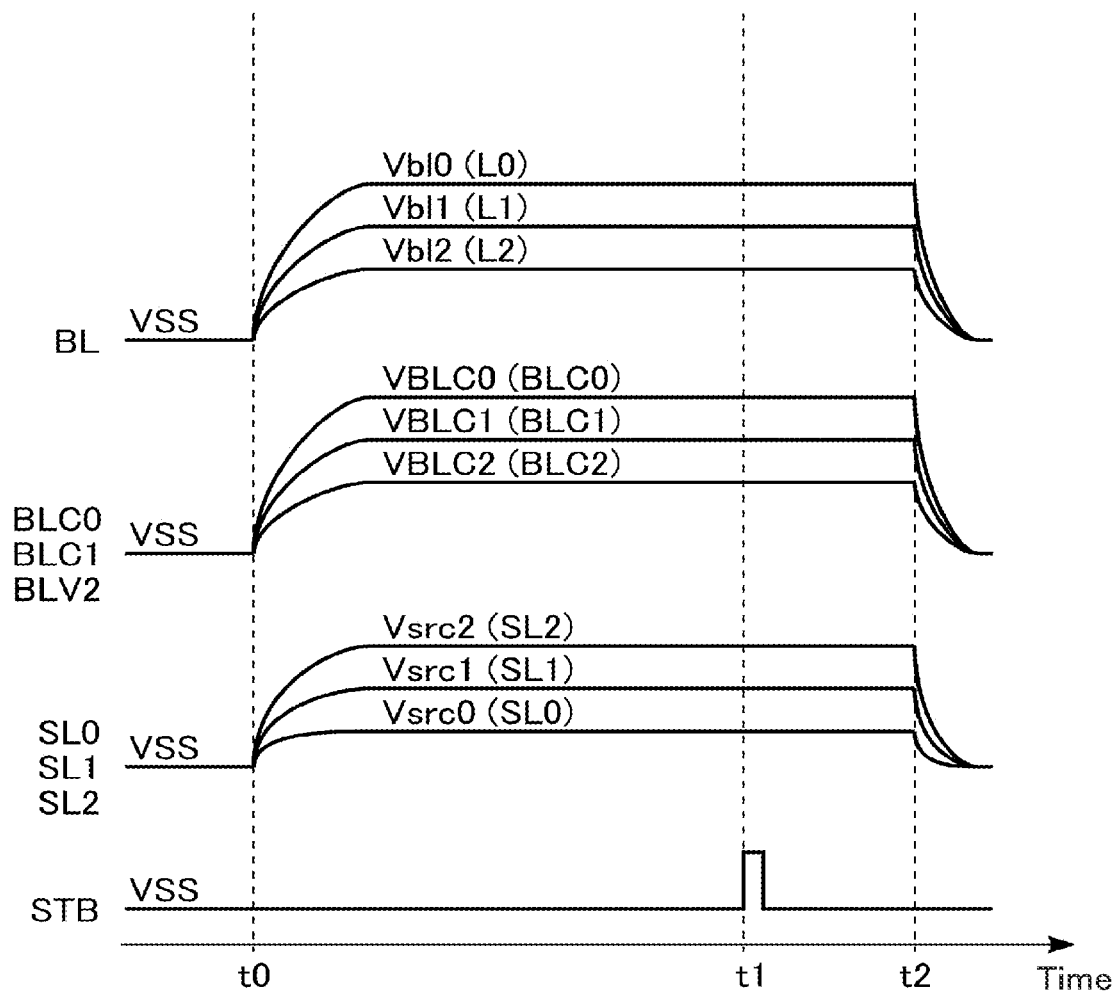
FIG. 45 is a timing chart of voltages of a bit line, source lines SL0 to SL2, signals BLC0 to BLC2, and signal STB during a read operation in the semiconductor memory device of the memory system according to an eighth embodiment.

As illustrated in FIG. 45, according to the present embodiment, a voltage Vbl0 is applied to the bit line BL corresponding to the layer L0, and a voltage Vsrc0 is applied to the source line SL0 during the period between time points t0 and t2. A voltage Vbl1 is applied to the bit line BL corresponding to the layer L1, and a voltage Vsrc is applied to the source line SL1. A voltage Vbl2 is applied to the bit line BL corresponding to the layer L2, and a voltage Vsrc2 is applied to the source line SL2. For example, when the memory cell transistor MC of the layer L2 has the lowest threshold voltage, the memory cell transistor MC of the layer L1 has the second lowest threshold voltage, and the memory cell transistor MC of the layer L0 has the highest threshold voltage, the voltage differences between the bit lines BL and source lines SL for respective layers L satisfy the relationship of (Vbl0−Vsrc0)>(Vbl1−Vsrc1)>(Vbl2−Vsrc2). As the voltage difference between the voltage of the bit line BL and the voltage of the source line SL increases, the cell current increases. With the discharge rate of the node SEN increased, the threshold voltage of the corresponding memory cell transistor MC appears to be lowered.

Under this condition, the sequencer 15 applies a voltage VSTB to the signal STB so that the signal STB may be set to the "H" level at time point t1 and a strobe operation thus executed in a batch to the sense amplifier units SAU corresponding to the layers L0 to L2.

8.2 Overall Flow of Read Operation

Next, the overall flow of a read operation will be explained with reference to FIG. 46, which provides a flowchart of the read operation.

Figure 46:
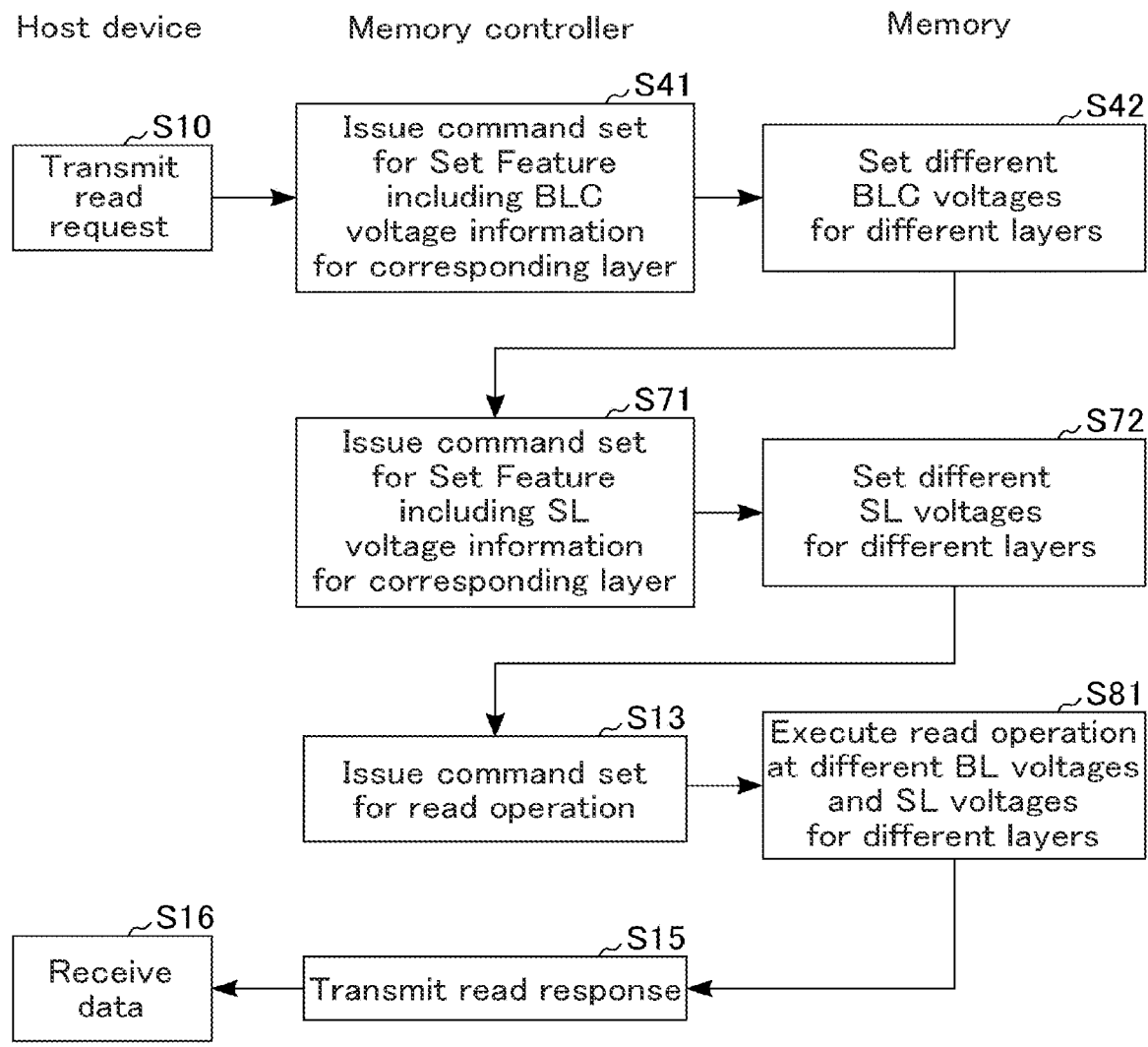
FIG. 46 is a flowchart of the read operation in the memory system according to the eighth embodiment.

As illustrated in FIG. 46, first, the host device 2 transmits a read request to the memory system 1 (step S10).

Upon receipt of a read request from the host device 2, the CPU 230 issues a command set for the Set Feature that includes the BLC voltage information for the corresponding layer L (step S41), and transmits the command set to the memory 100.

Upon receipt of the command set for the Set Feature, the sequencer 15 sets different BLC voltages (VBLC0 to VBLC2) for different layers L (step S42).

When the setting of parameters is completed, the CPU 230 issues a command set for the Set Feature that includes the SL voltage information for the corresponding layer L (step S71), and transmits the command set to the memory 100.

Upon receipt of the command set for the Set Feature, the sequencer 15 sets different SL voltages (Vsrc0 to Vsrc2) for different layers L (step S72).

When the setting of parameters is completed, the CPU 230 issues a command set for a read operation (step S13), and transmits the command set to the memory 100.

Upon receipt of the command set for the read operation, the sequencer 15 executes a read operation at different BL voltages and different SL voltages for different layers L (step S81). When the read operation is completed, the sequencer 15 transmits the read-out data to the memory controller 200.

After executing the ECC processing upon the read-out data received from the memory 100, the CPU 230 transmits the error-corrected read-out data to the host device 2, as a read response to the read request (step S15).

The host device 2 receives the data (step S16), and the read operation is terminated.

8.3 Command Sequences for Set Feature and Read Operation

Figure 47:
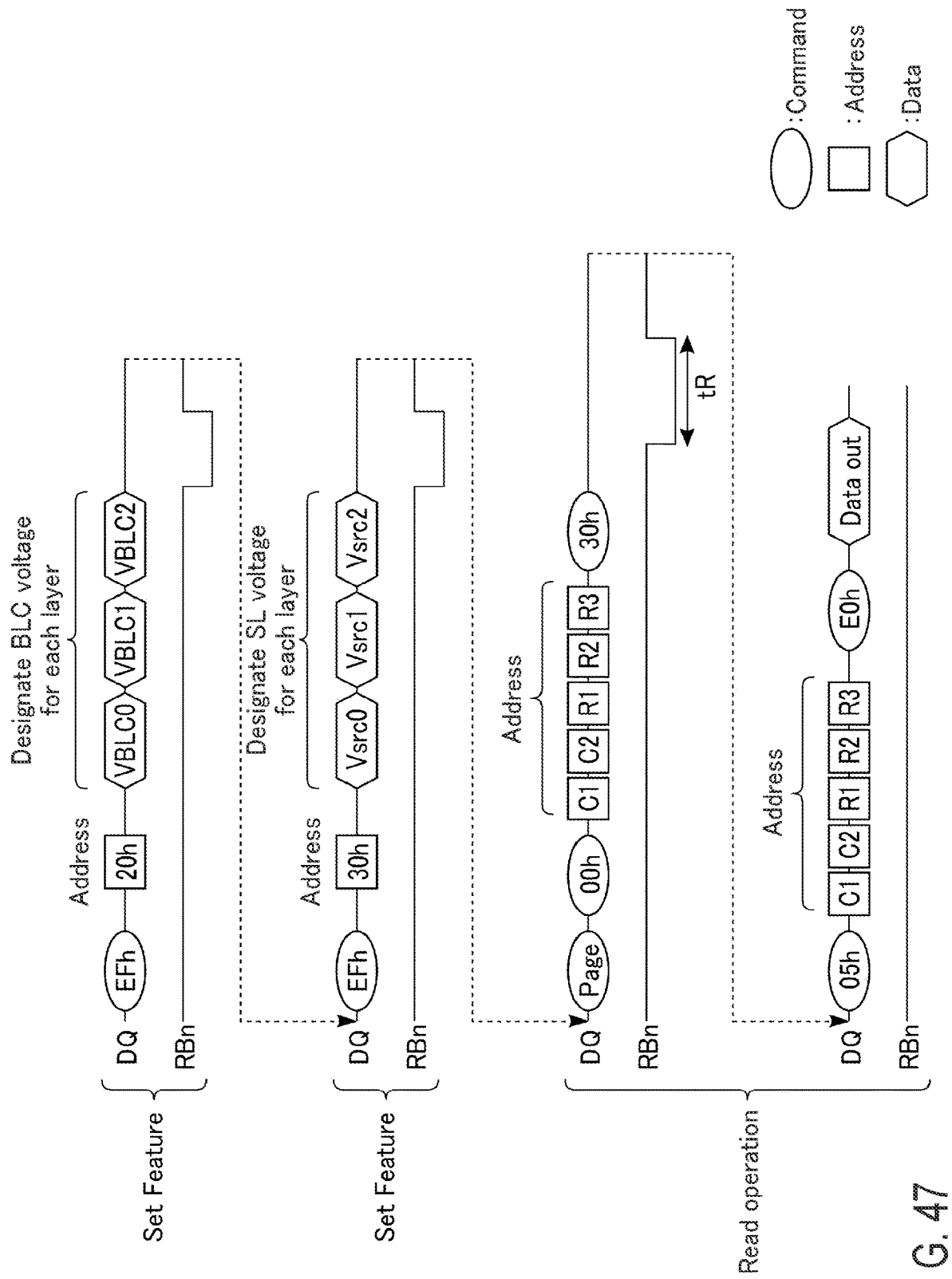
FIG. 47 shows a command sequence of a Set Feature operation and read operation in the memory system according to the eighth embodiment.

Exemplary command sequences for the Set Feature and read operation will be explained with reference to FIG. 47, which shows a command sequence for the Set Feature and for the read operation. In the example of FIG. 47, signals CEn, CLE, ALE, WEn, and signal REn are omitted for the sake of simplicity. The signals DQ and ready/busy signals RBn are illustrated. In a signal DQ, a command is placed in an oval frame, an address is placed in a square frame, and data is placed in a hexagonal frame.

As illustrated in FIG. 47, the CPU 230 transmits to the memory 100 a command set for the Set Feature relating to the BLC voltages, for example, of FIG. 30 explained in the fourth embodiment. When the BLC voltage settings are completed (when the ready/busy signal RBn is turned to the "H" level) at the memory 100, the CPU 230 transmits to the memory 100 a command set for the Set Feature relating to the SL voltage, for example, of FIG. 42 explained in the seventh embodiment. When the SL voltage settings are completed (when the ready/busy signal RBn is turned to the "H" level) at the memory 100, the CPU 230 transmits to the memory 100 a command set for the read operation. The command set for the read operation is the same as that in the first embodiment as illustrated in FIG. 17.

8.4 Voltages of Interconnects in Read Operation

Voltages of the interconnects in an exemplary read operation will be described with reference to FIG. 48, which provides a timing chart indicating the voltages of the interconnects in a read operation of a lower page.

Figure 48:
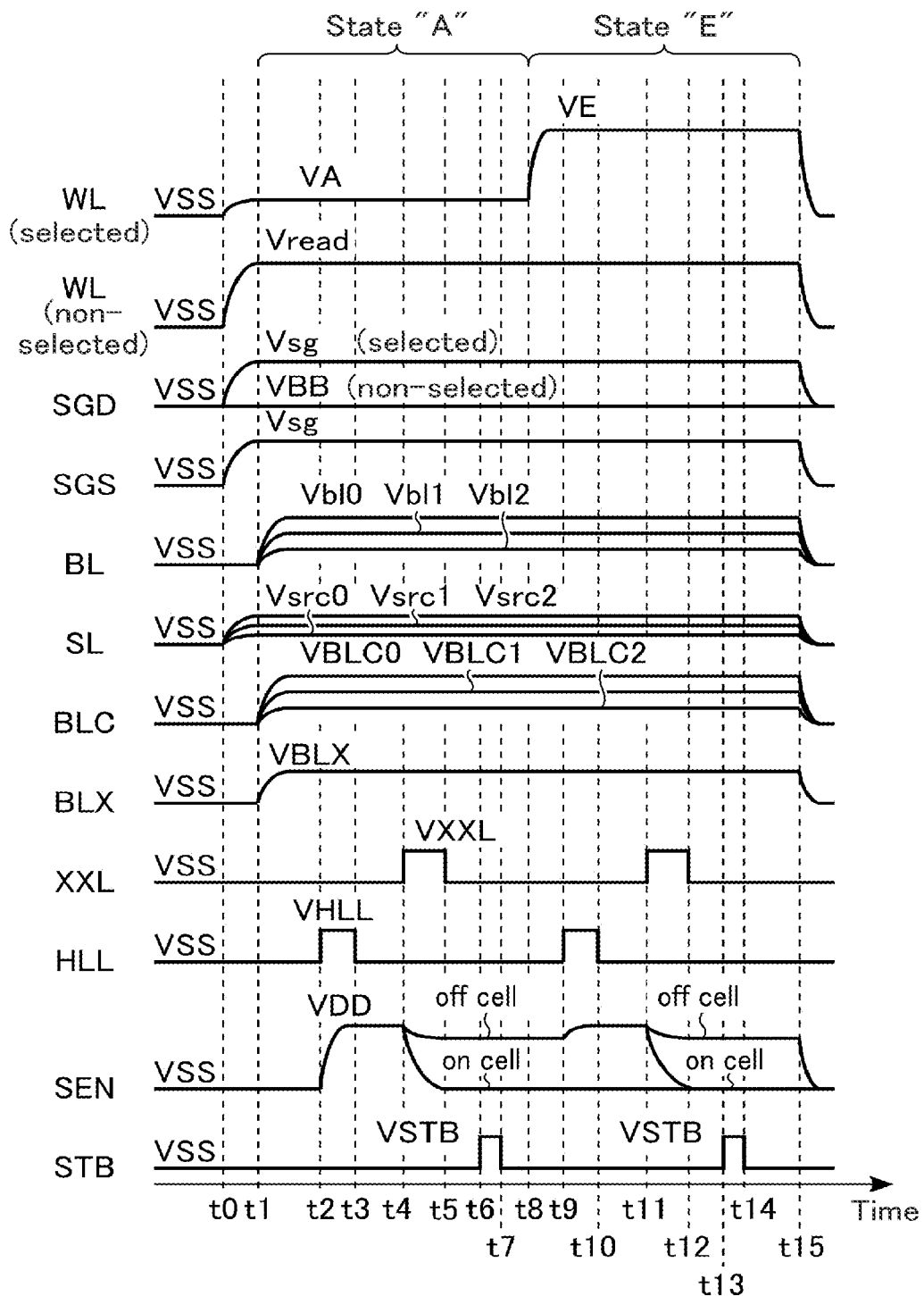
FIG. 48 is a timing chart for voltages of individual interconnects during a read operation in the semiconductor memory device of the memory system according to the eighth embodiment.

As illustrated in FIG. 48, at time point t0, the row decoder module 20 applies a read voltage VA to the selected word line WL, and a voltage Vread to the non-selected word lines WL. The row decoder module 20 further applies a voltage Vsg to the select gate line SGD corresponding to a selected string unit SU, and a negative voltage VBB to the select gate lines SGD corresponding to the non-selected string units SU. The row decoder module 20 also applies a voltage Vsg to the select gate line SGS. The voltages Vsrc0 to Vsrc2 are applied to the source lines SL corresponding to the layers L0 to L2, respectively.

During a period between time points t1 and t8, the sequencer 15 executes a read operation AR. More specifically, at time point t1, the sense circuit SA of the sense amplifier unit SAU sets the node INV_S to the "L" level, and turns the transistor Tr0 ON. The sequencer 15 sets the signal BLX to the voltage VBLX. The sequencer 15 further sets the signals BLC0 to BLC2 to the voltages VBLC0 to VBLC2, respectively. As a result, the transistors Tr1 and Tr4 are turned ON, and voltages Vbl0 to Vbl2 are thereby applied to the bit lines BL corresponding to the layers L0 to L2, respectively.

The operations at time point t2 and after are the same as in the fourth embodiment as illustrated in FIG. 32.

8.5. Effects of Present Embodiment

With the configuration according to the present embodiment, the same effects as the fourth and seventh embodiments can be achieved. In addition, with the configuration according to the present embodiment, by controlling both the voltages of the bit lines BL and the voltages of the source lines SL, suitable read conditions can be adopted for respective layers L, thereby effectively suppressing erroneous reading.

9. Modifications, Etc

According to the above embodiment, a memory system includes: a semiconductor memory device (100); and a memory controller (200) configured to control a read operation in the semiconductor memory device. The semiconductor memory device includes: first and second memory cells (MC0 of layer L0 and MC1 of layer L1) stacked above a substrate; a first word line (WL0) coupled to the first and second memory cells; a first bit line (BL0) coupled to the first memory cell; and a second bit line (BL1) coupled to the second memory cell. A first state ("A") read operation includes a first read operation for reading data from the first memory cell and a second read operation for reading data from the second memory cell. In the first state read operation, a first read voltage (VA0) is applied to the first word line during a first period for executing the first read operation, and a second read voltage (VA1) differing from the first read voltage is applied to the first word line during a second period for executing the second read operation.

By adopting the above embodiment, a memory system with enhanced reliability can be offered.

The present embodiments are not limited to the above explained aspects, but various modifications can be made.

For example, in the third and sixth to eighth embodiments, the memory 100 may include a parameter table.

In the first to sixth embodiments, the configuration of the memory cell array of the seventh embodiment may be adopted.

The above embodiments may be combined if at all possible.

The "coupling" in the above embodiments includes a state of being indirectly coupled, for example with a transistor, resistor or any other component interposed in between.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory system comprising:
a semiconductor memory device; and
a memory controller configured to control a read operation in the semiconductor memory device,
wherein the semiconductor memory device includes:
first and second memory cells stacked above a substrate;
a first word line coupled to the first and second memory cells;
a first bit line coupled to the first memory cell; and
a second bit line coupled to the second memory cell,
a first state read operation includes a first read operation for reading data from the first memory cell and a second read operation for reading data from the second memory cell, and
in the first state read operation,
a first read voltage is applied to the first word line during a first period for executing the first read operation, and
a second read voltage differing from the first read voltage is applied to the first word line during a second period for executing the second read operation.

2. The memory system according to claim 1, wherein
each of the first and second memory cells is capable of holding data of a plurality of bits,
when reading 1-bit data from each of the first and second memory cells, at least the first state read operation and a second state read operation are executed,
the second state read operation includes a third read operation for reading data from the first memory cell and a fourth read operation for reading data from the second memory cell, and in the second state read operation,
  a third read voltage is applied to the first word line during a third period for executing the third read operation,
  a fourth read voltage differing from the third read voltage is applied to the first word line during a fourth period for executing the fourth read operation, and
  a first voltage difference between a fifth read voltage that is predetermined for the first state read operation and the first read voltage, a second voltage difference between the fifth read voltage and the second read voltage, a third voltage difference between a sixth read voltage that is predetermined for the second state read operation and the third read voltage, and a fourth voltage difference between the sixth read voltage and the fourth read voltage are smaller than a fifth voltage difference between the fifth read voltage and the sixth read voltage.

3. The memory system according to claim 2, wherein the memory controller is configured to transmit a first command set that designates the first to fourth voltage differences to the semiconductor memory device.

4. The memory system according to claim 1, wherein the semiconductor memory device further includes:
  third and fourth memory cells stacked above the substrate; and
  a second word line coupled to the third and fourth memory cells,
the third memory cell is coupled to the first memory cell, and
the fourth memory cell is coupled to the second memory cell.

5. The memory system according to claim 4, wherein a first voltage higher than the first and second read voltages is applied to the second word line during the first and second periods.

6. The memory system according to claim 1, wherein the semiconductor memory device further includes:
  fifth and sixth memory cells stacked above the substrate; and
  a source line coupled to the first, second, fifth and sixth memory cells,
the first word line is coupled to the fifth and sixth memory cells,
the first bit line is coupled to the fifth memory cell, and
the second bit line is coupled to the sixth memory cell.

7. The memory system according to claim 6, wherein the first memory cell and the fifth memory cell are arranged on a same layer, and
the second memory cell and the sixth memory cell are arranged on a same layer.

8. The memory system according to claim 6, wherein the semiconductor memory device further includes:
  a first transistor coupled to the first bit line and the first memory cell;
  a second transistor coupled to the second bit line and the second memory cell;
  a third transistor coupled to the first bit line and the fifth memory cell;
  a fourth transistor coupled to the second bit line and the sixth memory cell;
  a first select gate line coupled to the first and second transistors; and
  a second select gate line coupled to the fifth and sixth transistors.

9. The memory system according to claim 8, wherein a second voltage is applied to the first select gate line during the first and second periods, and
a third voltage lower than the second voltage is applied to the second select gate line during the first and second periods.

10. The memory system according to claim 1, wherein the semiconductor memory device further includes:
  seventh and eighth memory cells stacked above the substrate;
  a third bit line coupled to the seventh memory cell; and
  a fourth bit line coupled to the eighth memory cell,
the first word line is coupled to the seventh and eighth memory cells,
the first memory cell and the seventh memory cell are arranged on a same layer, and
the second memory cell and the eighth memory cell are arranged on a same layer.

11. The memory system according to claim 1, wherein the first memory cell includes;
  a semiconductor layer coupled to the first bit line, and
  a charge storage layer provided between the first word line and the semiconductor layer.

12. A memory system comprising:
a semiconductor memory device; and
a memory controller configured to control a read operation in the semiconductor memory device,
wherein the semiconductor memory device includes:
  first and second memory cells stacked above a substrate;
  a first word line coupled to the first and second memory cells;
  a first bit line coupled to the first memory cell; and
  a second bit line coupled to the second memory cell, and
in the read operation of the first and second memory cells corresponding to a first state, a first sense timing at which data is read from the first memory cell via the first bit line differs from a second sense timing at which data is read from the second memory cell via the second bit line.

13. The memory system according to claim 12, wherein the memory controller is configured to transmit a first command set that designates the first and second sense timings to the semiconductor memory device.

14. A memory system comprising:
a semiconductor memory device; and
a memory controller configured to control a read operation in the semiconductor memory device,
wherein the semiconductor memory device includes:
  first and second memory cells stacked above a substrate;
  a first word line coupled to the first and second memory cells;
  a first bit line coupled to the first memory cell; and
  a second bit line coupled to the second memory cell, and
in the read operation of the first and second memory cells corresponding to a first state, a first voltage is applied to the first bit line, and a second voltage differing from the first voltage is applied to the second bit line.

15. The memory system according to claim 14, wherein the memory controller is configured to transmit a first command set that designates the first and second voltages to the semiconductor memory device.

16. The memory system according to claim 14, wherein
in the read operation of the first and second memory cells corresponding to the first state, a first sense timing at which data is read from the first memory cell via the first bit line differs from a second sense timing at which data is read from the second memory cell via the second bit line.

17. The memory system according to claim 16, wherein
in the read operation of the first and second memory cells corresponding to the first state, a third voltage is applied to the first bit line, and a fourth voltage differing from the third voltage is applied to the second bit line.

18. A memory system comprising:
a semiconductor memory device; and
a memory controller configured to control a read operation in the semiconductor memory device,
wherein the semiconductor memory device includes:
first and second memory cells stacked above a substrate;
a first word line coupled to the first and second memory cells;
a first bit line coupled to the first memory cell;
a second bit line coupled to the second memory cell;
a first source line coupled to the first memory cell; and
a second source line coupled to the second memory cell, and in the read operation of the first and second memory cells corresponding to a first state, a first voltage is applied to the first source line, and a second voltage differing from the first voltage is applied to the second source line.

19. The memory system according to claim 17, wherein
the memory controller is configured to transmit a first command set that designates the first and second voltages to the semiconductor memory device.

* * * * *